(12) United States Patent
Rudmann et al.

(10) Patent No.: US 9,859,327 B2
(45) Date of Patent: Jan. 2, 2018

(54) OPTOELECTRONIC MODULES THAT HAVE SHIELDING TO REDUCE LIGHT LEAKAGE OR STRAY LIGHT, AND FABRICATION METHODS FOR SUCH MODULES

(71) Applicant: Heptagon Micro Optics Pte. Ltd., Singapore (SG)

(72) Inventors: Hartmut Rudmann, Jona (CH); Simon Gubser, Weesen (CH); Susanne Westenhöfer, Wettswil (CH); Stephan Heimgartner, Passugg (CH); Jens Geiger, Thalwil (CH); Sonja Hanselmann, Lachen (CH); Christoph Friese, Wannweil (DE); Xu Yi, Singapore (SG); Thng Chong Kim, Singapore (SG); John A. Vidallon, Singapore (SG); Ji Wang, Singapore (SG); Qi Chuan Yu, Singapore (SG); Kam Wah Leong, Singapore (SG)

(73) Assignee: Heptagon Micro Optics Pte. Ltd., Singapore (SG)

( * ) Notice: Subject to any disclaimer, the term of this patent is extended or adjusted under 35 U.S.C. 154(b) by 0 days.

(21) Appl. No.: 15/367,257

(22) Filed: Dec. 2, 2016

(65) Prior Publication Data
US 2017/0084663 A1  Mar. 23, 2017

Related U.S. Application Data

(63) Continuation of application No. 14/339,657, filed on Jul. 24, 2014, now Pat. No. 9,543,354.
(Continued)

(51) Int. Cl.
*H01L 21/00* (2006.01)
*H01L 27/146* (2006.01)
(Continued)

(52) U.S. Cl.
CPC .. *H01L 27/14685* (2013.01); *H01L 27/14618* (2013.01); *H01L 27/14625* (2013.01);
(Continued)

(58) Field of Classification Search
CPC ......... H01L 27/14625; H01L 27/14687; H01L 27/14618; H01L 27/14685; H01L 33/58;
(Continued)

(56) References Cited

U.S. PATENT DOCUMENTS 9,094,593 B2  7/2015  Rudmann et al.
2007/0109439 A1  5/2007  Minamio et al.
(Continued)

FOREIGN PATENT DOCUMENTS

EP  2 375 446 A2  10/2011
SG  11201502994  5/2015
(Continued)

OTHER PUBLICATIONS

Astrom, B.T., "Manufacturing of Polymer Composites", *Manufacturing Techniques* (1997), pp. 219-263.
Intellectual Property Office of Singapore, Search Report and Written Opinion, issued in Singapore Application No. 11201600343T, dated Oct. 5, 2016, 12 pages.

*Primary Examiner* — A. Sefer
(74) *Attorney, Agent, or Firm* — Fish & Richardson P.C.

(57) ABSTRACT

Various optoelectronic modules are described that include an optoelectronic device (e.g., a light emitting or light detecting element) and a transparent cover. Non-transparent material is provided on the sidewalls of the transparent cover, which, in some implementations, can help reduce light leakage from the sides of the transparent cover or can help prevent stray light from entering the module. Fabrication techniques for making the modules also are described.

26 Claims, 43 Drawing Sheets

Related U.S. Application Data

(60) Provisional application No. 61/915,193, filed on Dec. 12, 2013, provisional application No. 61/859,828, filed on Jul. 30, 2013.

(51) Int. Cl.
*H01L 31/0203* (2014.01)
*H01L 31/0232* (2014.01)
*H01L 33/58* (2010.01)

(52) U.S. Cl.
CPC .... *H01L 27/14687* (2013.01); *H01L 31/0203* (2013.01); *H01L 31/02325* (2013.01); *H01L 33/58* (2013.01); *H01L 2224/48091* (2013.01); *H01L 2924/12044* (2013.01); *H01L 2933/0058* (2013.01)

(58) Field of Classification Search
CPC .......... H01L 31/0203; H01L 31/02325; H01L 2924/12044; H01L 2933/0058; H01L 2224/48091; H01L 2924/00014
See application file for complete search history.

(56) References Cited

U.S. PATENT DOCUMENTS

| | | |
|---|---|---|
| 2009/0134483 A1 | 5/2009 | Weng et al. |
| 2011/0013292 A1 | 1/2011 | Rossi et al. |
| 2011/0050979 A1 | 3/2011 | Rudmann |
| 2013/0019461 A1 | 1/2013 | Rudmann et al. |
| 2013/0037831 A1 | 2/2013 | Rudmann et al. |
| 2013/0044380 A1* | 2/2013 | Shen ............... G02B 7/025 359/811 |
| 2014/0125849 A1* | 5/2014 | Heimgartner ..... H01L 27/14625 348/276 |
| 2014/0167196 A1 | 6/2014 | Heimgartner et al. |
| 2014/0183585 A1 | 7/2014 | Gubser et al. |
| 2015/0036046 A1 | 2/2015 | Rudmann et al. |

FOREIGN PATENT DOCUMENTS

| | | |
|---|---|---|
| WO | 2009/023465 | 2/2009 |
| WO | WO 2009/076788 | 6/2009 |

* cited by examiner

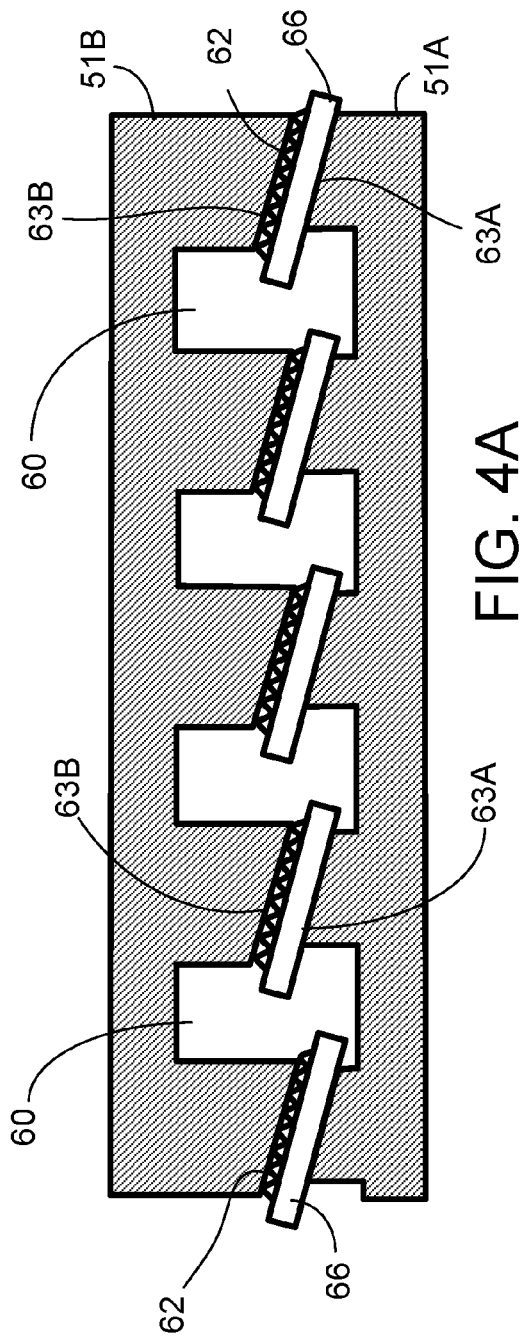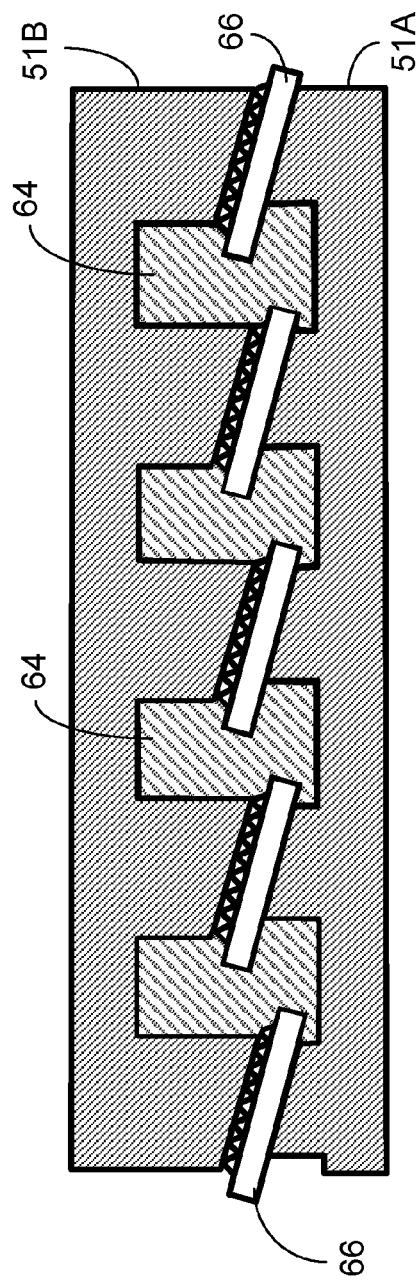

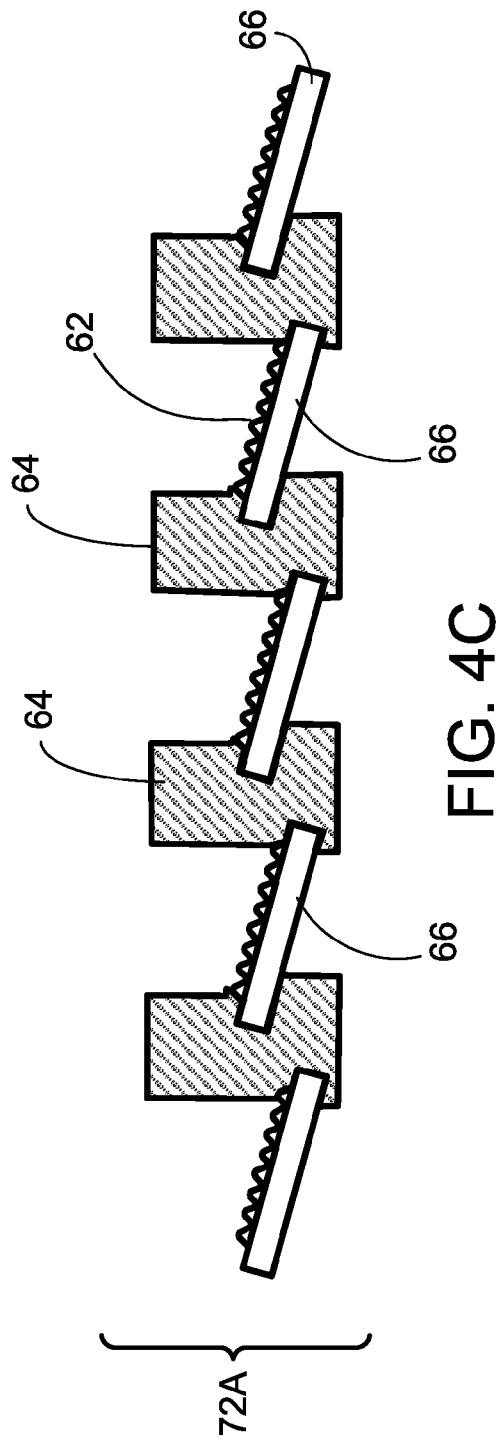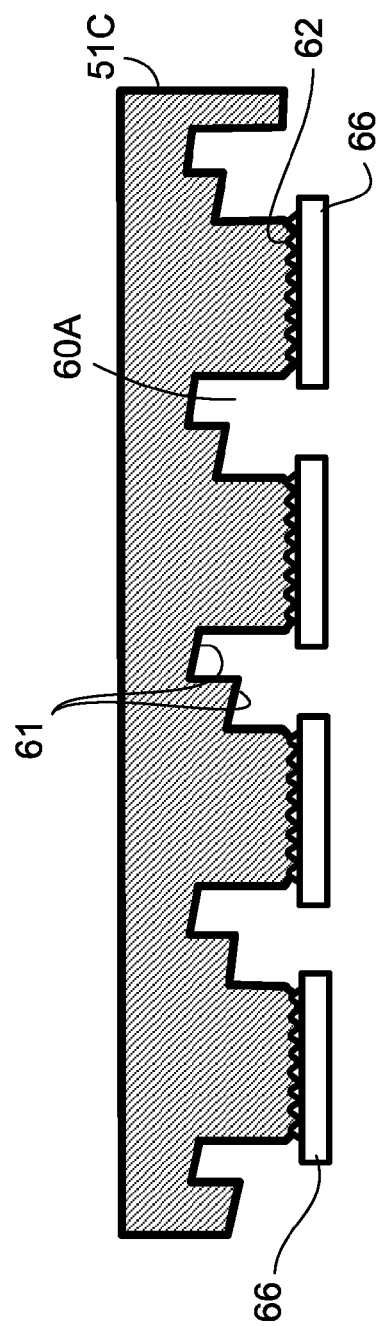

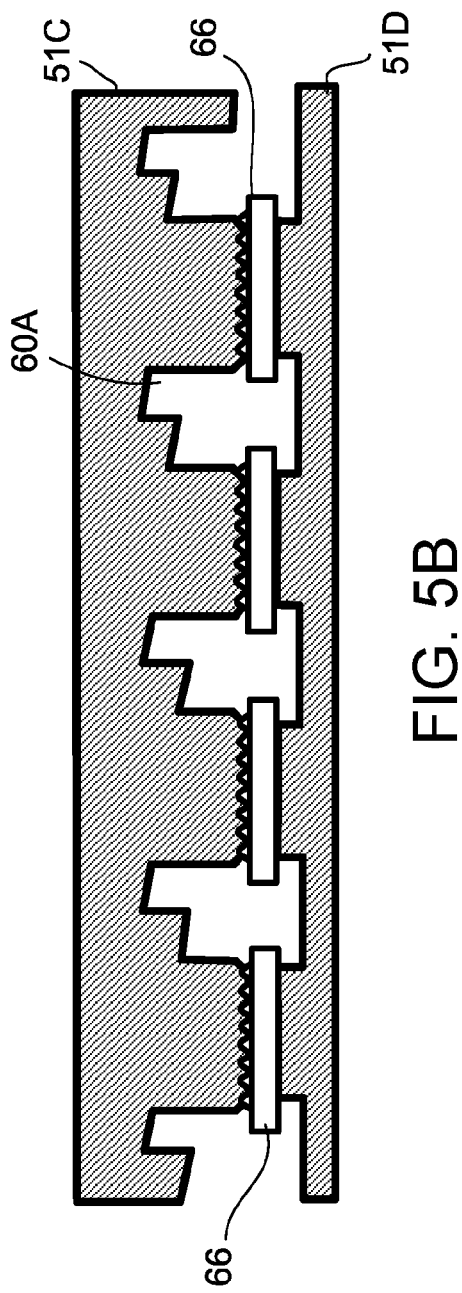
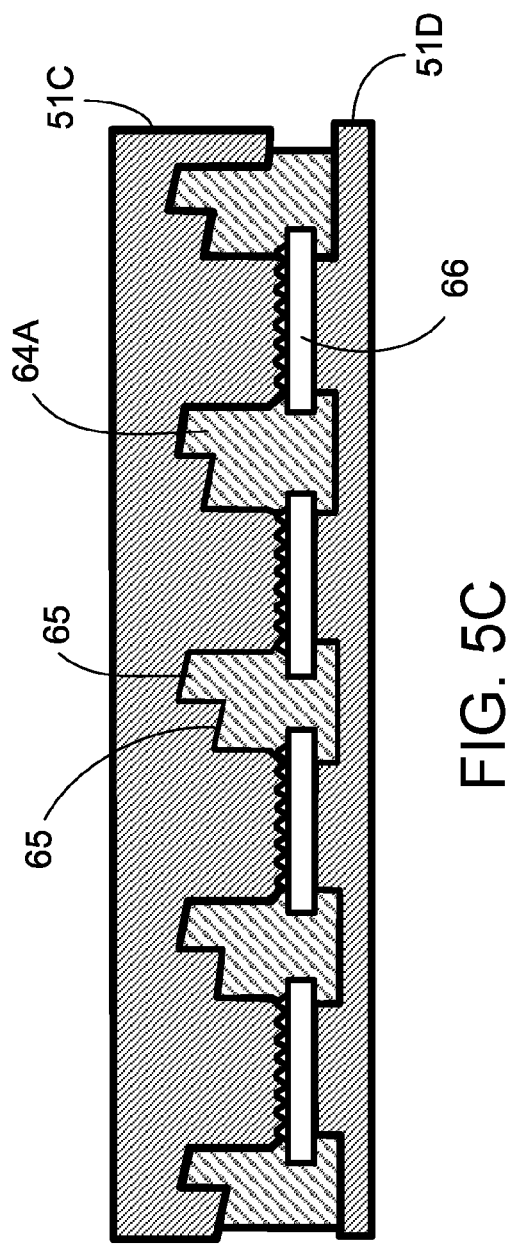
FIG. 5B
FIG. 5C

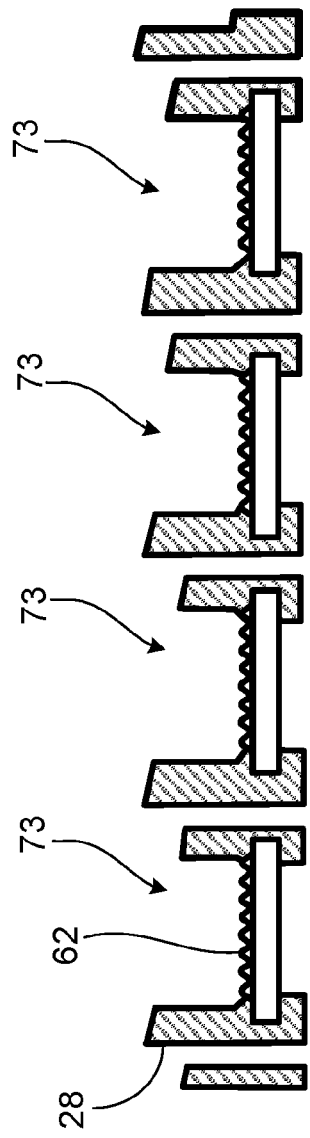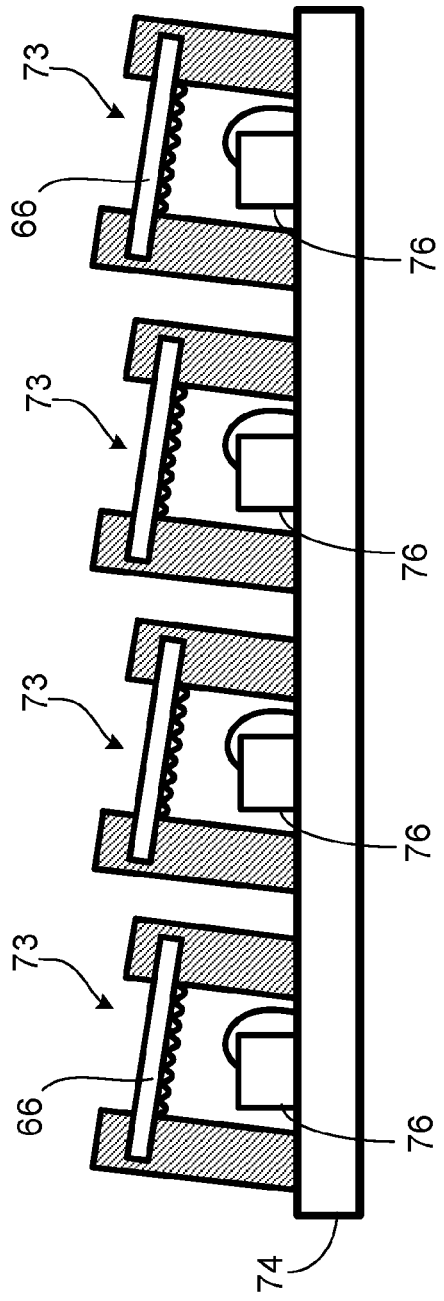

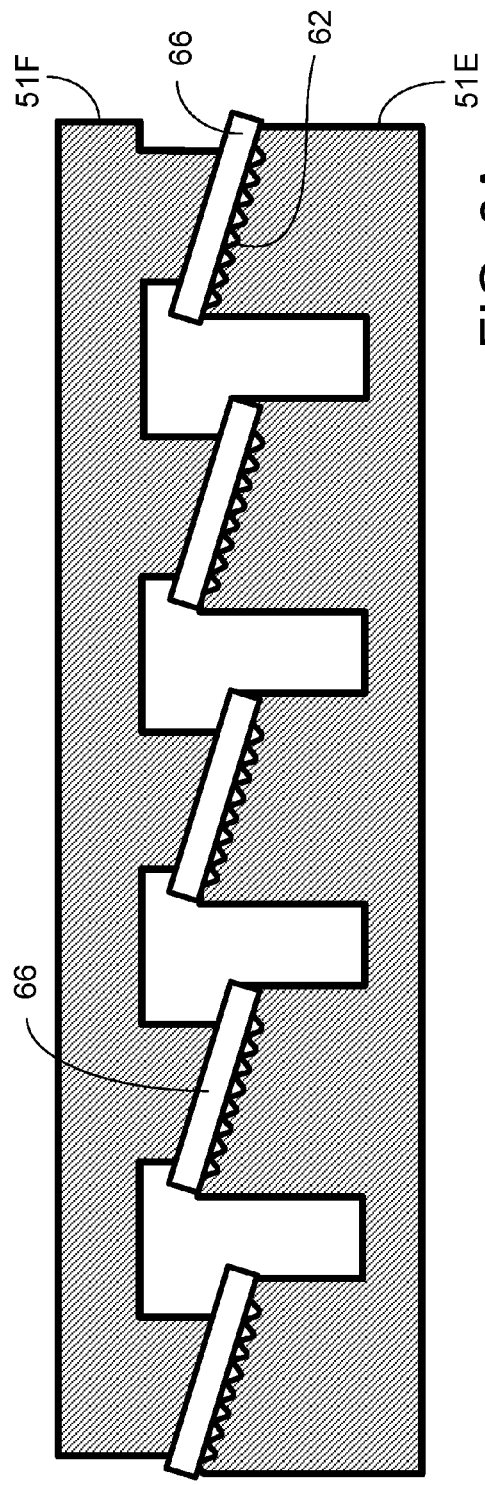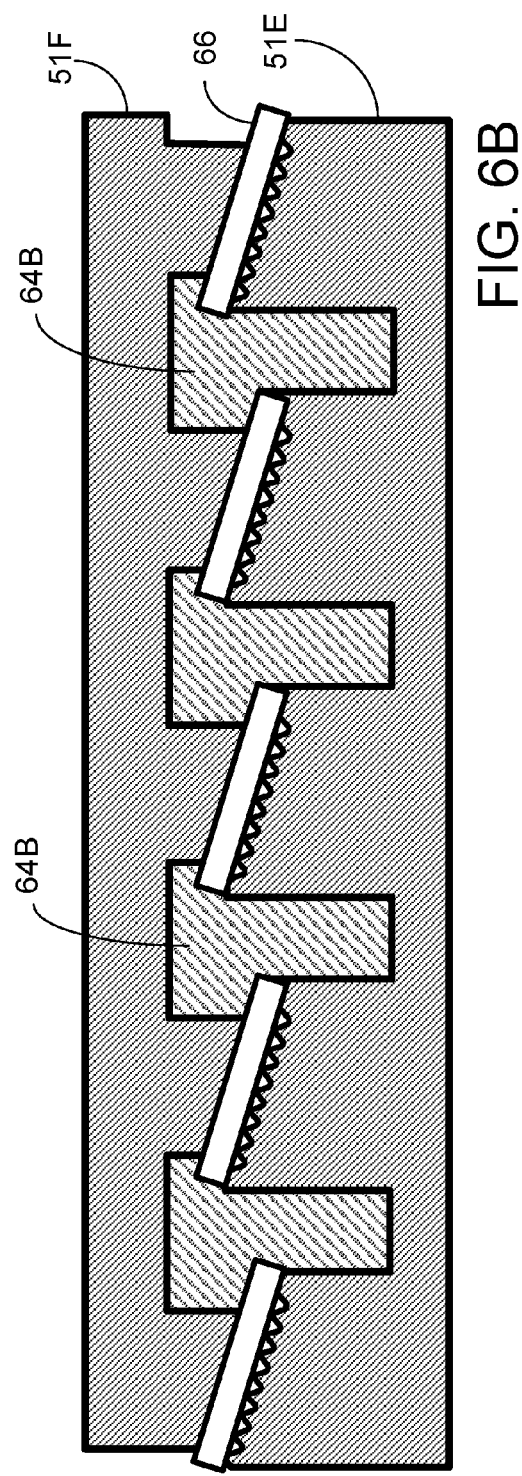

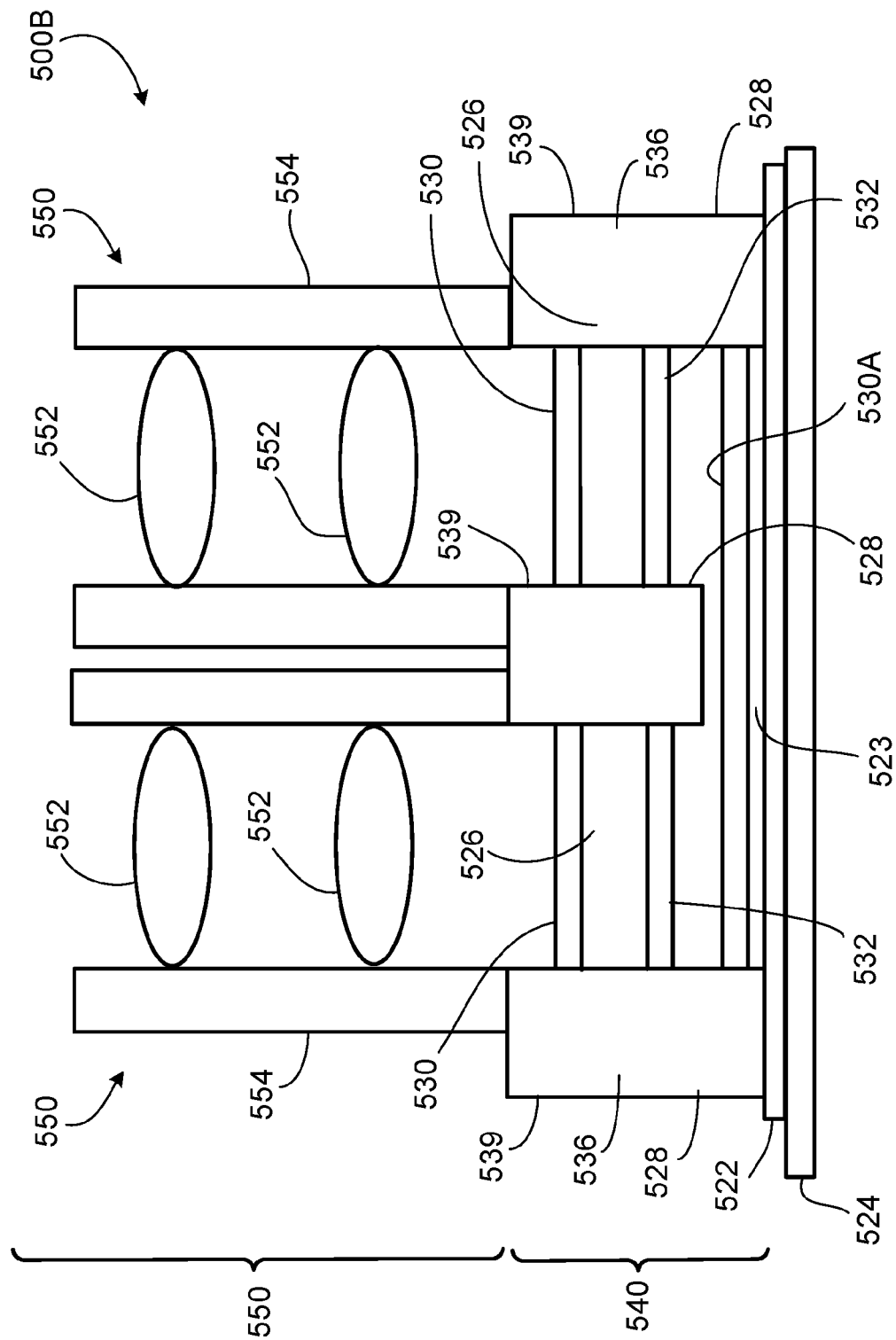

OPTOELECTRONIC MODULES THAT HAVE SHIELDING TO REDUCE LIGHT LEAKAGE OR STRAY LIGHT, AND FABRICATION METHODS FOR SUCH MODULES

CROSS-REFERENCE TO RELATED APPLICATION(S)

This application is a continuation of U.S. application Ser. No. 14/339,657, filed on Jul. 24, 2014, which claims the benefit of priority U.S. Application No. 61/915,193, filed on Dec. 12, 2013 and U.S. Application No. 61/859,828, filed on Jul. 30, 2013. The disclosure of the prior applications is incorporated herein by reference.

FIELD OF THE DISCLOSURE

This disclosure relates to optoelectronic modules have shielding to help reduce light leakage or stray light, and fabrication methods for such modules.

BACKGROUND

Smartphones and other devices sometimes include miniaturized optoelectronic modules such as light modules, sensors or cameras. Light modules can include a light emitting element such as a light emitting diode (LED), an infra-red (IR) LED, an organic LED (OLED), an infra-red (IR) laser or a vertical cavity surface emitting laser (VCSEL) that emits light through a lens to outside the device. Other modules can include a light detecting element. For example, CMOS and CCD image sensors can be used in primary or front facing cameras. Likewise, proximity sensors and ambient light sensors can include a light sensing element such as a photodiode. The light emitting and light detecting modules as well as cameras can be used in various combinations. Thus, for example, a light module such as a flash module can be used in combination with a camera that has an imaging sensor. Light emitting modules in combination with light detecting modules also can be used for other applications such as gesture recognition or IR illumination.

As illustrated in FIG. 1, one challenge when integrating an optoelectronic module 10 into a device such as a smartphone is how to reduce light leakage 14 from the light source 16 in the light module, or how to prevent incoming stray light from impinging, for example, in the case of sensors or cameras. Preferably, light emitted from light source 16 (or light to be detected by a sensor in the module) should pass through lens 12 and exit (or enter) directly through the transparent cover 18 of the module 10. However, in some cases, some of the light 14 exits (or enters) the sides of transparent cover 18, which can be undesirable.

SUMMARY

The present disclosure describes various optoelectronic modules that include an optoelectronic device (e.g., a light emitting or light detecting element) and a transparent cover. Non-transparent material is provided on the exterior sidewalls of the transparent cover, which, in some implementations, can help reduce light leakage from the sides of the transparent cover or can help prevent stray light from entering the module.

In addition, various techniques are described for fabricating the modules. In some implementations, the modules can be fabricated in a wafer-scale process. Such processes allow many modules to be manufactured at the same time. In some implementations, various elements (e.g., an optical element such as a lens, an optical filter, or a focal length correction layer; or a spacer) can be formed directly on one side or both sides of the transparent wafer using one or more vacuum injection and/or replication tools.

For example, in one aspect, an optoelectronic module includes an optoelectronic device mounted on a substrate, and a transparent cover held at a distance from the substrate by a spacer. The spacer is composed of a material that is non-transparent to light emitted by or detectable by the optoelectronic device. Sidewalls of the transparent cover are covered by a material that is non-transparent to light emitted by or detectable by the optoelectronic device.

Some implementations include one or more of the following features. For example, the module also can include an optical element (e.g., a lens, an optical filter (e.g., a dielectric band-pass filter) and/or a focal length correction layer on a surface of the transparent cover). The non-transparent material covering the sidewalls of the transparent cover can be, for example, the same material of which the spacer is composed. In some cases, the non-transparent material covering the sidewalls of the transparent cover is a polymer material (e.g., epoxy, acrylate, polyurethane, or silicone) containing a non-transparent filler (e.g., carbon black, pigment, or dye). The transparent cover may be substantially parallel to the plane of the substrate or tilted at an angle with respect to the plane of the substrate.

In another aspect, a method of fabricating optoelectronic modules includes providing, on a support surface, a plurality of singulated transparent substrates separated laterally from one another. A vacuum injection technique is used to cover sidewalls of each of the singulated transparent substrates with a non-transparent material, and spacer elements are formed that project away from the support surface. In some cases, the method also includes forming or applying a respective optical element (e.g., a lens, an optical filter (e.g., a dielectric band-pass filter) and/or a focal length correction layer on a surface of the transparent cover) on a surface of each of the singulated transparent substrates.

Some implementations include one or more of the following features. For example, the spacer elements can be formed as part of the same vacuum injection technique used to cover the sidewalls of the singulated transparent substrates with a non-transparent material. In some cases, the same combined replication and vacuum injection tool(s) is used for the replication technique and for the vacuum injection technique.

In some implementations, the method includes using a first vacuum injection tool to cover the sidewalls of the transparent substrates with a non-transparent material and to form the spacer elements on a first side of a plane in which the transparent substrates are located during a first vacuum injection process, and using a second combined replication and vacuum injection tool to form the optical elements on a second side of the plane during a replication process and to form projections on the second side of the plane during a second vacuum injection process. The projections can serve, for example, as non-transparent baffles and/or alignment features for the optoelectronic modules.

According to another aspect, a method of fabricating optoelectronic modules includes providing a plurality of singulated transparent substrates within openings of a non-transparent wafer disposed on a support surface. The transparent substrates and the non-transparent wafer are in a plane, and the support surface has openings adjacent a first side of the plane. The method includes forming a respective optical element on each of the transparent substrates on a second side of the plane using a replication technique, filling the openings in the support surface with a first non-transparent material using a first vacuum injection process, and forming non-transparent spacer elements on the second side of the plane using a second vacuum injection process.

According to yet a further aspect, a method of fabricating optoelectronic modules includes providing a wafer that has a plurality of transparent portions laterally spaced from one another. Each of the transparent portions is surrounded laterally by non-transparent material, and the wafer is in a plane and is disposed on a support surface that has openings adjacent a first side of the plane. The method includes providing a combined replication and vacuum injection tool on a second side of the plane. A respective optical element is formed on each of the transparent substrates on the second side of the plane by a replication technique using the combined replication and vacuum injection tool. The openings in the support surface are filled with a first non-transparent material, and spacer elements composed of the non-transparent material are formed on the second side of the plane by a vacuum injection process using the combined replication and vacuum injection tool.

According to another aspect, an optoelectronic module includes an optoelectronic device mounted on a substrate, a transparent cover separated from the substrate by a spacer, and an optical element attached to the transparent cover. Sidewalls of the transparent cover are covered by a first material that is non-transparent to light emitted by or detectable by the optoelectronic device, and the first non-transparent material is surrounded laterally by a second different non-transparent material. In some implementations, the first non-transparent material is a polymer material (e.g., epoxy, acrylate, polyurethane, or silicone) containing a non-transparent filler (e.g., carbon black, pigment, or dye), and the second non-transparent material is a glass-reinforced epoxy laminate material. Other non-transparent materials can be used as well.

In accordance with yet another aspect, a method of fabricating optoelectronic modules includes providing a substrate wafer that comprises a metal frame and a molded cavity, wherein portions of the metal frame are encapsulated laterally by the molded cavity, and the metal frame has optoelectronic devices mounted thereon and separated laterally from one another. The method includes providing a spacer/optics structure that includes singulated transparent substrates separated laterally from one another, the spacer/optics structure including a spacer element that projects away from the transparent substrates, wherein sidewalls of each of the transparent substrates is encapsulated laterally by a non-transparent material. An end of the spacer element is attached to the molded cavity to form a stack.

In some instances, a module may include an optics assembly on the object-side of the transparent cover. The optics assembly can include, for example, one or more lenses (e.g., a vertical stack of injection molded lenses).

Other aspects, features and advantages will be readily apparent from the following detailed description, the accompanying drawings and the claims.

BRIEF DESCRIPTION OF THE DRAWINGS

FIGS. 4A-4C illustrate steps in a method of fabricating optoelectronic modules having tilted transparent substrates.
FIGS. 5A-5E illustrate steps in another method of fabricating optoelectronic modules having tilted transparent substrates.
FIGS. 6A-6C illustrate steps in a yet a further method of fabricating optoelectronic modules having tilted transparent substrates.
FIGS. 23A-23C are further examples of modules.

DETAILED DESCRIPTION

Figure 1:
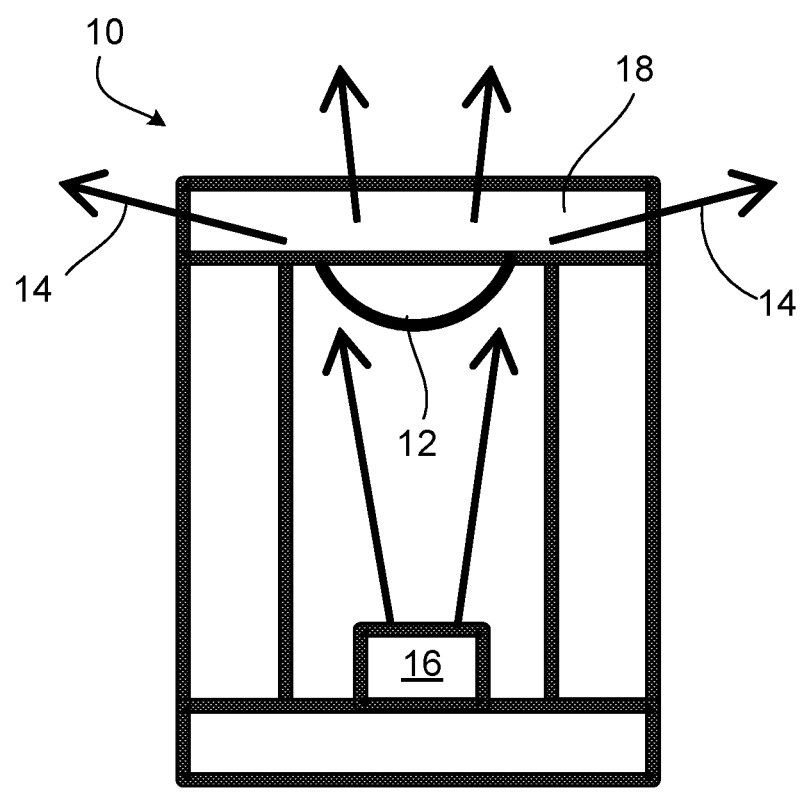
FIG. 1 shows an example of an optoelectronic module.
Figure 2A:
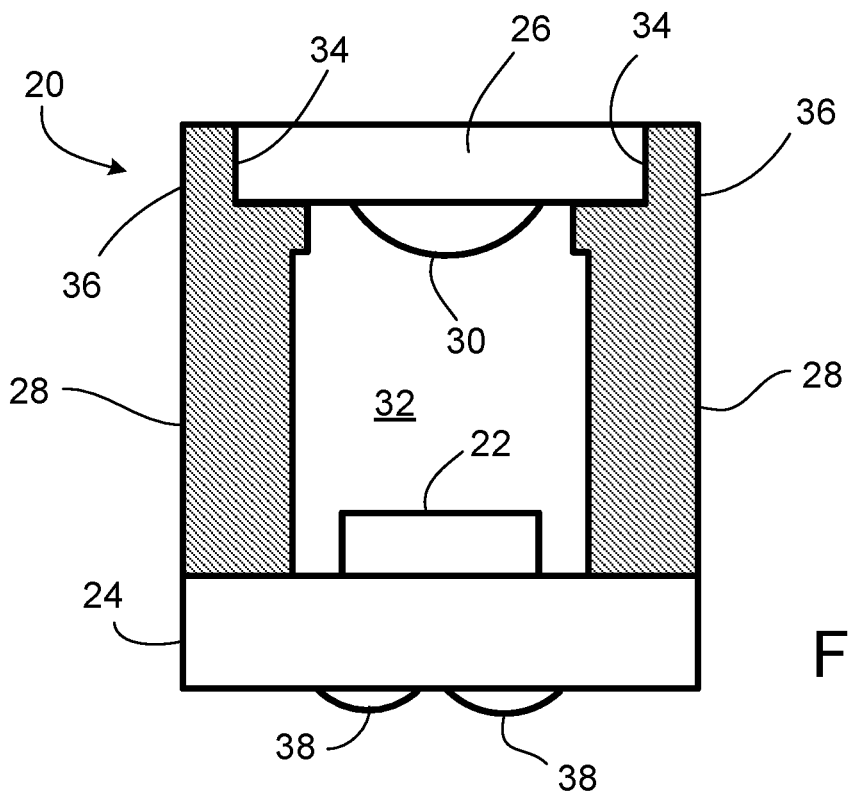
FIGS. 2A-2H show examples of optoelectronic modules.

The present disclosure describes various techniques for fabricating optoelectronic modules that include non-transparent material on the exterior sidewalls of the transparent cover. An example of such a module is illustrated in FIG. 2A, which shows a module 20 including an optoelectronic device 22 mounted on a printed circuit board (PCB) or other substrate 24. Examples of the optoelectronic device 22 include a light emitting element (e.g a LED, an IR LED, an OLED, an IR laser or a VCSEL) or a light detecting element (e.g., a photodiode or other light sensor).

A transparent cover 26 composed, for example, of glass, sapphire or a polymer material, is separated from substrate 24 by a spacer 28. Spacer 28 surrounds optoelectronic device 22 and serves as sidewalls for the module. Transparent cover 26 generally is transparent to wavelengths of light emitted by or detectable by optoelectronic device 22. Spacer 28 preferably is composed of a non-transparent material, such as a vacuum injected polymer material (e.g., epoxy, acrylate, polyurethane, or silicone) containing a non-transparent filler (e.g., carbon black, pigment, or dye). Attached to one side of transparent cover 26 is an optical element such as a lens 30. In the illustrated example of FIG. 2A, lens 30 is formed by a replication technique and, together with optoelectronic device 22, is present in an interior area 32 of module 20 (i.e., on the sensor-side of the transparent cover). Sidewalls 34 of transparent cover 26 also are covered by a non-transparent material 36, which in the illustrated example of FIG. 2A is composed of the same material as is used for spacer 28. The exterior surface of substrate 24 includes one or more solder balls or other conductive contacts 38, which can be coupled electrically to optoelectronic device 22 by way of conductive vias extending through substrate 24.

Figure 2B:
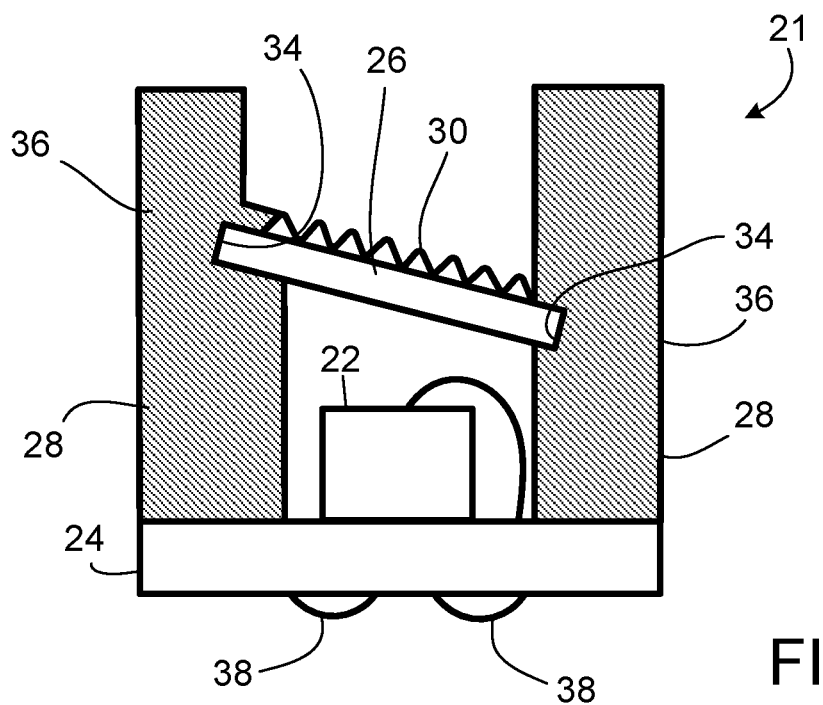
Figure 2C:
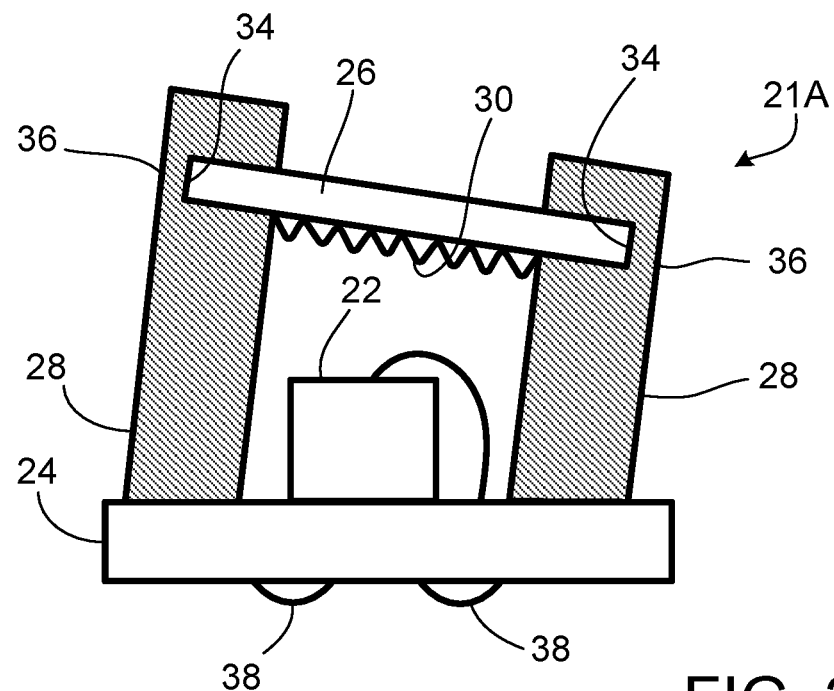
Figure 2D:
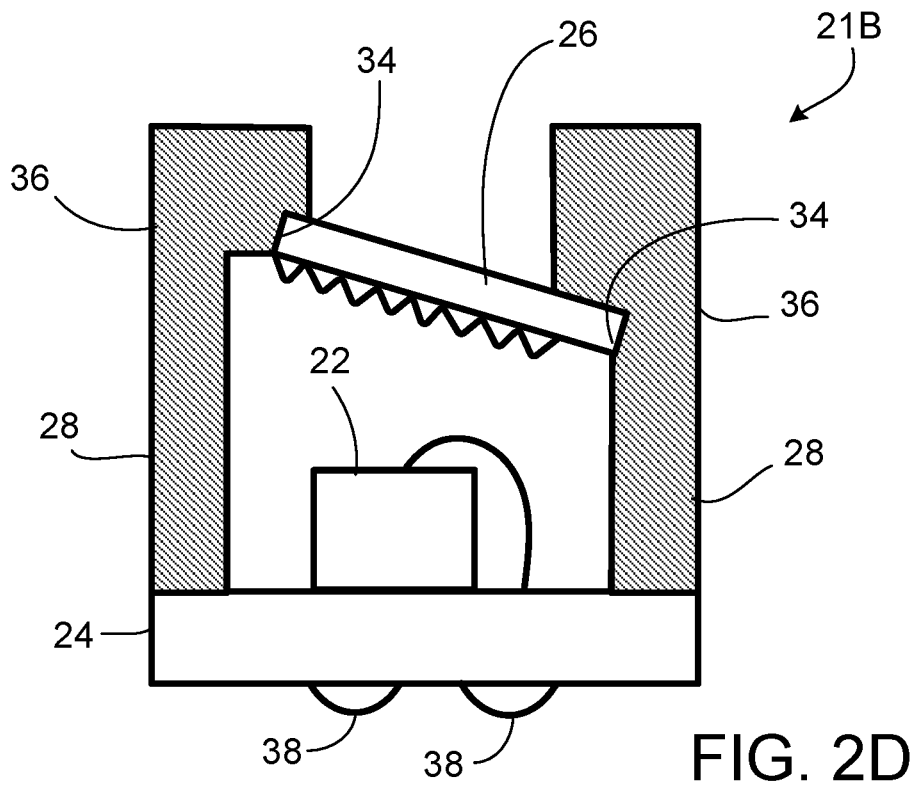

In the example of FIG. 2A, transparent cover 26 is substantially perpendicular to the module's optical axis and is substantially parallel to substrate 24. In some implementations, however, transparent cover 26 can be tilted at an angle with respect to the plane of substrate 24. Examples are illustrated in FIGS. 2B, 2C and 2D. In each of these examples, sidewalls 34 of transparent cover 26 are covered by a non-transparent material 36, which may be composed, for example, of the same material as is used for spacer 28. In the implementation of FIG. 2C, spacer 28 also is tilted at an angle with respect to the plane of substrate 24.

In some cases, the non-transparent material 36 that covers the sidewalls 34 of transparent cover 26 is surrounded by another non-transparent material (e.g., a PCB material 40 such as FR4, which is a grade designation assigned to glass-reinforced epoxy laminate material). See module 20A in FIG. 2E. The glass-reinforced epoxy laminate material 40 also can be substantially non-transparent to light emitted by or detectable by optoelectronic device 22.

Figure 2E:
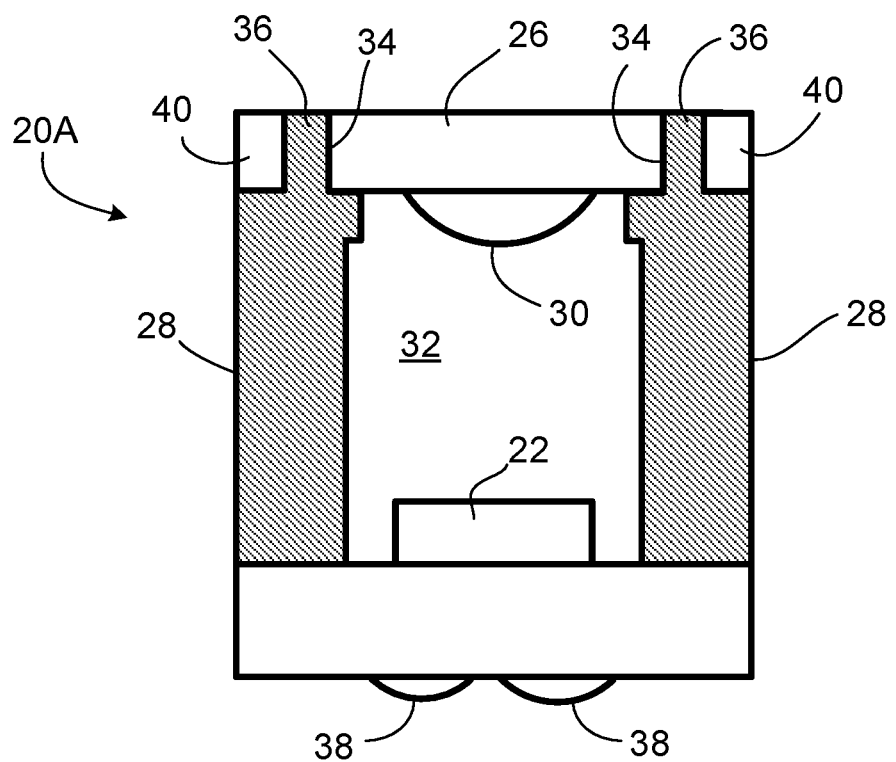
Figure 2F:
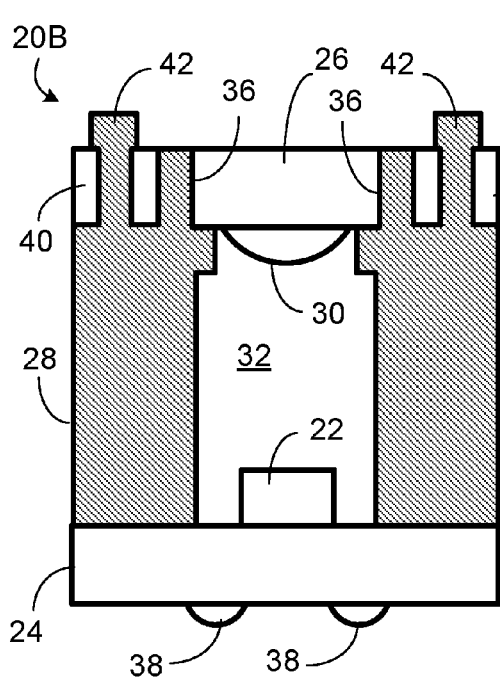

In some implementations, the module includes alignment features 42 that extend beyond the object-side surface of the transparent cover 26 (see module 20B in FIG. 2F). Such alignment features 42 can facilitate positioning of the module within a smartphone or other appliance. The alignment features 42 can be composed, for example, of the same or a different non-transparent material as the spacer 28. They can be attached to the spacer 28 by a section of non-transparent material that extends through the glass-reinforced epoxy laminate material 40.

Figure 2G:
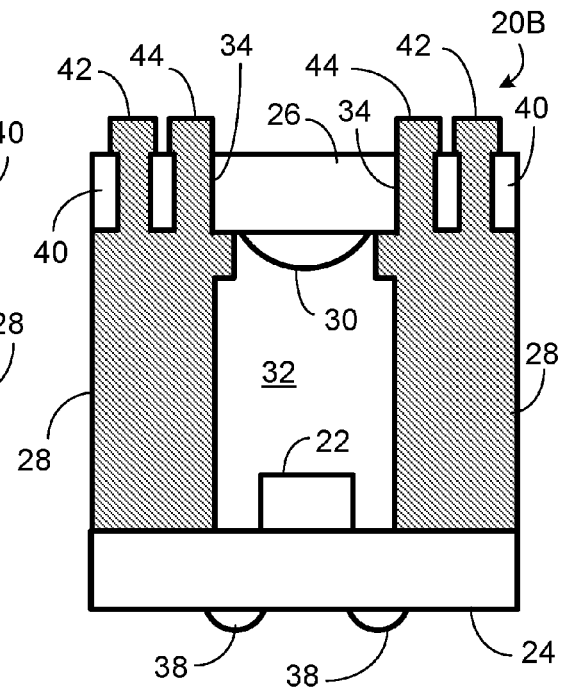

Some implementations include a projection 44 that extends beyond the top of the transparent cover 26 at or near its side edges, as shown in the module 20C of FIG. 2G. The projection 44, which can be composed of a non-transparent material (e.g., a polymer such as epoxy with carbon black), can serve as a baffle to help guide light exiting or entering the module.

Figure 2H:
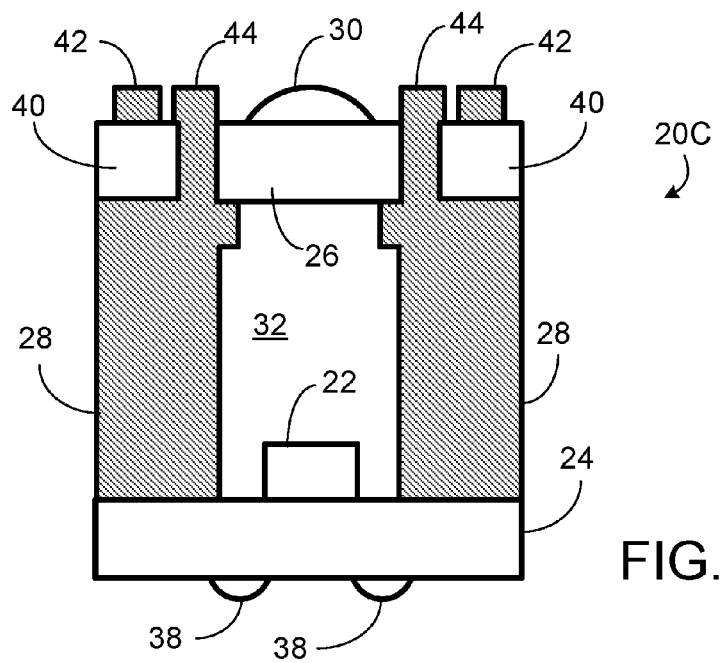

In some implementations, the optical element 30 is disposed on the sensor-side surface of the transparent cover 26. In other implementations, the optical element 30 (e.g., a lens or diffuser) is disposed on the object-side surface of transparent cover 26 (see, e.g., FIG. 2H) or optical elements can be disposed on both sides of the transparent cover.

The following paragraphs describe various fabrication techniques for manufacturing the foregoing optoelectronic modules and other similar modules that include a light emitting element (e.g., a LED, IR laser or VCSEL) or light detecting element (e.g., a photodiode) and an optical element such as a lens or diffuser integrated as part of the module. Some modules can include multiple optoelectronic devices (e.g., a light emitting element and a light detecting element). In some implementations, the modules are fabricated in a wafer-scale process so that multiple modules (e.g., hundreds or even thousands) can be manufactured at the same time. Some implementations include first mounting or attaching a transparent wafer onto UV dicing tape, then dicing the transparent wafer into singulated transparent covers. Further, in some implementations a coating (e.g. an optical filter) may be applied to a transparent wafer. The wafer subsequently can be mounted onto the UV dicing tape, and then diced into singulated transparent covers. Some implementations include using a vacuum injection technique to form various elements on a structured substrate (i.e., a substrate that has a non-flat or non-planar surface). Various elements (e.g., the optical elements or spacers) can be formed directly on one side or both sides of the transparent wafer using one or more vacuum injection and/or replication tools. Some implementations involve the placement of singulated transparent covers onto a support surface such as a carrier wafer, a vacuum chuck or UV dicing tape. The singulated transparent covers can have various shapes (e.g., circular, quadratic).

Figure 3A:
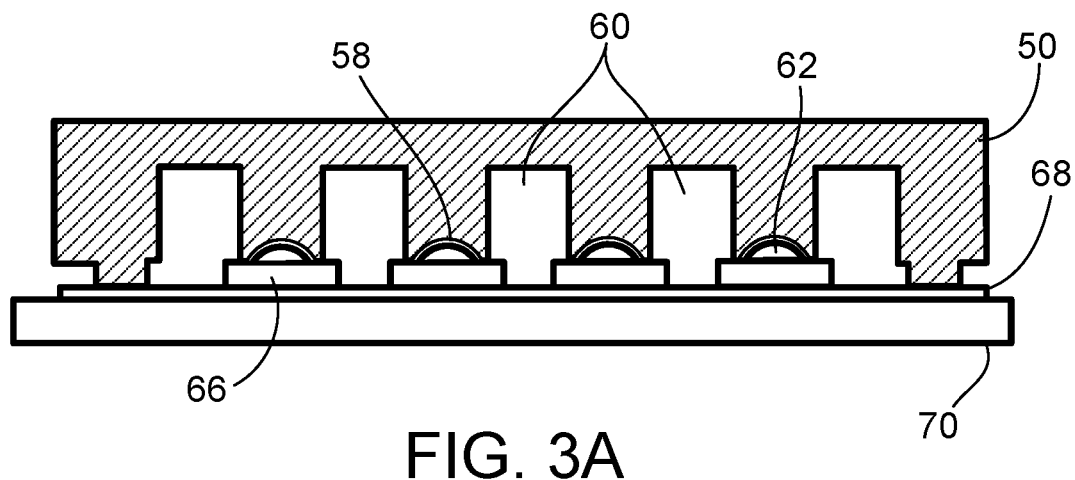
FIGS. 3A-3E illustrate steps in a method of fabricating optoelectronic modules using singulated transparent substrates.

FIGS. 3A-3E, for example, illustrate a wafer-level process for fabricating modules like the module 20 of FIG. 2A. A replication and vacuum injection tool 50 having optical element replication sections 58 and spacer sections 60 is used to form a wafer-scale spacer/optics structure 72 that includes replicated optical elements 62 and vacuum injected spacers 64 (see FIG. 3C). In particular, as shown in FIG. 3A, singulated transparent substrates 66, on which the optical elements (e.g., lenses) are to be formed, are placed on a support surface 68. The support surface 68 can be implemented, for example, as a carrier wafer which rests on polydimethylsiloxane ("PDMS") vacuum sealing chuck 70. Alternatively, the vacuum sealing chuck 70 itself can serve as the support surface. In some implementations, the support surface 68 may be implemented as a transient substrate (e.g., UV dicing tape, a PDMS, glass, polymer wafer, the tool(s) used to form the replicated optical elements 62 and/or the spacers 64, or a combination of any of the foregoing examples). Singulated substrates 66 can be composed, for example, of a transparent material such as glass or a transparent plastic or polymer material.

As used in this disclosure, replication refers to a technique in which a structured surface is embossed into a liquid, viscous or plastically deformable material, and then the material is hardened, e.g., by curing using ultraviolet radiation or heating. In this way, a replica of the structured surface is obtained. Suitable materials for replication are, for example, hardenable (e.g., curable) polymer materials or other replication materials, i.e. materials which are transformable in a hardening or solidification step (e.g., a curing step) from a liquid, viscous or plastically deformable state into a solid state. As shown, for example, in FIG. 3A, a replication material (e.g., a liquid, viscous or plastically deformable material) is placed onto the optical replication sections 58 of the replication tool 50 (FIG. 3A), and the replication sections 58 are brought into contact with the singulated transparent substrates 66 so that the replication material is pressed between the upper surfaces of the singulated transparent substrates 66 and the optical replication sections 58. The replication material then is hardened (e.g., by UV or thermal curing) to form replicated optical elements 62 (e.g., lenses) on the surface of the singulated transparent substrates 66.

Figure 3B:
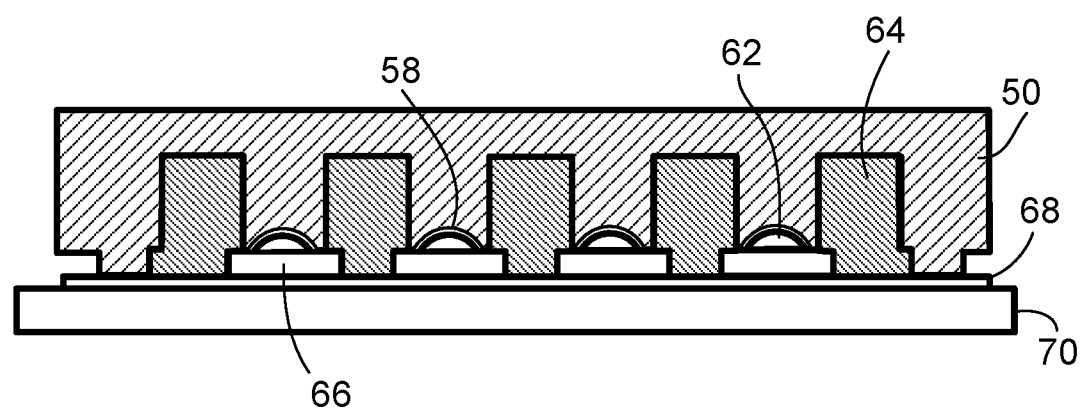
Figure 3C:
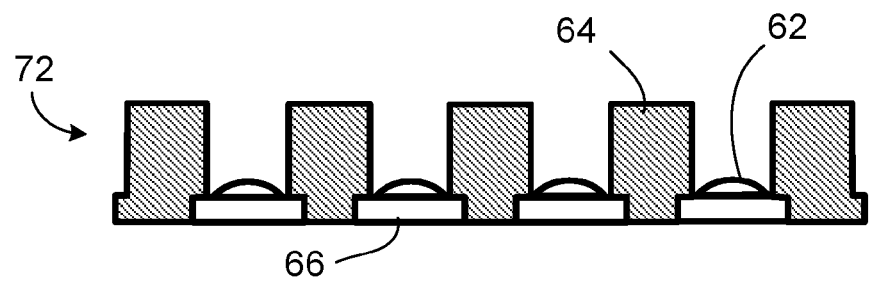

Next, a vacuum injection material (e.g., a liquid, viscous or plastically deformable material) is injected through an inlet of the vacuum sealing chuck 70 so as to substantially fill spacer sections 60 and form the spacer elements 64 (see FIG. 3B). At the same time, the spaces between the transparent substrates 66 are filled such that the sidewalls of the transparent substrates are covered by, or embedded within, the vacuum injected material. In some implementations, a vacuum pump provided near an outlet of the vacuum sealing chuck 70 facilitates the vacuum injection material filling spacer sections 60. Although the replication material that is used to form lenses 62 is transparent (i.e., to wavelengths of light that are emitted by or detectable by the optoelectronic device), the vacuum injection material for the spacers 64 preferably is non-transparent and can be composed, for example, of a polymer such as epoxy with carbon black. The vacuum injection material for the spacers 64 then is hardened (e.g., by UV or thermal curing), thus forming spacer elements 64 on the support surface 68 (FIG. 3B). Upon removal of the replication and vacuum injection tool 50, the result is a wafer-scale spacer/optics structure 72 that includes optical elements 62 on the transparent substrates 66, which are separated laterally from one another by portions of the spacer elements 64 (FIG. 3C). Further details that may be applicable to the process of FIGS. 3A-3B in some implementations are described in U.S. Provisional Patent Application No. 61/746,347, the contents of which are incorporated here by reference.

Figure 3D:
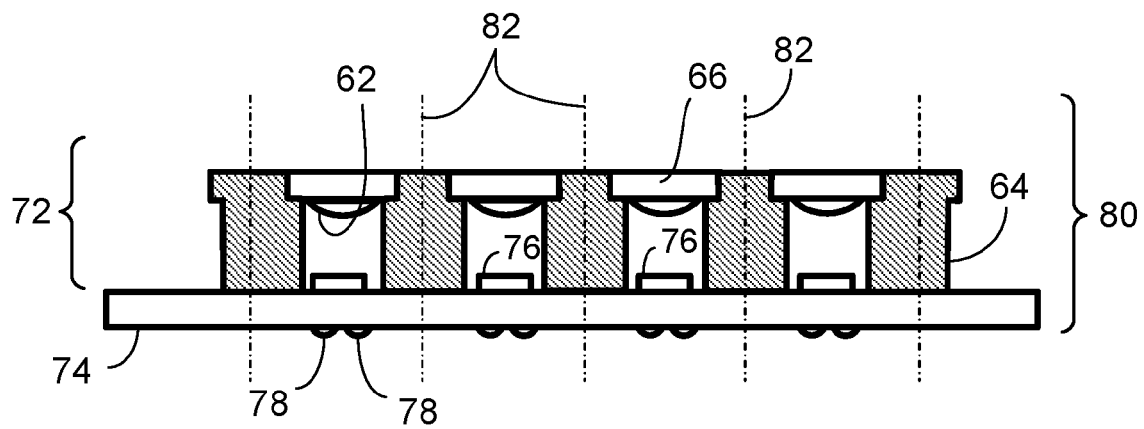

Next, spacer/optics structure 72 is attached to a PCB or other substrate 74 on which are mounted multiple optoelectronic devices (e.g., light emitting elements or light detecting elements) 76 (FIG. 3D). The opposite surface of substrate 74 includes one or more solder balls or other conductive contacts 78, which can be coupled electrically to optoelectronic devices 76 by way of conductive vias extending through substrate 74. Substrate 74 is attached, for example, using a thermally stable adhesive, to spacer elements 64 on the spacer/optics structure 72. The result is a stack 80 that includes an array of optoelectronic devices 76, each of which is aligned with a respective one of the optical elements (e.g., lenses) 62. In some cases, a non-transparent baffle wafer is attached on the opposite side of the transparent substrates 66 so as to provide a baffle on the object-side of the resulting modules. In some implementations, image sensors may be attached or electrically connected to the PCB substrate, and subsequently attached to the spacer optics structure 72 later in the process (e.g., after performance of the steps in FIG. 3D).

Figure 3E:
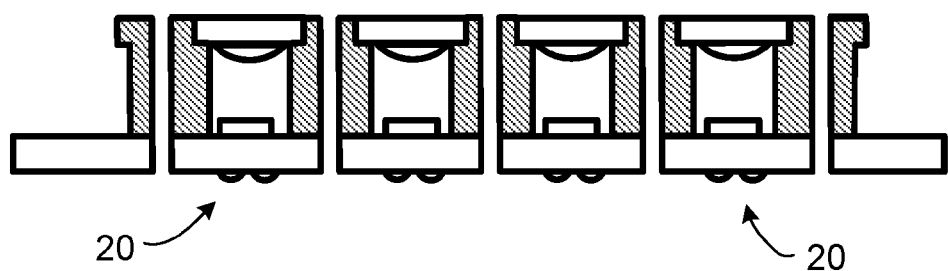

The stack 80 then can be separated along dicing lines 82 to form individual flash modules 20 each of which includes an optoelectronic device aligned with a lens element attached to a transparent cover, whose exterior sidewalls are covered with, or embedded within, non-transparent material (see FIGS. 3E and 2A). Thus, the foregoing technique can be used to fabricate multiple modules 20 on a wafer-level scale.

FIGS. 4A-4C illustrate steps in a wafer-level process for fabricating optoelectronic modules 21A as shown in FIG. 2B (i.e., having a transparent cover 26 tilted at an angle). Optical elements (e.g., lenses) can be replicated, for example, on a transparent wafer (e.g., composed of a glass or a transparent plastic or polymer material). The wafer then can be separated (e.g., by dicing) into singulated transparent substrates 66, each of which includes a replicated optical element 62 on its surface. Next, as shown in FIG. 4A, the singulated substrates 66 are placed on a first vacuum injection tool 51A, and a second vacuum injection tool 51B is brought into contact above the substrates 66. The tools 51A, 51B include respective slanted surfaces 63A, 63B between which the substrate 66 and optical element 62 are positioned.

A vacuum injection material (e.g., a liquid, viscous or plastically deformable material) then can be injected so as to substantially fill spaces 60 and form the non-transparent spacer/sidewall elements 64 (see FIG. 4B). As the spaces between the tools 51A, 51B are filled, the sidewalls of the transparent substrates 66 are covered by, or embedded within, the vacuum injected material. In some implementations, a vacuum pump facilitates the vacuum injection material filling spaces 60. The vacuum injection material preferably is non-transparent and can be composed, for example, of a polymer such as epoxy with carbon black. The lens yard of each singulated transparent substrate 66 should be chosen such that it can protect the optical element 62 from the vacuum injected material (i.e., prevent the epoxy material from flooding the optical element). The vacuum injection material for the spacer/sidewall elements 64 then is hardened (e.g., by UV or thermal curing). Upon removal of the vacuum injection tools 51A, 51B, the result is a wafer-scale spacer/optics structure 72A that includes optical elements 62 on transparent substrates 66, which are separated laterally from one another by portions of the spacer/sidewall elements 64 (FIG. 4C). Subsequent processing of the wafer-scale spacer/optics structure 72A can proceed as described above in connection with FIG. 3D. After dicing, multiple modules 21 can be obtained, where each module includes a tilted transparent substrate on which there is an optical element. Side edges of the module's transparent substrate are covered by non-transparent material.

FIGS. 5A-5E illustrate steps in a wafer-level process for fabricating optoelectronic modules 21A as shown in FIG. 2C (i.e., having a transparent cover 26 tilted at an angle). As shown in FIG. 5A, a first combined replication and vacuum injection tool 51C is used to replicate an optical element (e.g., a lens) 62 on the (sensor-side) surface of transparent singulated substrates 66. The first tool 51C includes cavities 60A defined in part by slanted surfaces 61 at different heights from one another.

While the first tool 51C remains in place, a second vacuum injection tool 51D is brought into contact with the opposite (object-side) surface of the substrates 66 (see FIG. 5B). A vacuum injection material (e.g., a liquid, viscous or plastically deformable material) then can be injected so as to substantially fill spaces between the tools 51C, 51D and form the non-transparent spacer/sidewall elements 64A (see FIG. 5C). As the spaces between the tools 51C, 51D are filled, the sidewalls of the transparent substrates 66 are covered by, or embedded within, the vacuum injected material. Further, the spacer/sidewall elements 64A include slanted end portions 65. After curing the vacuum injected material, the tools 51C, 51D are removed from the resulting optics/spacer structure, which then can be separated into individual optics/spacer components 73 (see FIG. 5D). The optics/spacer components 73 then can be inverted and attached to a PCB or other substrate 74 that includes optoelectronic devices (e.g., light emitting elements or light detecting elements) 76 mounted on its surface (FIG. 5E). The optics/spacer components 73 are mounted such that the slanted end portions 65 are attached to the surface of the substrate 74, which results in the spacer/sidewalls 28 of each component 73 being slanted at an angle with respect to the substrate 74. The resulting structure then can be separated (e.g., by dicing) into multiple modules 21A, as shown in FIG. 2C FIGS. 6A-6C illustrate steps in a wafer-level process for fabricating optoelectronic modules 21B as shown in FIG. 2C (i.e., having a transparent cover 26 tilted at an angle). As shown in FIG. 5A, individual singulated transparent substrates 66 are supported on slanted surfaces of a first combined replication and vacuum injection tool 51E. A second vacuum injection tool 51F is positioned above the singulated substrates 66. The first tool 51E is used to replicate an optical element (e.g., a lens) 62 on the (sensor-side) surface of each singulated substrate 66. With both tools 51E, 51F in place, a vacuum injection material (e.g., a liquid, viscous or plastically deformable material) is injected so as to substantially fill spaces between the tools and form the non-transparent spacer/sidewall elements 64B (see FIG. 5C). As the spaces between the tools 51E, 51F are filled, the sidewalls of the transparent substrates 66 are covered by, or embedded within, the vacuum injected material. After curing the vacuum injected material, the tools 51E, 51F are removed from the resulting optics/spacer structure 72B that includes optical elements 62 on transparent substrates 66, which are separated laterally from one another by portions of the spacer/sidewall elements 64 (see FIG. 6C). Subsequent processing of the wafer-scale spacer/optics structure 72B can proceed as described above in connection with FIG. 3D. After dicing, multiple modules 21B can be obtained, where each module includes a tilted transparent substrate on which there is an optical element. Side edges of the module's transparent substrate are covered by non-transparent material.

Figure 7A:
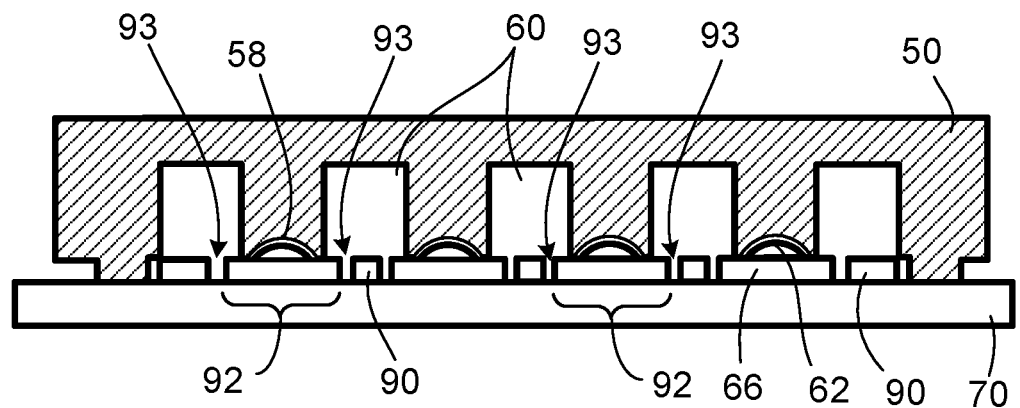
FIGS. 7A-7E illustrate steps in another method of fabricating optoelectronic modules using singulated transparent substrates.
Figure 7B:
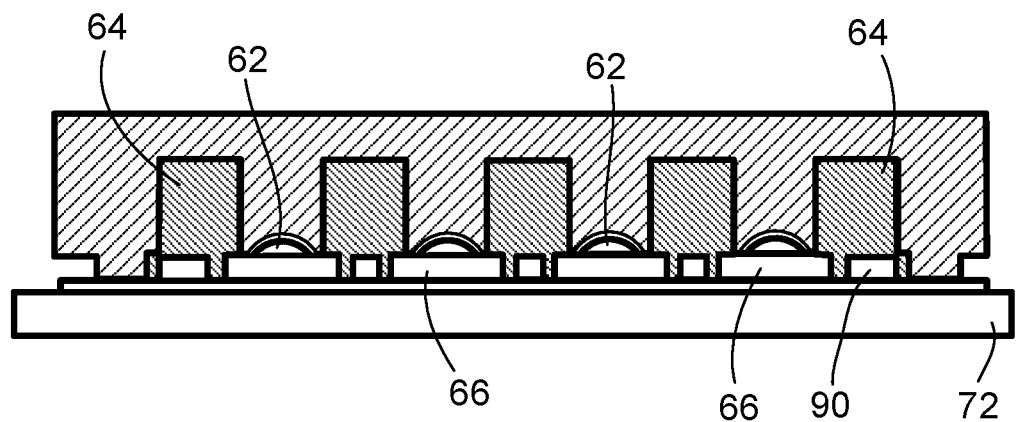

FIGS. 7A-7E illustrate steps for fabricating optoelectronic modules 20A as shown in FIG. 2E, in which the non-transparent material that covers the sidewalls of the transparent cover is surrounded, for example, by a glass-reinforced epoxy laminate material (e.g., FR4). As shown in FIG. 7A, singulated transparent substrates 66, on which the optical elements are to be formed, are placed within respective openings (e.g., cavities) 92 of a relatively sturdy non-transparent wafer 90, which can be composed, for example, of a printed circuit board (PCB) material such as FR4. As described above, the singulated substrates 66 can be composed, for example, of a transparent material such as glass or a transparent plastic or polymer material. Each opening 92 preferably is slightly larger than the diameter (or width) of the singulated transparent substrate 66 that is placed within the opening such that there is a small gap 93 between the singulated transparent substrate 66 and adjacent portions of the non-transparent wafer 90. The non-transparent wafer 90 as well as the singulated transparent substrates 66 can be placed on a PDMS vacuum sealing chuck 70, which serves as a support surface. In some cases, a separate carrier wafer, which is placed on the vacuum sealing chuck 70, serves as the support surface.

Figure 7C:
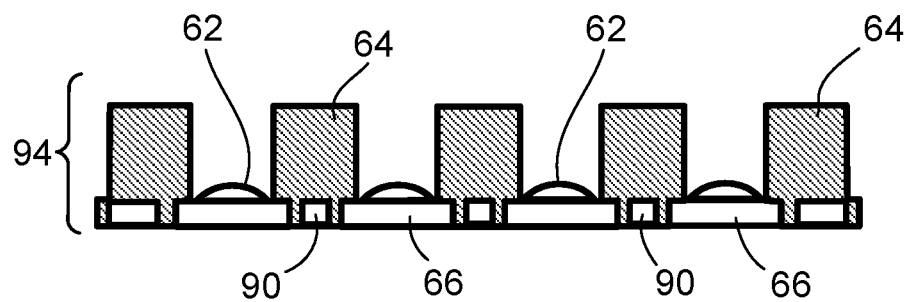

Next, replicated optical elements 62 (e.g., lenses) are formed on the surface of the singulated transparent substrates 66 using a replication and vacuum injection tool 50 (see FIG. 7B) in a manner similar to the technique described above in connection with FIGS. 3A-3B. In addition, non-transparent spacer elements 64 are formed by a vacuum injection technique (see FIG. 7B) in a manner similar to the one described above in connection with FIGS. 3A-3B. Gaps 93 between the singulated transparent substrate 66 and adjacent portions of the non-transparent wafer 90 also are filled with the vacuum injected spacer material. Thus, sidewalls of the transparent substrates 66 are covered by, or embedded within, the vacuum injected spacer material (e.g., epoxy with carbon black), which is surrounded by the material (e.g., FR4) of the non-transparent wafer 90. The vacuum injected spacer material (e.g., epoxy with carbon black) that is on the sidewalls of a particular transparent substrate 66 thus forms a single contiguous region with a spacer element 64. Upon removal of the replication and vacuum injection tool 50, the result is a wafer-scale spacer/optics structure 94 (FIG. 7C).

Figure 7D:
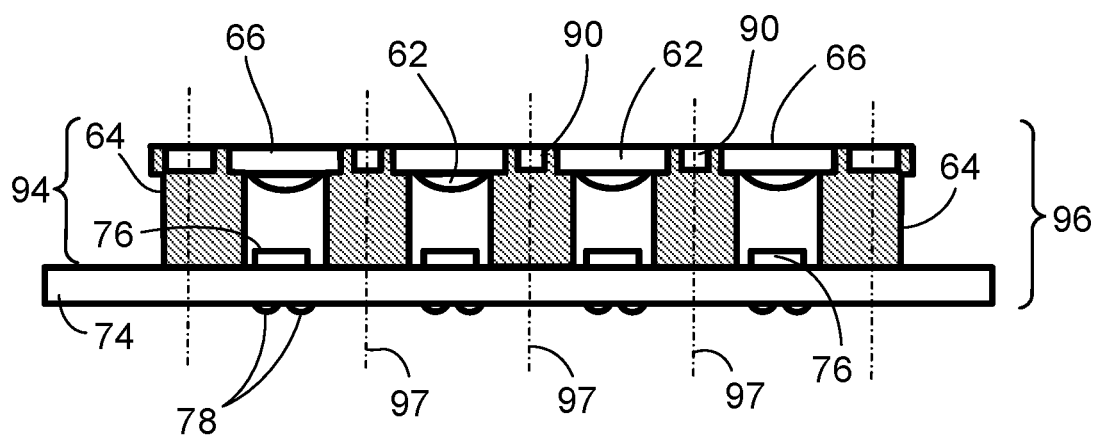
Figure 7E:
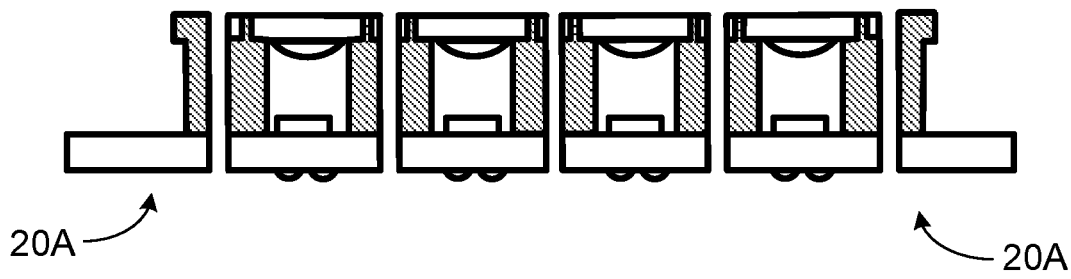

Next, spacer/optics structure 94 is attached to a PCB or other substrate 74 on which are mounted multiple optoelectronic devices 76 (FIG. 7D). As described in connection with the previous example, substrate 74 can be attached, for example, using a thermally stable adhesive, to spacer elements 64 on the spacer/optics structure 94. The result is a stack 96 that includes an array of optoelectronic devices 76, each of which is aligned with a respective one of the optical elements (e.g., lenses) 62. In some cases, a non-transparent baffle wafer is attached on the opposite side of the transparent substrates 66 so as to provide a baffle on the object-side of the resulting modules.

The stack 96 then can be separated along dicing lines 82 to form individual modules 20A each of which includes an optoelectronic device aligned with an optical element attached to a transparent cover, whose exterior sidewalls are covered with, or embedded within, a first non-transparent material (e.g., epoxy with carbon black) that is surrounded by a second non-transparent material (e.g., a glass-reinforced epoxy laminate material such as FR4). Thus, the foregoing technique can be used to fabricate multiple modules 20A on a wafer-level scale (see FIGS. 7E and 2E).

FIGS. 8A-8D illustrate steps of another wafer-level process that, like the previous process of FIGS. 7A-7E, also includes placing singulated transparent substrates for the optical elements within respective openings (e.g., cavities) of a relatively sturdy non-transparent wafer. The process of FIGS. 8A-8D can be used to fabricate multiple optoelectronic modules like the module 20D of FIG. 2H, in which the optical element (e.g., lens) is disposed on the object-side surface of the transparent cover.

Figure 8A:
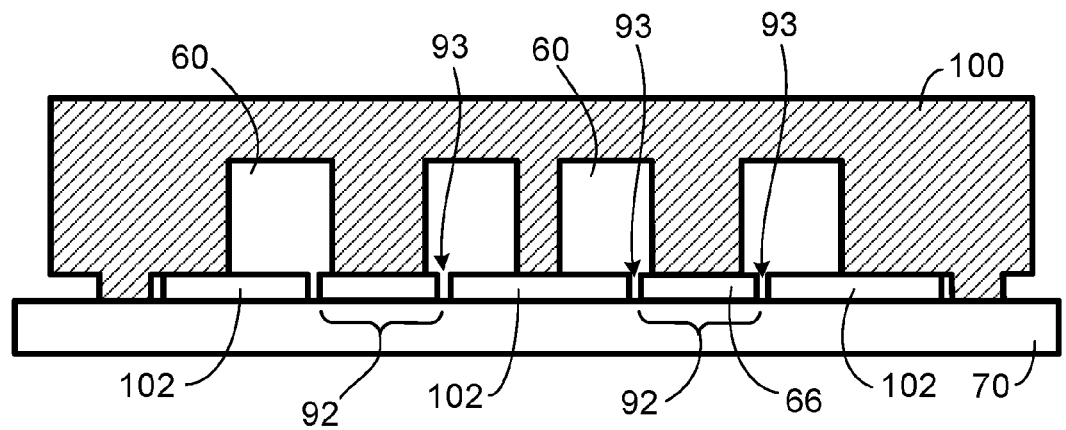
FIGS. 8A-8D illustrate steps in yet a further method of fabricating optoelectronic modules using singulated transparent substrates.

As shown in FIG. 8A, singulated transparent substrates 66 are placed within respective openings (e.g., cavities) 92 of a relatively sturdy non-transparent wafer 102, which can be composed, for example, of a PCB material such as FR4. Here too, the singulated substrate 66 can be composed, for example, of a transparent material such as glass or a transparent plastic or polymer material. Each opening 92 preferably is slightly larger than the diameter (or width) of the singulated transparent substrate 66 that is placed within the opening such that there is a small gap 93 between the singulated transparent substrate 66 and adjacent portions of the non-transparent wafer 102. The non-transparent wafer 102 as well as the singulated transparent substrates 66 can be placed on a PDMS vacuum sealing chuck 70, which serves as a support surface. In some cases, a separate carrier wafer, which is placed on the vacuum sealing chuck 70, serves as the support surface.

Figure 8B:
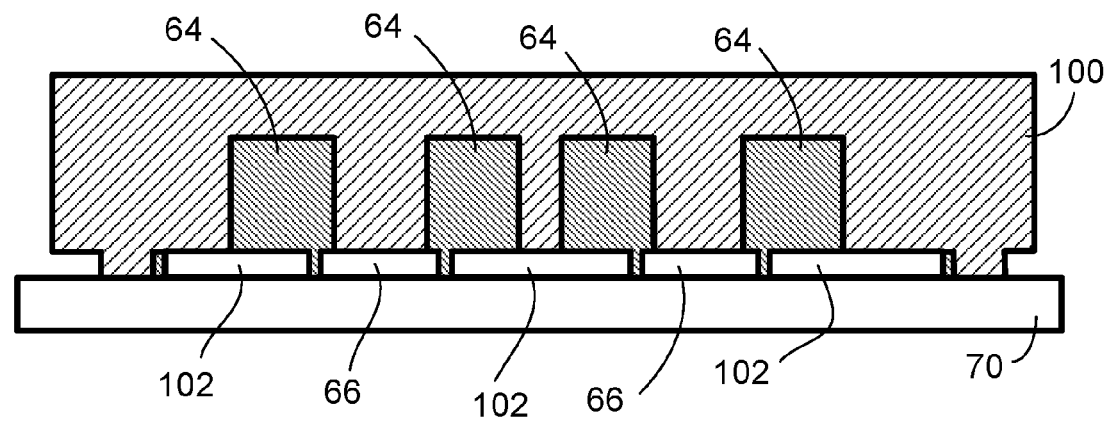

Next, a vacuum injection tool 100 having spacer sections 60 is used to form a wafer-scale spacer structure (see FIG. 8B). In particular, spacer elements 64 are formed by a vacuum injection technique that fills the spacer sections 60 with a non-transparent material. The vacuum injection process can be similar to the one described above in connection with FIGS. 3A-3B. Gaps 93 between the singulated transparent substrate 66 and adjacent portions of the non-transparent wafer 102 also are filled with the vacuum injected spacer material. Thus, sidewalls of the transparent substrates 66 are covered by, or embedded within, the vacuum injected spacer material (e.g., epoxy with carbon black), which is surrounded by the material (e.g., FR4) of the non-transparent wafer 102. Upon removal of the replication and vacuum injection tool 100, the result is a wafer-scale spacer structure 104 that includes non-transparent spacers 64 on a substantially planar supporting structure 101 that is composed of the transparent substrates 66, sections of the non-transparent wafer 102, and portions of the non-transparent spacer material (e.g., epoxy with carbon black) on the sidewalls of the transparent substrates 66 (see FIG. 8C). In contrast to the previous examples (i.e., FIGS. 3A-3E and FIGS. 7A-7E), the optical elements (e.g., lenses) are not formed by the same tool that is used to form the vacuum injected spacers 64. Instead, the optical elements are formed in a different process step.

Figure 8C:
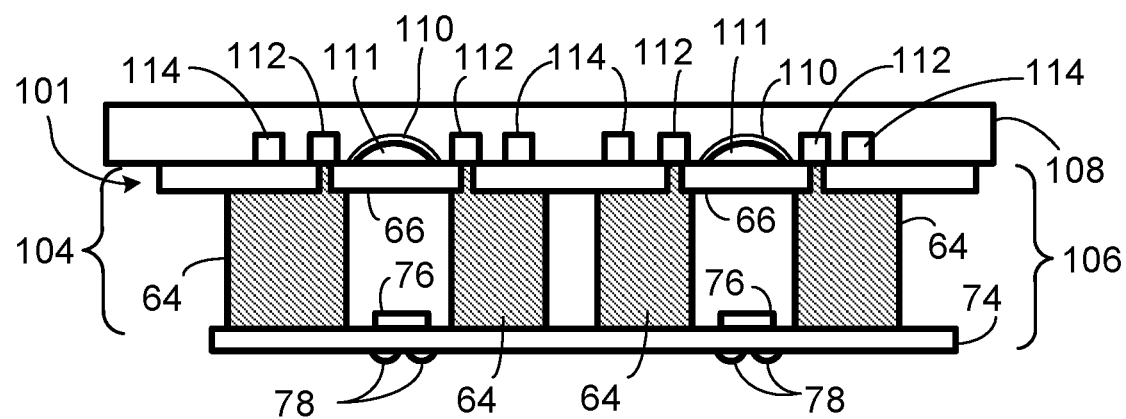
Figure 8D:
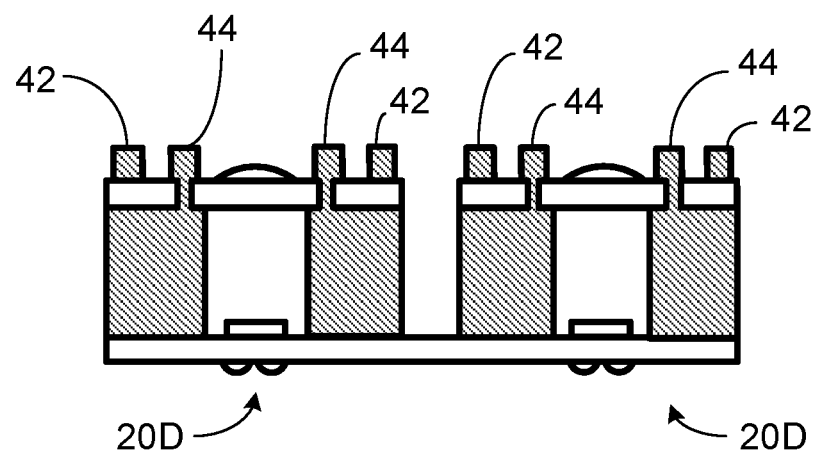

As shown in FIG. 8C, spacer structure 104 can be attached to a PCB or other substrate 74 on which are mounted multiple optoelectronic devices 76. As described in connection with the previous example, substrate 74 can be attached, for example, using a thermally stable adhesive, to spacer elements 64 on the spacer structure 104. The result is a stack 106 that includes an array of optoelectronic devices 76 surrounded laterally by non-transparent spacers elements 64.

As also shown in FIG. 8C, a combined replication and vacuum injection tool 108 is provided above the planar supporting structure 101 on the side opposite the spacer elements 64. Replication and vacuum injection tool 108 includes optical element replication sections 110 for forming replicated lens elements 111 on the object-side surface of the transparent substrates 66. Replication and vacuum injection tool 108 further includes baffle sections 112 and alignment sections 114 for forming, respectively, baffle and alignment features (e.g., features 42 and 44 in FIG. 2H).

To form the replicated lens elements 111, a replication material (e.g., a liquid, viscous or plastically deformable material) is placed onto the optical replication sections 110 of the replication tool 108, and the replication sections 110 are brought into contact with the singulated transparent substrates 66 so that the replication material is pressed between the upper surfaces of the singulated transparent substrates 66 and the optical replication sections 110. The replication material then is hardened (e.g., by UV or thermal curing) to form replicated lenses on the object-side surface of the singulated transparent substrates 66.

In addition, a vacuum injection material (e.g., a liquid, viscous or plastically deformable material) is injected so as to substantially fill baffle sections 112 and alignment sections 114 of the tool 108. Although the replication material that is used to form the lenses 111 is transparent (at least to wavelengths of light that are to be emitted by or that are detectable by the optoelectronic device), the vacuum injection material that fills the baffle sections 112 and alignment sections 114 preferably is non-transparent and can be composed, for example, of a polymer such as epoxy with carbon black. In general, however, using a first vacuum injection tool 100 to form the spacers 64 and using a second vacuum injection tool 108 to form the baffle and alignment features allows the material that fills the baffle sections 112 and alignment sections 114 to be the same as or different from the material that forms the spacer sections 64. The vacuum injection material for the baffle and alignment features then is hardened (e.g., by UV or thermal curing). Upon removal of the replication and vacuum injection tool 108, the result is a stack that includes optical elements (e.g., lenses), as well as baffle and alignment features, on its exterior surface.

The stack then can be separated along dicing lines to form individual modules 20D each of which includes an optoelectronic device aligned with an optical element attached to an object-side surface of the transparent cover, whose exterior sidewalls are covered with, or embedded within, a first non-transparent material (e.g., epoxy with carbon black) that is surrounded by a second non-transparent material (e.g., a glass-reinforced epoxy laminate material such as FR4). Each module 20D also includes vacuum injected baffle features 44 and alignment features 42 (see FIG. 8D). Thus, the foregoing technique can be used to fabricate multiple optoelectronic modules 20D on a wafer-level scale.

As described above in connection with FIG. 8C, in some cases, a combined replication and vacuum injection tool 108 is used to replicate lenses on the transparent substrates 66 and to form baffle features 44 and alignment features 42. In other implementations, instead of replicating the lenses directly on the transparent substrates 66, a previously-formed optical stack including one or more optical elements (e.g., lenses) can be attached over each transparent substrate 66.

The foregoing example provides a module that includes an optical element (e.g., a lens) 30 on the object-side surface of the transparent cover 26. The method described next in connection with FIGS. 9A-9D provides a wafer-level technique for fabricating optoelectronic modules, like the module 20C of FIG. 2G, that have an optical element (e.g., a lens) on the surface of the transparent cover 26 facing the light emitting element 22 (i.e., the sensor-side of the transparent cover). The method of FIGS. 9A-9D also provides for vacuum injected baffle features and alignment features similar to those in the previous example.

Figure 9A:
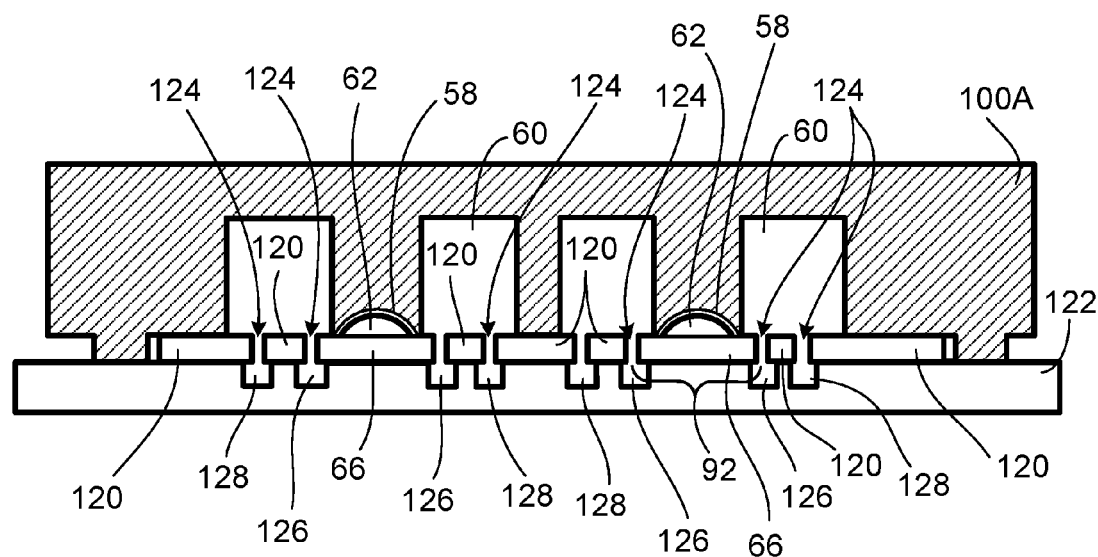
FIGS. 9A-9D illustrate steps in another method of fabricating optoelectronic modules using singulated transparent substrates.
Figure 9B:
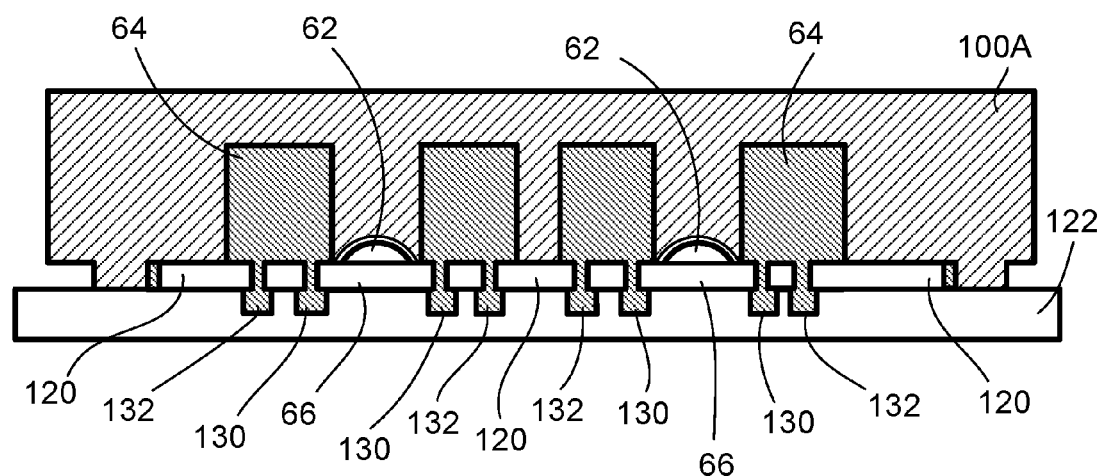

As shown in FIG. 9A, singulated transparent substrates 66 for the optical elements are placed within respective openings (e.g., cavities) 92 of a relatively sturdy non-transparent wafer 120, which can be composed, for example, of a PCB material such as FR4 or other glass-reinforced epoxy laminate material. In this case too, each opening 92 preferably is slightly larger than the diameter (or width) of the singulated transparent substrate 66 that is placed within the opening. In addition to the openings 92 for the singulated transparent substrates 66, the non-transparent wafer 120 has small vertical gaps 124 through its width forming channels that are aligned with openings defining baffle sections 126 and alignment sections 128 on the PDMS vacuum sealing chuck 122, which serves as a support surface.

Next, replicated optical elements 62 (e.g., lenses) are formed on the surface of the singulated transparent substrates 66 using a combined replication and vacuum injection tool 100A (see FIG. B) in a manner similar to the technique described above in connection with FIGS. 3A-3B. In addition, non-transparent spacer elements 64 are formed by a vacuum injection technique in a manner similar to the one described above in connection with FIGS. 3A-3B. At the same time, gaps 124, as well as baffle sections 126 and alignment sections 128 in the vacuum sealing chuck 122, also are filled with the vacuum injected spacer material (e.g., epoxy with carbon black). Thus, a single vacuum injection step can be used to form the spacer elements 64 on one side of non-transparent wafer 120, as well as baffle features 130 and alignment features 132 on the other side of non-transparent wafer 120. The same tool 100A can be used for both the vacuum injection of these features as well as replication of the optical elements 62. The steps illustrated by FIGS. 9A-9B also result in sidewalls of the transparent substrates 66 being covered by, or embedded within, the vacuum injected spacer material (e.g., epoxy with carbon black), which is surrounded by the material (e.g., FR4) of the non-transparent wafer 120. The vacuum injected spacer material (e.g., epoxy with carbon black) that is on the sidewalls of a particular transparent substrate 66 thus forms a single contiguous region with a spacer element 64 and with a baffle feature 130 and alignment feature 132. Upon removal of the replication and vacuum injection tool 100A, the result is a wafer-scale spacer/optics structure 134 (FIG. C).

Figure 9C:
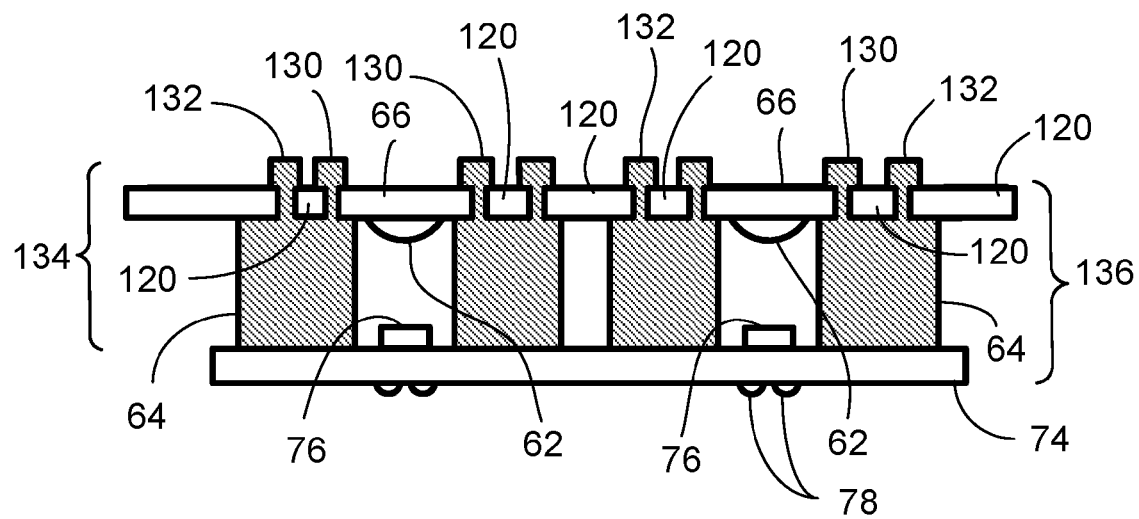
Figure 9D:
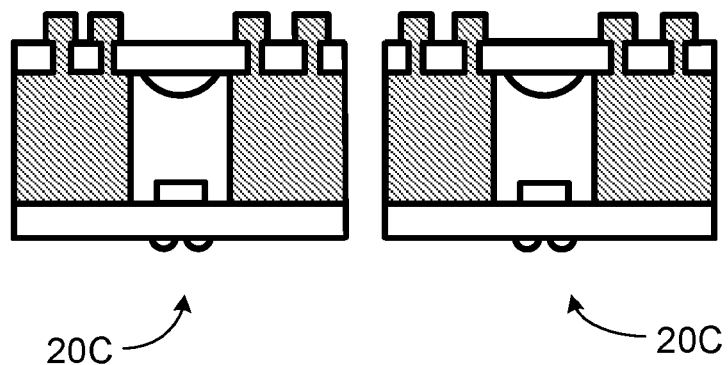

Next, spacer/optics structure 134 is attached to a PCB or other substrate 74 on which are mounted multiple optoelectronic devices 76 (see FIG. 9C). As described in connection with the previous example, substrate 74 can be attached, for example, using a thermally stable adhesive, to spacer elements 64 on the spacer/optics structure 134. The result is a stack 136 that includes an array of optoelectronic devices 76, each of which is aligned with a respective one of the optical elements (e.g., lenses) 62.

The stack 136 then can be separated along dicing lines to form individual optoelectronic modules 20C each of which includes an optoelectronic device aligned with an optical element attached to a transparent cover, whose exterior sidewalls are covered with, or embedded within, a first non-transparent material (e.g., epoxy with carbon black) that is surrounded by a second non-transparent material (e.g., a glass-reinforced epoxy laminate material such as FR4). Thus, the foregoing technique can be used to fabricate multiple optoelectronic modules 20C on a wafer-level scale (see FIGS. 9E and 2G).

In the illustrated examples of FIGS. 7A-7E and 9A-9D, optical elements (e.g., lenses) are provided only in the sensor-side of the modules. However, those processes can be modified to integrate formation of optical elements on the object-side of the modules as well. For example, after performing the steps illustrated by FIGS. 7A-7D, a second optical element (e.g., lens) 62A can be formed on the upper side of each transparent substrates 66 (see FIG. 10A). The second optical elements 62A can be formed either prior to or after the PCB substrate 74 (with the optoelectronic devices 76 mounted thereon) is attached to the spacer elements 64. Furthermore, the second optical elements 62A can be formed, for example, by a replication technique. The result is a stack 140 that includes an array of optoelectronic devices 76 each of which is surrounded laterally by a non-transparent spacer 64 and is aligned with a pair of optical elements 62, 62A, one on either surface of the transparent substrates 66.

The stack 140 then can be separated along dicing lines to form individual optoelectronic modules 20F (see FIG. 10B) each of which includes an optoelectronic device aligned with a pair of vertically stacked optical elements attached to the transparent cover, whose exterior sidewalls are covered with, or embedded within, a first non-transparent material (e.g., epoxy with carbon black) that is surrounded by a second non-transparent material (e.g., a glass-reinforced epoxy laminate material such as FR4). Thus, the foregoing technique can be used to fabricate multiple optoelectronic modules 20F on a wafer-level scale.

Figure 11A:
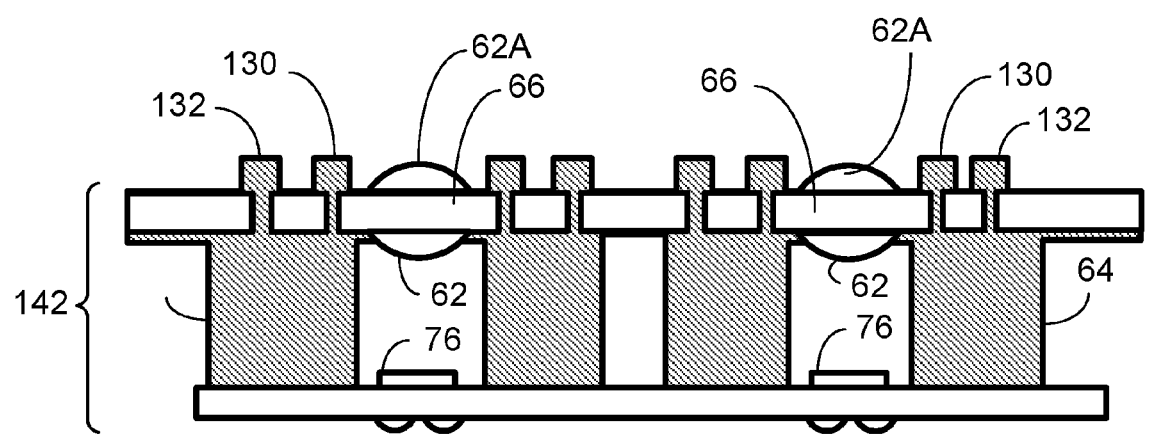
FIGS. 11A-11B illustrate steps in yet a further method of fabricating optoelectronic modules using singulated transparent substrates.

A second group of replicated optical elements (e.g., lenses) also can be provided as part of the process of FIGS. 9A-9D. For example, after performing the steps illustrated by FIGS. 9A-9C, a second optical element (e.g., lens) 62A can be formed by replication on the upper side of each transparent substrate 66 (see FIG. 11A). The second optical elements 62A can be formed either prior to or after the PCB substrate 74 (with the optoelectronic devices 76 mounted thereon) is attached to the spacer elements 64. The result is a stack 142 that includes an array of optoelectronic devices 76 each of which is surrounded laterally by a non-transparent spacer 64 and is aligned with a pair of optical elements 62, 62A, one on either surface of the transparent substrate 66.

Figure 11B:
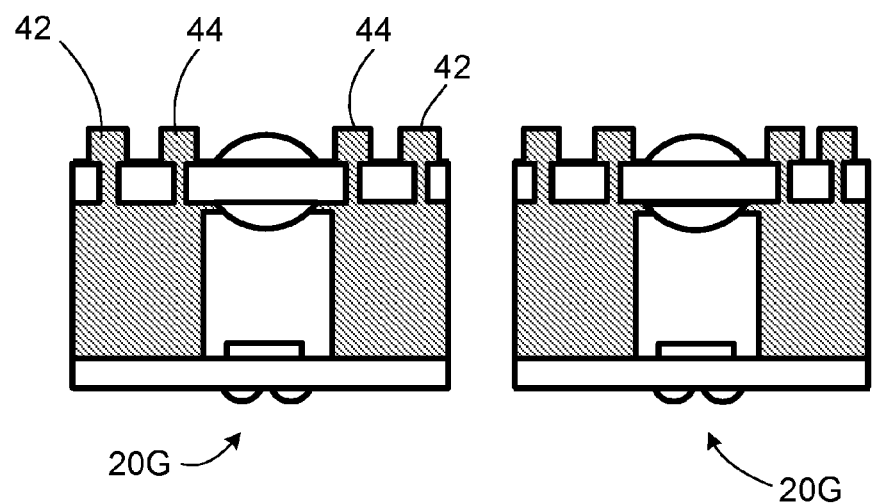

The stack 142 then can be separated along dicing lines to form individual optoelectronic modules 20G (see FIG. 11B) each of which includes an optoelectronic device aligned with a pair of vertically stacked optical elements attached to the transparent cover, whose exterior sidewalls are covered with, or embedded within, a first non-transparent material (e.g., epoxy with carbon black) that is surrounded by a second non-transparent material (e.g., a glass-reinforced epoxy laminate material such as FR4). In this example, each module 20G also includes baffle and alignment features 42, 44. Thus, the foregoing technique can be used to fabricate multiple optoelectronic modules 20G on a wafer-level scale.

As described above in connection with the example of FIGS. 8A-8D, it is possible to form the baffle and alignment features with a non-transparent material that is different from the material that forms the spacers. FIGS. 12A-12E illustrate another example that allows the non-transparent material for the baffle and alignment features to be different from (or the same as) the material that forms the spacers. Using different materials may be desirable, for example, to allow various non-transparent parts of the modules to have different transparencies.

Figure 12A:
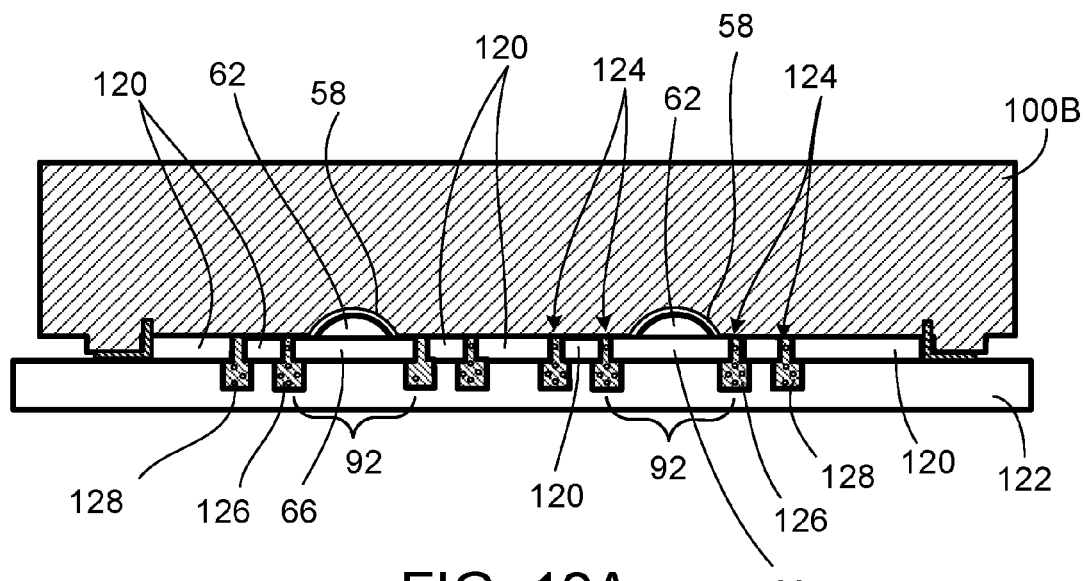
FIGS. 12A-12D illustrate steps in yet a further method of fabricating optoelectronic modules using singulated transparent substrates.

As shown in FIG. 12A, singulated transparent substrates 66 for the optical elements are placed within respective openings (e.g., cavities) 92 of a relatively sturdy non-transparent wafer 120, which can be composed, for example, of a printed circuit board (PCB) material such as FR4 or other glass-reinforced epoxy laminate material. Each opening 92 preferably is slightly larger than the diameter (or width) of the singulated transparent substrate 66 that is placed within the opening. In addition to the openings 92 for the singulated transparent substrates 66, the non-transparent wafer 120 has small vertical gaps 124 through its width forming channels that are aligned with baffle sections 126 and alignment sections 128 on the PDMS vacuum sealing chuck 122, which serves as a support surface.

Next, replicated optical elements 62 (e.g., lenses) are formed on the surface of the singulated transparent substrates 66 using a combined replication and vacuum injection tool 100B (see FIG. 12B) that includes optical element replication sections 58. Also, gaps 124, as well as baffle sections 126 and alignment sections 128 in the vacuum sealing chuck 122, are filled with a non-transparent vacuum injected material (e.g., epoxy with carbon black) while the tool 100B remains in place. The same tool 100B thus can be used for both the vacuum injection of these features as well as replication of the optical elements 62. The steps illustrated by FIG. 12A result in sidewalls of the transparent substrates 66 being covered by, or embedded within, the non-transparent vacuum injected material (e.g., epoxy with carbon black), which is surrounded by the material (e.g., FR4) of the non-transparent wafer 120. The vacuum injected material (e.g., epoxy with carbon black) that is on the sidewalls of a particular transparent substrate 66 thus forms a single contiguous region with a baffle feature 130 and alignment feature 132 (see FIG. 12B).

Figure 12B:
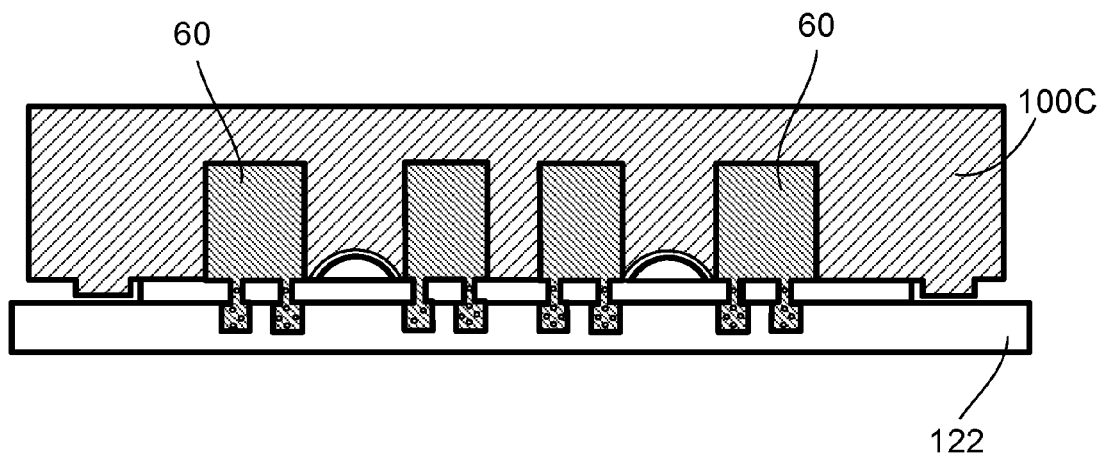

Next, the replication and vacuum injection tool 100B is removed, and as shown in FIG. 12B, a second vacuum injection tool 100C is provided to form the spacer elements 64. The second vacuum injection tool 100C includes spacer sections 60, which are filled by vacuum injection with a non-transparent material. As indicated above, the material for the spacers can be different from the material for the baffle and alignment features. After the spacer sections 60 are filled, the second vacuum injection tool 100C is removed from the resulting spacer/optics structure 148 (see FIG. 12C).

One difference between the process of FIGS. 9A-9C and FIGS. 8A-8C relates to the non-transparent material that fills the gaps 124 in the transparent wafer 120. In FIGS. 8A-8C, the gaps 124 are filled at the same time and with the same material as the spacer sections 60. On the other hand, in FIGS. 12A-12C, the gaps 124 are filled at the same time and with the same material as the baffle and alignment sections 126, 128. Thus, if different materials are used to form the spacers 64 and the baffle/alignment features 130, 132, the material in the gaps 124 will depend on the whether the process of FIGS. 8A-8C or the process of FIGS. 12A-12C is used.

Figure 12C:
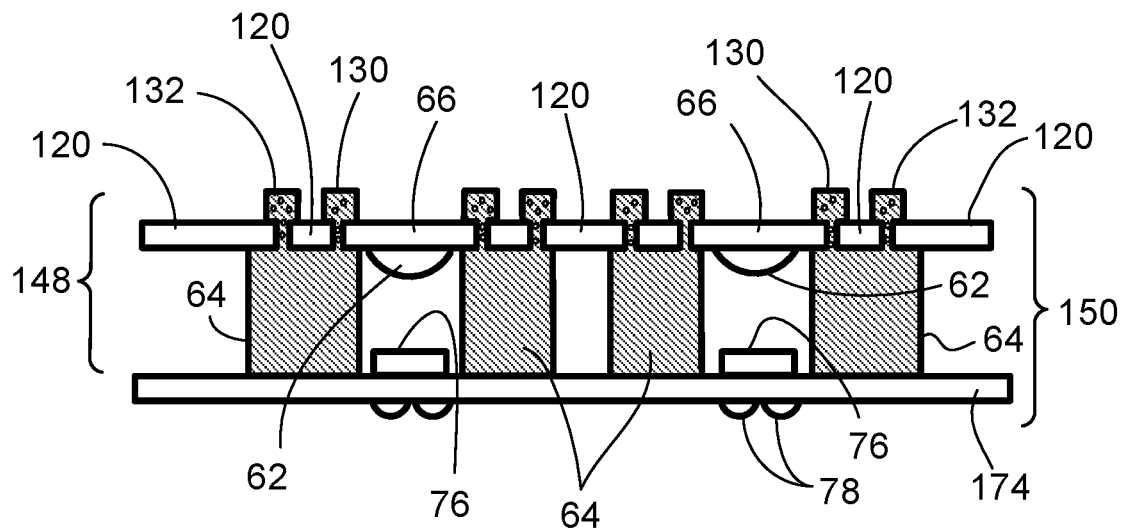
Figure 12D:
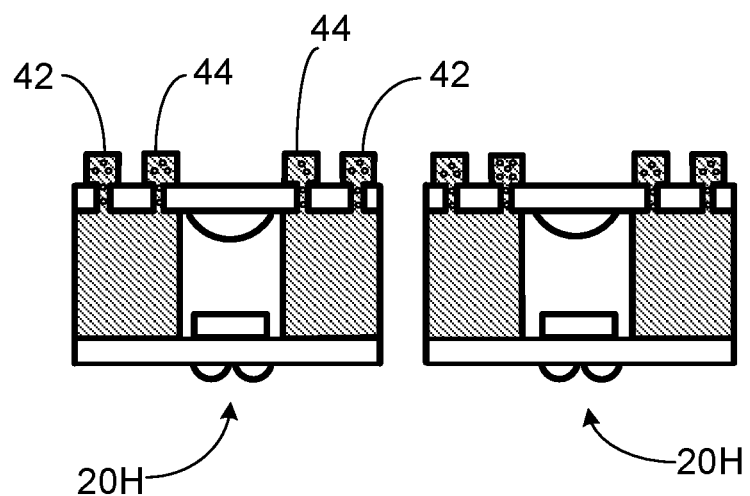

After removing the second tool 100C, spacer/optics structure 148 is attached to a printed circuit board (PCB) or other substrate 74 on which are mounted multiple optoelectronic devices 76 (see FIG. 12C). As described in connection with previous examples, substrate 74 can be attached, for example, using a thermally stable adhesive, to spacer elements 64 on the spacer/optics structure 148. The result is a stack 150 that includes an array of optoelectronic devices 76, each of which is aligned with a respective one of the optical elements (e.g., lenses) 62.

The stack 150 then can be separated along dicing lines to form individual optoelectronic modules 20H each of which includes an optoelectronic device aligned with an optical element attached to a transparent cover, whose exterior sidewalls are covered with, or embedded within, a first non-transparent material (e.g., epoxy with carbon black) that is surrounded by a second non-transparent material (e.g., a glass-reinforced epoxy laminate material such as FR4). Thus, the foregoing technique can be used to fabricate multiple optoelectronic modules 20H on a wafer-level scale.

Figure 13A:
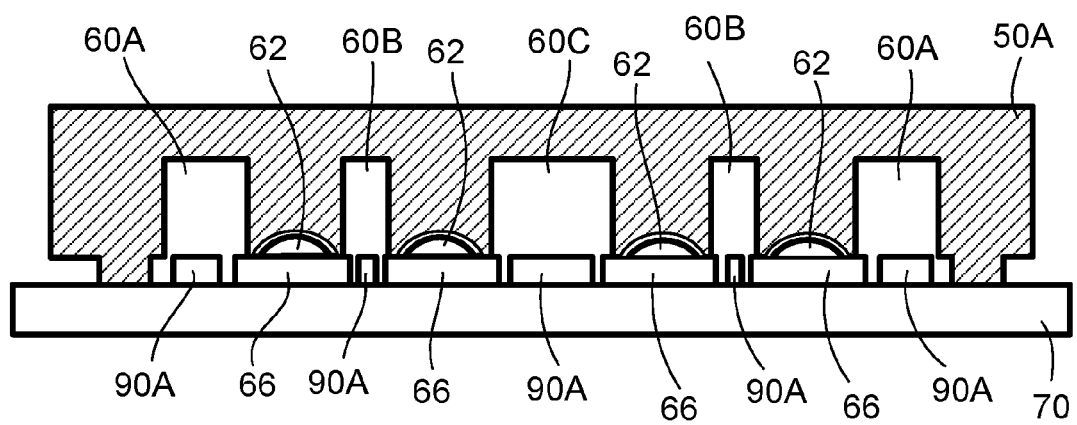
FIGS. 13A-13E illustrate steps for fabrication of proximity sensor modules that include both a light emitting element and a light detecting element in adjacent channels.
Figure 13B:
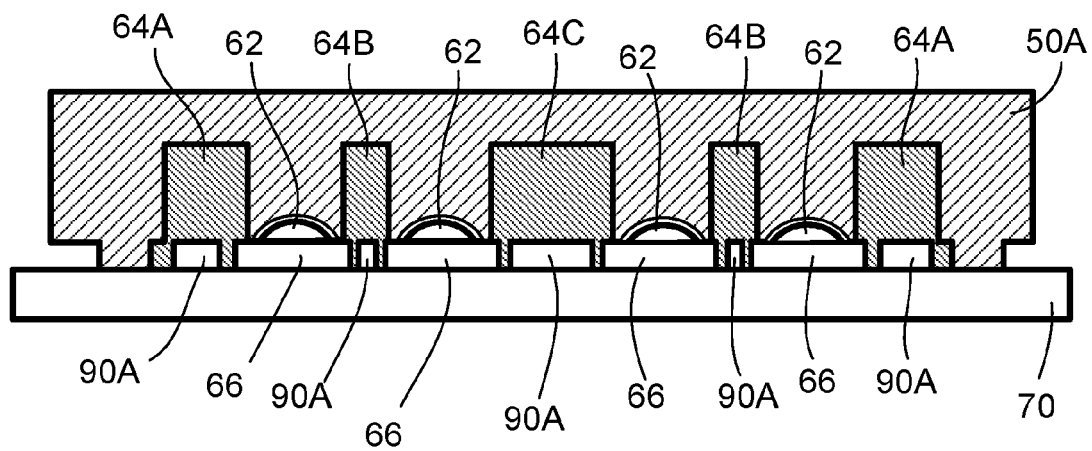
Figure 13C:
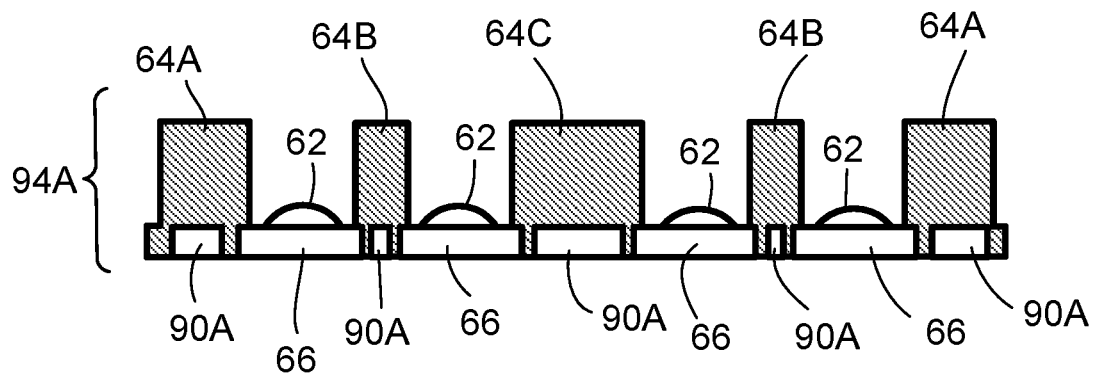

A wafer-level process, similar in some respects to the processes described above, can be used to fabricate modules that include both a light emitting element and a light detecting element. For example, as shown in FIG. 13A, singulated transparent substrates 66, on which the optical elements are to be formed, are placed within respective openings (e.g., cavities) of a relatively sturdy non-transparent wafer 90A that is on a PDMS vacuum chuck 70, which serves as a support surface. Replicated optical elements 62 (e.g., lenses) are formed on the surface of the singulated transparent substrates 66 using a combined replication and vacuum injection tool 50A. In addition, non-transparent spacer elements 64A, 64B, 64C are formed by vacuum injection using the combined replication and vacuum injection tool 50A (see FIGS. 13A-13B). At the same time, gaps 93 between the transparent substrates 66 and adjacent portions of the non-transparent wafer 90A are filled with the non-transparent vacuum injected material so that the sidewalls of the transparent substrates are covered by, or embedded within, the non-transparent material. FIGS. 13A-13B are similar to FIGS. 7A-7B, except that the spacer sections 60A, 60B and 60C in the tool 50A can sizes that differ from one another. In particular, as will become evident from the description below, each narrower spacer section 60B corresponds to a spacer element 64B formed between adjacent optical channels for a single module. The wider spacer section 60C corresponds to the spacer element 64C forming the walls for two adjacent modules. Upon removal of the replication and vacuum injection tool 50A, the result is a wafer-scale spacer/optics structure 94A that includes optical elements 62 and spacer elements 64A, 64B, 64C (FIG. 13C).

Figure 13D:
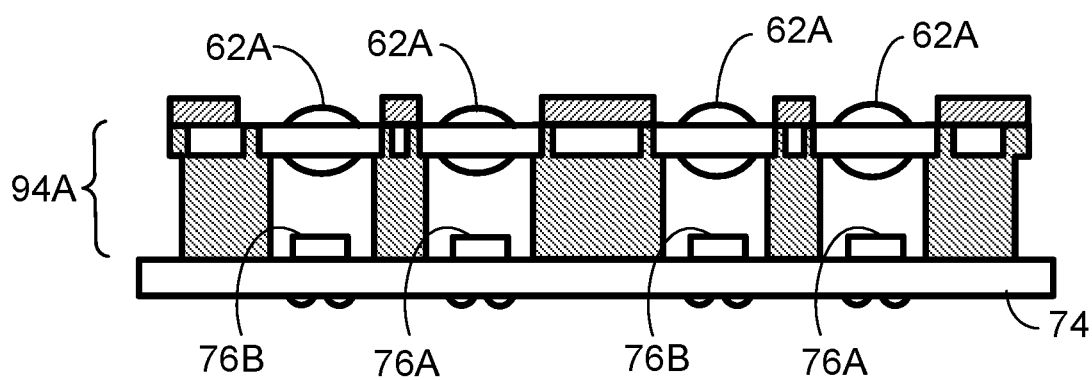
Figure 13E:
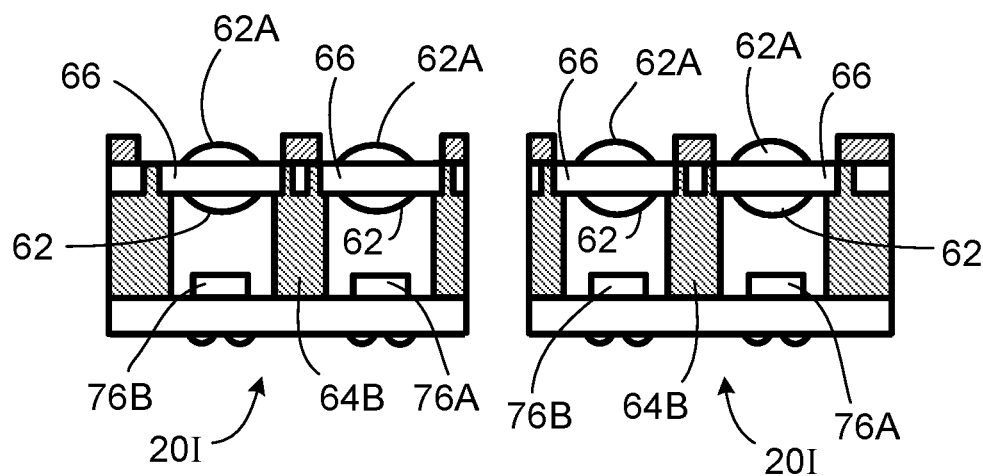

Next, as shown in FIG. 13D, in some implementations, a second group of optical elements (e.g., lenses) 62A can be formed by replication on the second side each transparent substrate 66. Also, in some implementations, a baffle wafer is attached on the opposite side of the transparent substrates 66 so as to provide a baffle on the object-side of the resulting modules. The spacer/optics structure 94A is attached to a PCB or other substrate 74 on which are mounted different types of optoelectronic devices 76A, 76B (e.g., light emitting elements 76A and light detecting elements 76B). The light emitting and detecting elements 76A, 76B alternate such that each light emitting element 76A is adjacent a light detecting element 76B. Alternatively, singulated light emitting and detecting devices can be attached to the spacer/optics structure 94A. The resulting structure can be separated (e.g., by dicing) into multiple modules 20I each of which includes adjacent optical channels, one of which includes a light emitting element 76A (e.g., a LED) and one of which includes a light detecting element 76B (e.g., a photodiode). The adjacent optical channels are separated from one another by a non-transparent spacer 64. Furthermore, the sidewalls of the transparent covers are embedded within a first non-transparent material (e.g., epoxy with carbon black) that is surrounded by a second non-transparent material (e.g., a glass-reinforced epoxy laminate material such as FR4). Such modules can be used, for example, as proximity sensors.

Figure 14A:
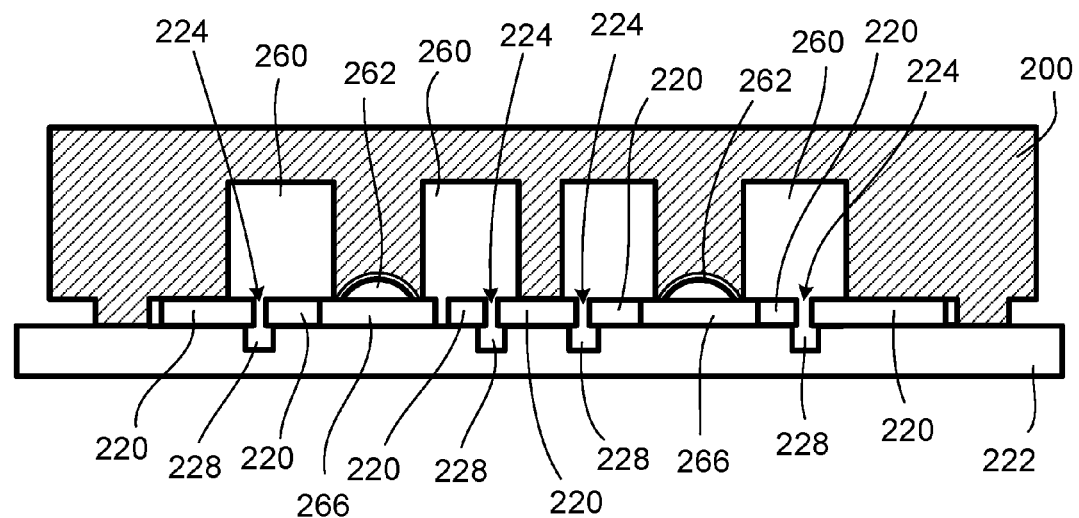
FIGS. 14A-14D illustrate steps in a method of fabricating optoelectronic modules using a wafer with transparent portions surrounded by non-transparent material.

In the foregoing examples, singulated transparent substrates 66 for the optical elements (e.g., lenses) are placed within openings (e.g., cavities) of a relatively sturdy non-transparent PCB wafer. In some implementations, instead of inserting pre-formed singulated transparent substrates into openings in a non-transparent wafer, the PCB-type wafer can be pre-formed with transparent sections that correspond to the transparent covers for the modules. For example, as shown in FIG. 14A, a relatively sturdy wafer 220, which can be composed, for example, of a non-transparent printed circuit board (PCB) material such as FR4 or other glass-reinforced epoxy laminate material, also includes transparent sections 266 that correspond to transparent covers for the modules. The wafer 220 has small vertical gaps 224 through its width forming channels that are aligned with features 228 (e.g., alignment or baffle sections) on the PDMS vacuum sealing chuck 222, which serves as a support surface.

Figure 14B:
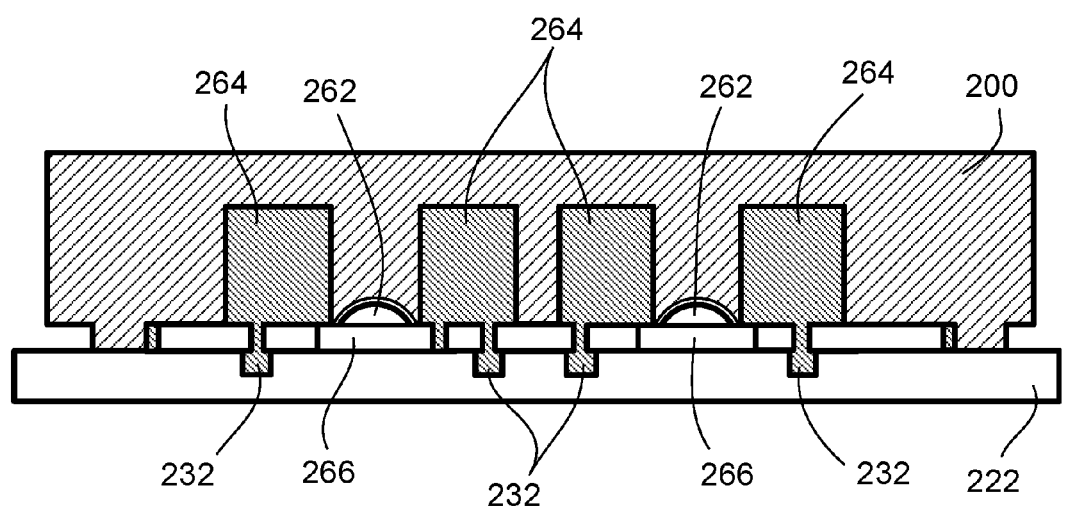
Figure 14C:
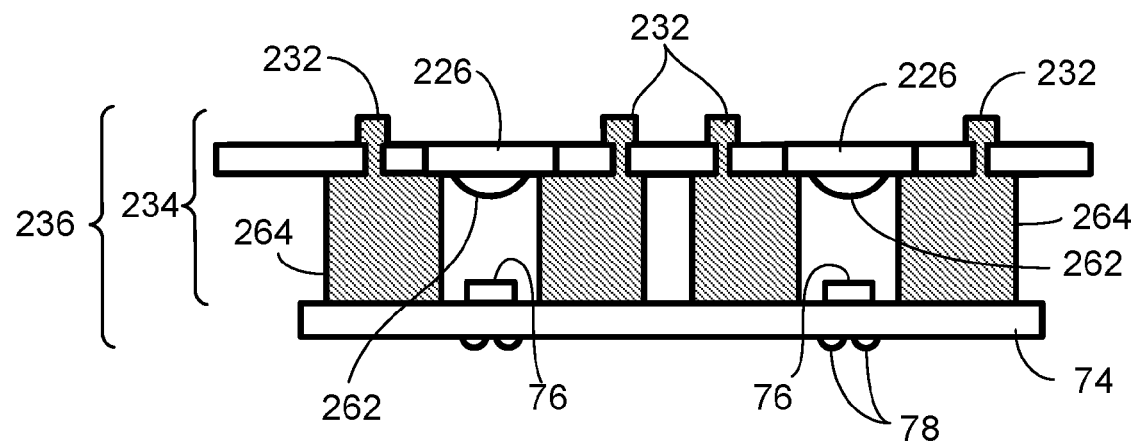

Next, replicated optical elements 262 (e.g., lenses) are formed on the surface of the transparent sections 266 using a combined replication and vacuum injection tool 200. In addition, as indicated by FIGS. 14A-14B, spacer sections 260 in the tool 200 are filled with a non-transparent material as described to form non-transparent spacer elements 264. At the same time, gaps 224, as well as alignment (and/or baffle) sections 228 in the vacuum sealing chuck 222, also are filled with the vacuum injected spacer material (e.g., epoxy with carbon black). Thus, a single vacuum injection step can be used to form the spacer elements 264 on one side of wafer 220, as well as alignment (and/or baffle) features 232 on the other side of wafer 220. Furthermore, the same tool 200 can be used for both the vacuum injection of these features as well as replication of the optical elements 262. As can be seen in FIGS. 14A-14B, the sides of the transparent sections 266 remain covered by, or embedded within, surrounding non-transparent sections (e.g., FR4) of the wafer 220. Upon removal of the replication and vacuum injection tool 200, the result is a wafer-scale spacer/optics structure 234 (FIG. 14C). In some implementations, instead of forming the spacer elements 264 by vacuum injection using the tool 200, the spacer elements 264 can be provided by attaching a spacer wafer to a structure that has the replicated lenses and the vacuum injected alignment (and/or baffle) features formed thereon.

Next, spacer/optics structure 234 is attached to a printed circuit board (PCB) or other substrate 74 on which are mounted multiple optoelectronic devices 76 (see FIG. 14C). As described in connection with the previous example, substrate 74 can be attached, for example, using a thermally stable adhesive, to spacer elements 64 on the spacer/optics structure 234. The result is a stack 236 that includes an array of optoelectronic devices 76, each of which is aligned with a respective one of the optical elements (e.g., lenses) 262.

Figure 14D:
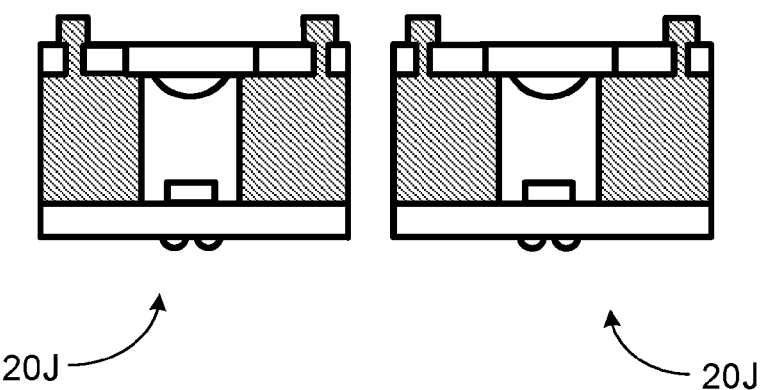

The stack 236 then can be separated along dicing lines to form individual optoelectronic modules 20I (FIG. 14D) each of which includes an optoelectronic device aligned with an optical element attached to a transparent cover, whose exterior sidewalls are covered with, or embedded within, a non-transparent material (e.g., a glass-reinforced epoxy laminate material such as FR4). Thus, the foregoing technique can be used to fabricate multiple optoelectronic modules 20J on a wafer-level scale.

In the foregoing examples, the fabrication methods include attaching a spacer/optics structure to a PCB or other substrate on which are mounted multiple optoelectronic devices. In other implementations, singulated optoelectronic devices can be attached to the spacer/optics structure instead of attaching a wafer-size substrate on which the optoelectronic devices are mounted.

Furthermore, although some of the foregoing examples include a single optoelectronic device (e.g., light emitting or light detecting element) in each module, techniques similar to the foregoing techniques can be used to fabricate modules that include two or more light emitting elements, each of which is aligned with one or more respective optical elements. Such modules, which can include non-transparent sidewalls surrounding two or more light emitting elements without a spacer separating the light emitting elements from one another, can serve, for example, as dual LED flash modules. In some implementations, the modules also may include other optoelectronic or optical components.

In some of the foregoing examples, during the fabrication process, each singulated transparent substrate 66 spans across the region for a single optical channel. However, in some implementations, it can be advantageous to use somewhat larger singulated transparent substrates that span, for example, across two optical channels. Using such wider singulated transparent substrates can, in some cases, increase stability during fabrication. Also, the wider singulated transparent substrates may be easier, in some instances, to position using pick-and-place equipment. A process for fabricating optoelectronic modules using singulated transparent substrates that span multiple (e.g., two) optical channels is described below in connection with FIGS. 15A-15F. Each of the resulting modules can include, for example, two optoelectronic devices (e.g., a light emitting device and a light detecting device).

Figure 15A:
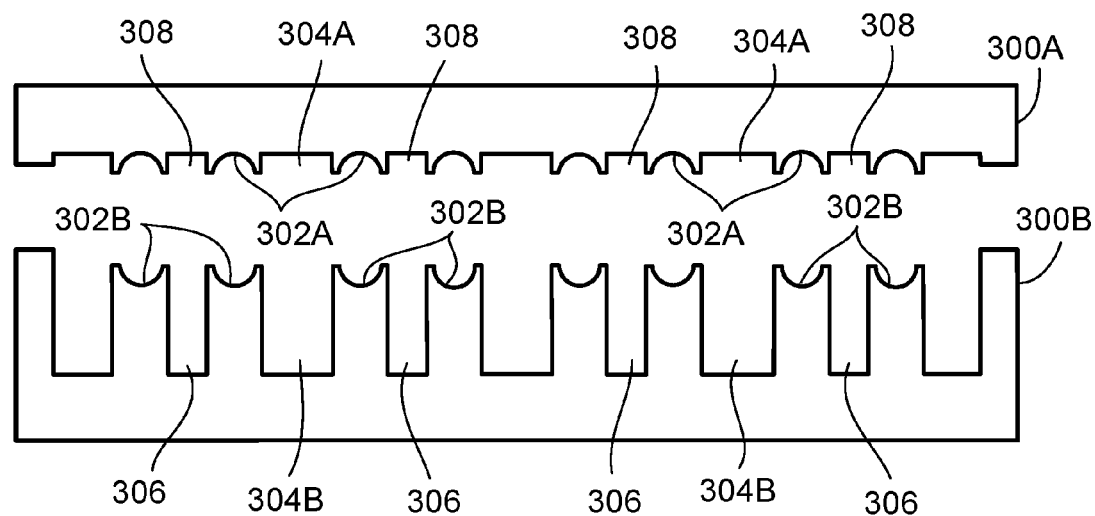
FIGS. 15A-15F illustrate steps in accordance with another method of fabricating optoelectronic modules using transmissive substrates that span across multiple optoelectronic devices.

FIGS. 15A-15E illustrate steps for forming passive optical elements (e.g., lenses) on transmissive substrates, as well as forming spacer features, baffle features and wall features. As shown in FIG. 15A, these features can be formed using upper and lower PDMS tools 300A, 300B that facilitate formation of the passive optical elements by replicating them onto transmissive substrates, and formation of the spacer, baffle and wall features by a vacuum injection technique. The upper tool 300A includes replication features 302A that correspond to the passive optical elements (e.g., lenses) that are to be formed on the upper surface of transmissive substrates. Likewise, the lower tool 300B includes replication features 302B that correspond to the passive optical elements (e.g., lenses) that are to be formed on the lower surface of the transmissive substrates.

The upper and lower tools 300A, 300B also include respective spaces 304A, 304B that correspond to regions for the wall features of the modules. Further, the lower tool 300B includes spaces 306 that correspond to regions for the spacer features of the modules. The upper tool 100A includes spaces 308 that correspond to regions for the baffle features of the modules.

To form the lens elements, a curable epoxy 310 is dispensed on the replication features 302A of the upper tool 300A, as well as on the replication features 302B of the lower tool 300B. See FIG. 15B. Also, as shown in FIG. 15C, a singulated transmissive substrate 312 is placed over each region of curable epoxy 310 on the lower tool 300A. Each singulated transmissive substrate 312 spans across two adjacent regions of epoxy 310 that are separated by one of the spaces 306. As before, the substrates 312 can be composed, for example, of glass, sapphire or a polymer) that is transparent to the particular wavelength(s) of interest.

Figure 15B:
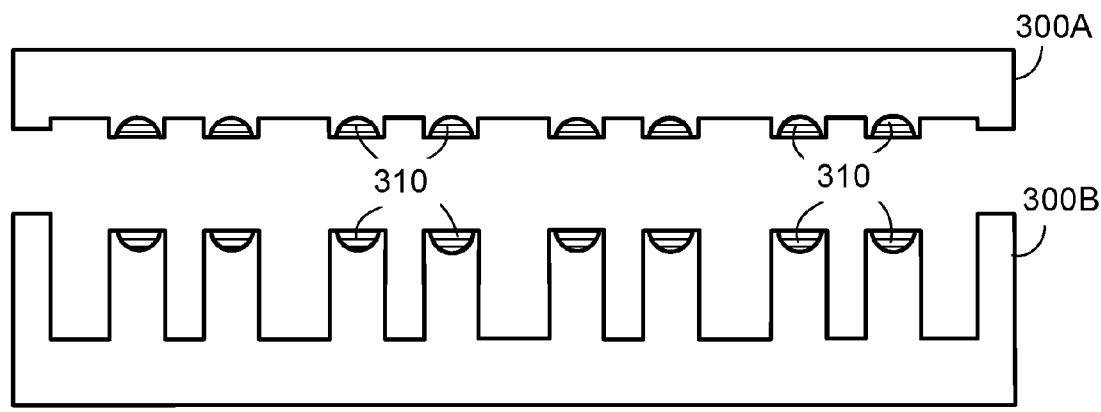
Figure 15C:
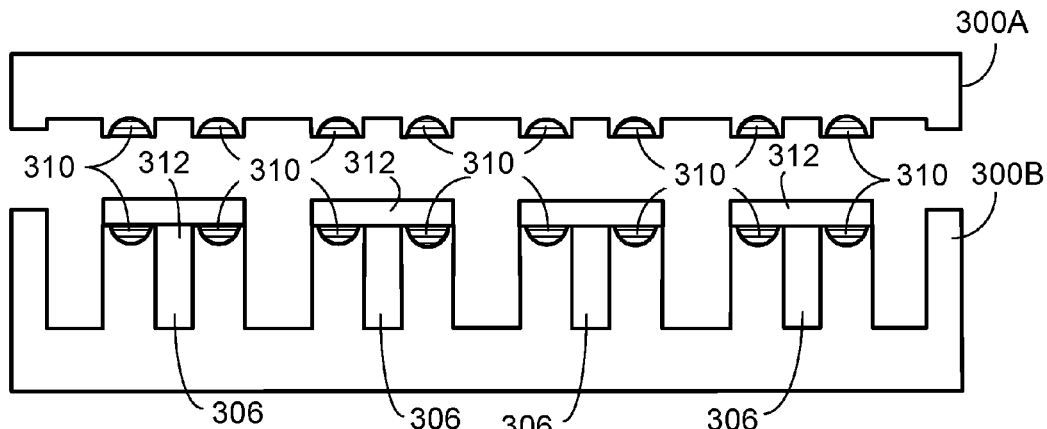
Figure 15D:
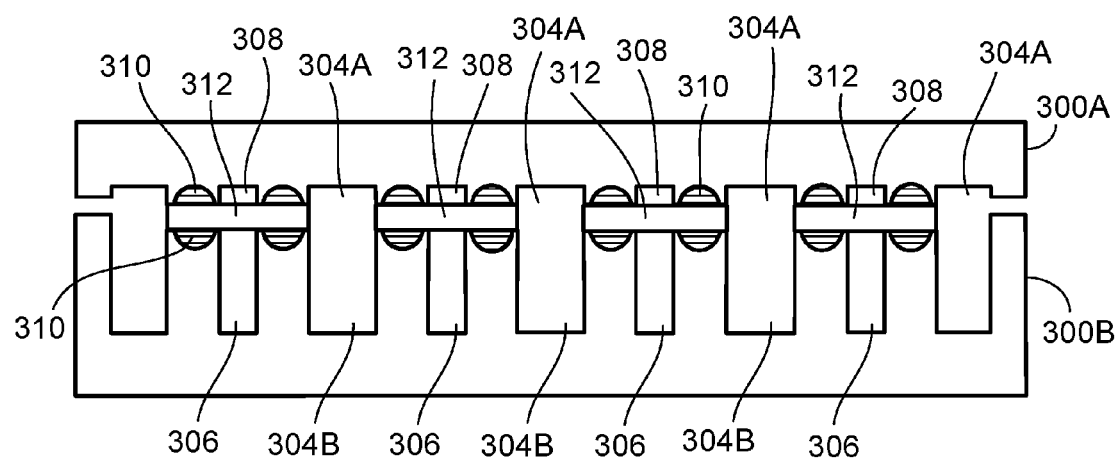
Figure 15E:
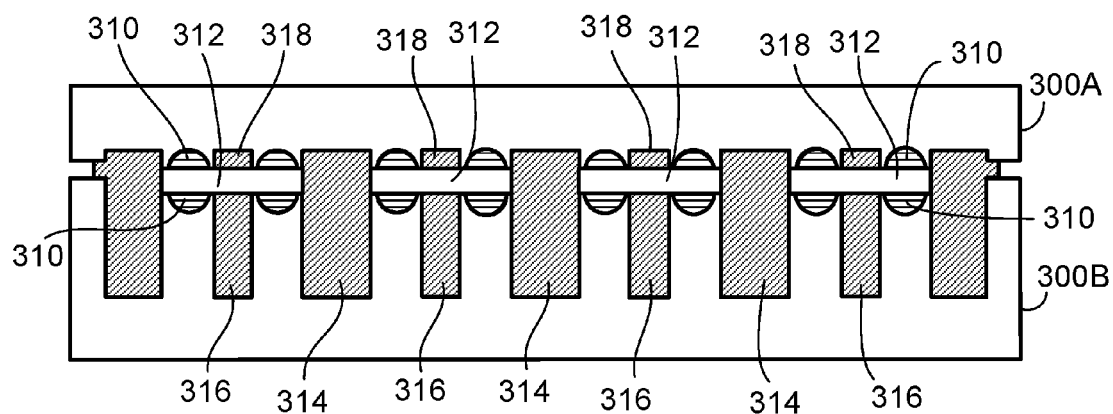

Next, as illustrated in FIG. 15D, the upper and lower tools 300A, 300B are aligned with one another and brought into contact so that the epoxy material 310 on the replication features 302A of the upper tool 100A comes into contact with the top surfaces of the respective transmissive substrates 312. The epoxy material 310 for the lenses then is hardened, for example, by UV or thermal curing. When subsequently cured, the epoxy material 310 should be transparent (at least to wavelengths of light that are to be emitted from or detected by the module).

Figure 15F:
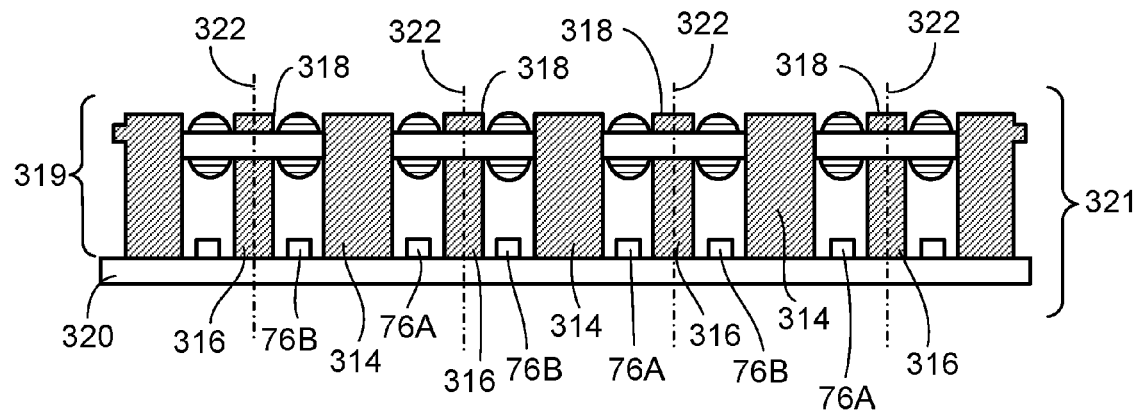

Next, a non-transparent curable material is provided by vacuum injection in the spaces 304A, 304B, 306, 308 between the tools 300A, 300B, such that the spaces are filled with the non-transparent material. The non-transparent material can be composed, for example, of a flowable polymer material (e.g., epoxy, acrylate, polyurethane, or silicone) containing a non-transparent filler (e.g., carbon black, a pigment, an inorganic filler, or a dye). See FIG. 15E. The non-transparent material subsequently is hardened (e.g., by UV or thermal curing). The hardened non-transparent material forms wall features 314, baffle features 318 and spacer features 316. The tools 300A, 300B then can be removed. The resulting structure 319 (comprising the transmissive substrates 312, the lenses 310, the spacer features 316, the baffle features 318 and the wall features 314) can be attached to a substrate wafer 320 on which are mounted optoelectronic devices (i.e., light emitting devices 76A and light detecting devices 76B), as shown in FIG. 15F. The substrate wafer 320 can be, for example, of a PCB wafer. The resulting stack 321 can be separated (e.g., by dicing) along lines 322 into multiple modules, each of which includes a light emitting device 76A and a light detecting device 76B in respective optical channels.

Figure 16:
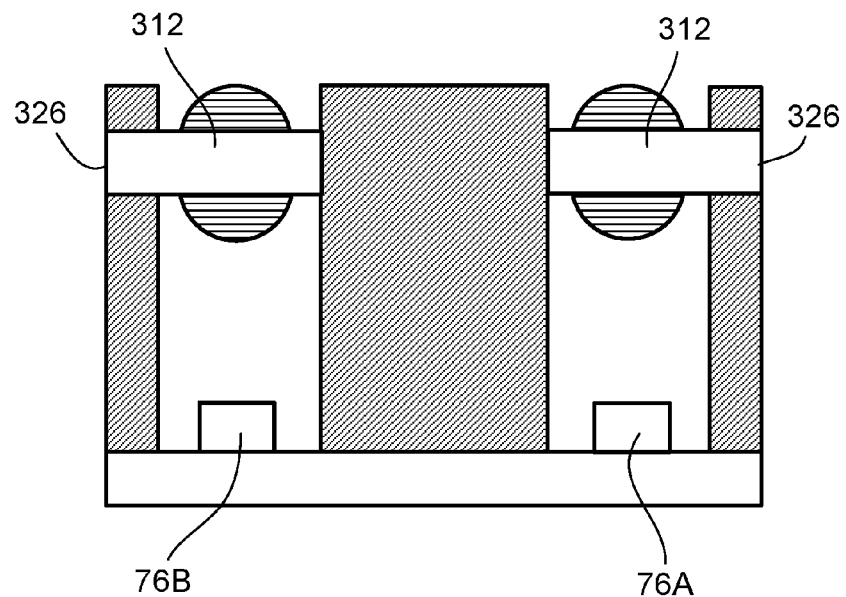
FIG. 16 is an example of a module obtained by the process of FIGS. 15A-15F.

If dicing is performed as shown in FIG. 15F, the exterior sidewalls 326 of the transparent covers 312 of the resulting modules will not be covered with a non-transparent material (see FIG. 16), which could allow light leakage from the module and/or stray light into the module to occur in some cases. A technique for providing a non-transparent material over the exterior sidewalls of the modules is described below in connection with FIGS. 15 and 16.

In some implementations, the structure 319 of FIG. 15F can be diced prior to attachment to the substrate wafer 320.

Also, in some implementations, instead of attaching the structure 319 to a substrate wafer 320 on which are mounted multiple light emitting and light detecting devices 76A, 76B, singulated optoelectronic devices 76A, 76B can be attached to the structure 319. The foregoing methods can enable testing of the optical and/or optoelectronic components prior to assembly (i.e., prior to attachment of the support on which the devices 76A, 76B are mounted to the structure 319).

The process of FIGS. 15A-15F, including the use of upper and bottom tools 300A, 300B, also can be employed for situations in which each transparent substrate spans across the region for only a single channel.

Figure 17A:
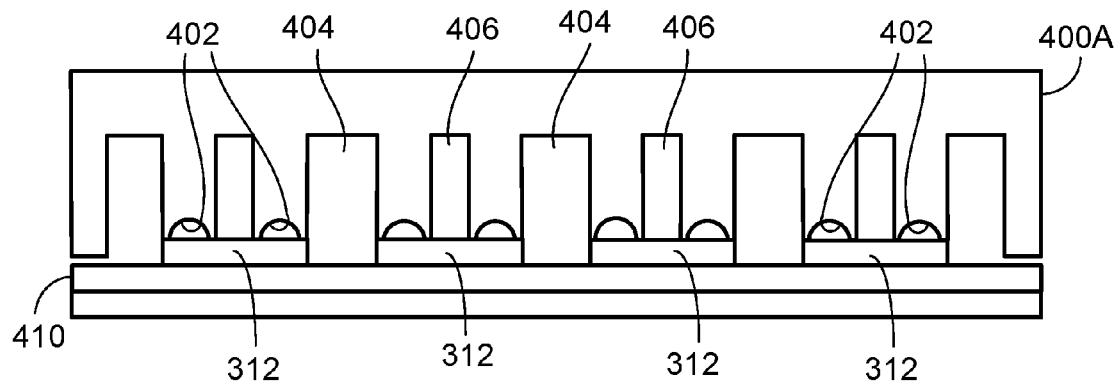
FIGS. 17A-17F illustrate steps in accordance with yet another method of fabricating optoelectronic modules using transmissive substrates that span across multiple optoelectronic devices.
Figure 17B:
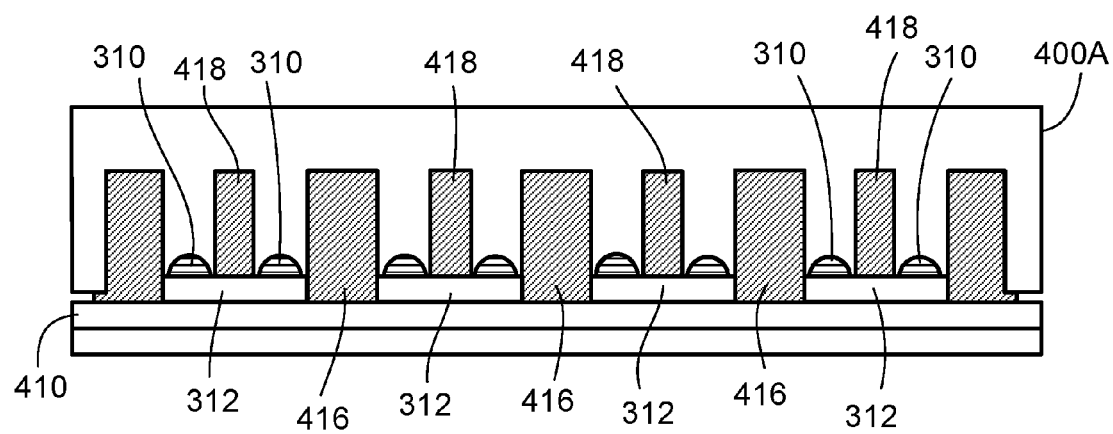
Figure 17C:
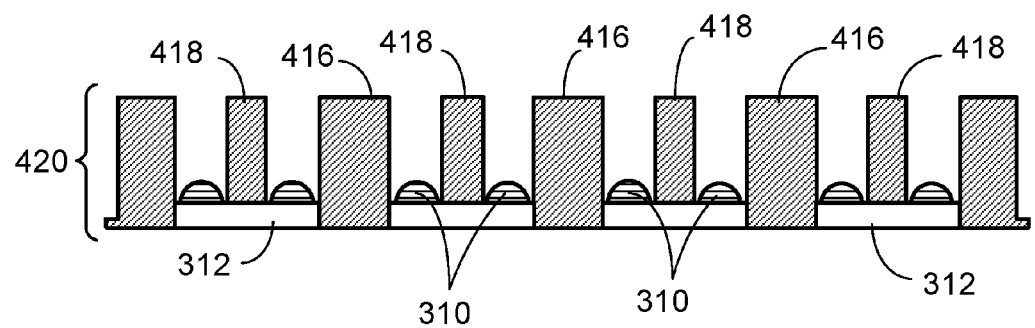

FIGS. 17A-17F illustrate another fabrication technique for obtaining a stack similar to the stack 321 of FIG. 15F. In this case, as shown in FIG. 16A, multiple singulated transmissive substrates 312 are mounted on a sacrificial substrate 410. As before, the transmissive substrates 312 can be composed, for example, of glass, sapphire or a polymer that is transparent to the wavelength(s) of interest (i.e., the wavelength(s) of light emitted by the light emitting devices 76A and detectable by the light detecting devices 76B). A combined replication and vacuum injection tool 400A is provided, and a curable epoxy material is dispensed on the replication features 402 of the tool, which then is brought into contact with the exposed surfaces of the transmissive substrates 312 to form replicated lens elements 310 as shown in FIG. 17B. The epoxy material then is hardened, for example, by thermal or UV curing. Also, spaces 404 between the tool 400A and the sacrificial substrate 410, as well as spaces 406 between the tool 400A and the transmissive substrates 312, are filled with a non-transparent material such as a flowable polymer material (e.g., epoxy, acrylate, polyurethane, or silicone) containing a non-transparent filler (e.g., carbon black, a pigment, an inorganic filler, or a dye). See FIG. 17B. The non-transparent material subsequently can be hardened (e.g., by UV or thermal curing) to form wall features 416 and spacer features 418. The tool 400A and the sacrificial substrate 410 then are removed. The resulting structure 420 ((comprising the transmissive substrates 312, the lenses 310, the spacer features 418 and the wall features 416) is illustrated in FIG. 17C.

Figure 17D:
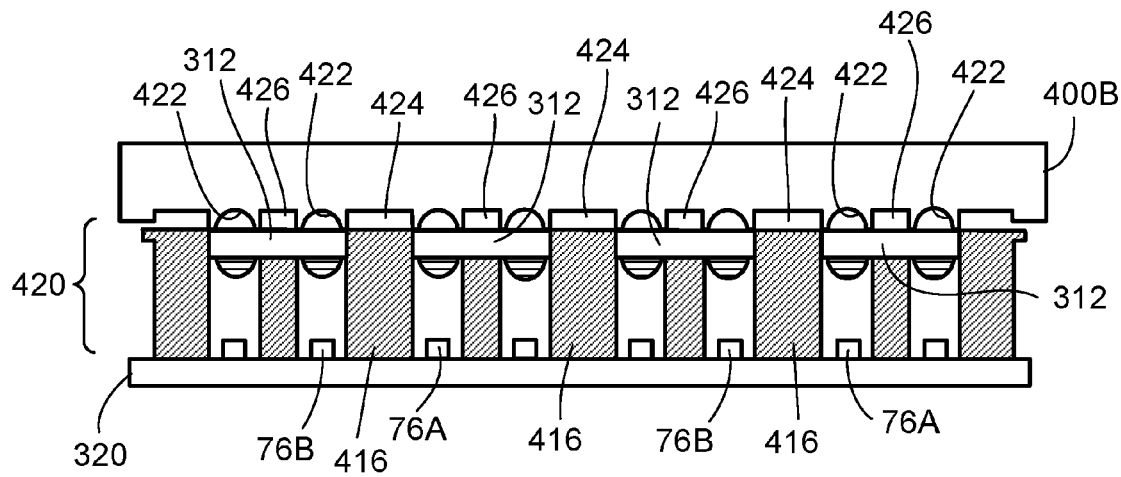
Figure 17E:
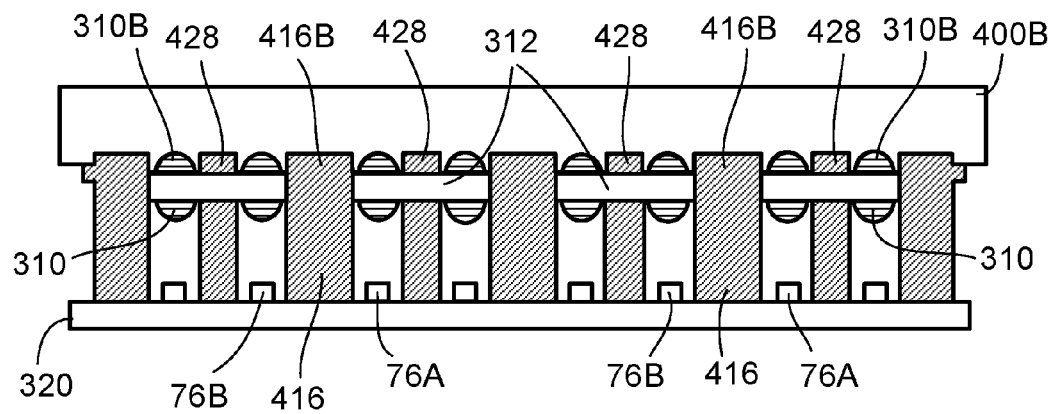
Figure 17F:
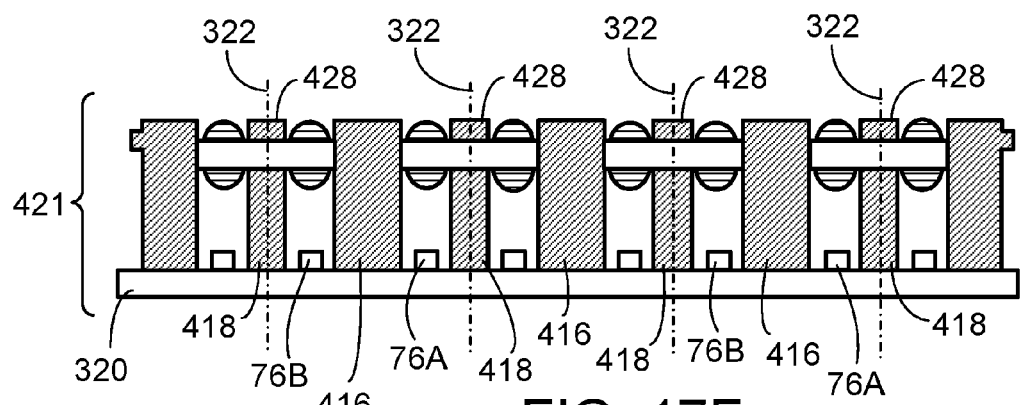

The structure 420 then is mounted on a substrate wafer 320 (e.g., a PCB wafer) on which are mounted optoelectronic devices (i.e., light emitting devices 76A and light detecting devices 76B), as shown in FIG. 17D. A second combined replication and vacuum injection tool 400B can be used to form lenses on the second side of the transmissive substrates 312, baffle features and upper portion of the wall features 416. A curable epoxy material is dispensed on replication features 422 of the tool 400B, which then is brought into contact with the exposed surfaces of the transmissive substrates 312 to form replicated lens elements 310B as shown in FIG. 17E. The epoxy material can be hardened, for example, by thermal or UV curing. Also, spaces 424 between the tool 400B and the previously-formed sections 416 of the wall features, as well as spaces 426 between the tool 400B and the transmissive substrates 312, are filled with a non-transparent material such as a flowable polymer material (e.g., epoxy, acrylate, polyurethane, or silicone) containing a non-transparent filler (e.g., carbon black, a pigment, an inorganic filler, or a dye). See FIG. 15. The non-transparent material subsequently can be hardened (e.g., by UV or thermal curing) to form the upper sections 416B of wall features 416 and to form baffle features 428. The second tool 400B then can be removed. The resulting structure 421, which is illustrated in FIG. 17F, is similar to the structure 321 of FIG. 15F obtained from the process of FIGS. 15A-15F. The structure 412 of FIG. 17F also can be separated (e.g., by dicing) along lines 322 into multiple modules, each of which includes a light emitting device 76A and a light detecting device 76B in respective optical channels.

As noted above, if dicing is performed as shown in FIG. 15F or 14F, the exterior sidewalls 326 of the transparent covers 312 of the resulting modules will not be covered with a transparent material (see, e.g., FIG. 16), which could allow light leakage from the module and/or stray light into the module to occur in some cases. A technique for providing non-transparent material to cover the sidewalls of the transparent covers is now described.

Figure 18A:
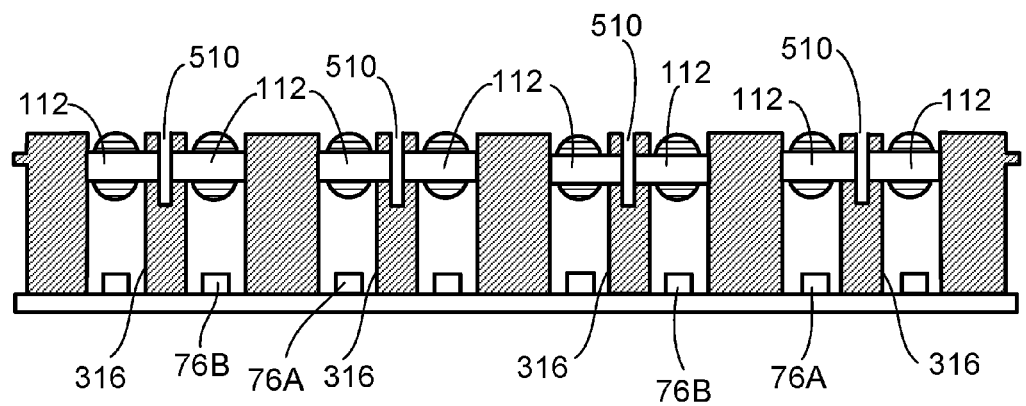
FIGS. 18A-18B illustrate additional steps for fabricating optoelectronic modules according to some implementations.
Figure 18B:
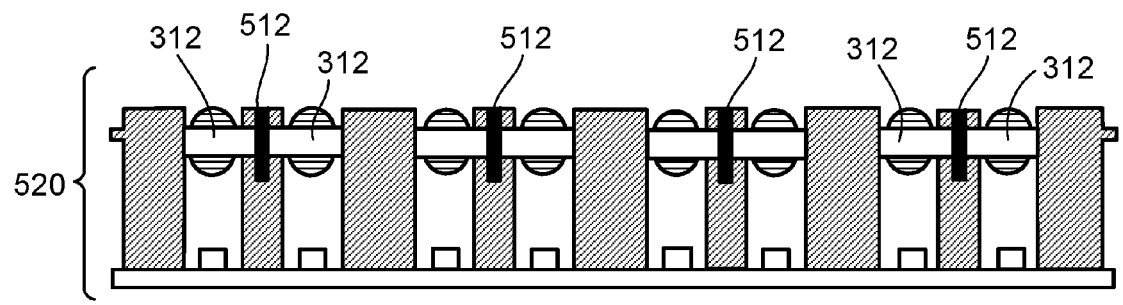

One way in which the sidewalls 326 of the transmissive covers 312 can be covered with non-transparent material is illustrated by FIGS. 15A-15B. Starting, for example, with the structure 321 of FIG. 15F (or the structure 421 of FIG. 17F), openings (e.g., trenches) 510 are formed from the top each baffle feature (e.g., 318) through the underlying transmissive substrates 312, as shown in FIG. 18A. The trenches 510 should extend entirely through the thickness of the transmissive substrates 312 and, preferably, should extend partially into spacer features (e.g., 316) below. The trenches 510 can be formed, for example, by dicing, micromachining or laser cutting techniques. The trenches 510 subsequently can be filled with a non-transparent material 512 using, for example, a vacuum injection technique so as to provide a non-transparent layer on the side edges of the various portions of the transmissive substrates 312. See FIG. 18B. The vacuum injection technique can involve placing a PDMS tool on the top of the structure shown in FIG. 18A. The non-transparent material 510 covering the side edges of the transmissive substrates 312 can be, for example, a curable polymer material (e.g., epoxy, acrylate, polyurethane, or silicone) containing a non-transparent filler (e.g., carbon black, pigment, or dye). The structure 520 of FIG. 18B then can be separated (e.g., by dicing) into multiple individual modules.

Figure 19:
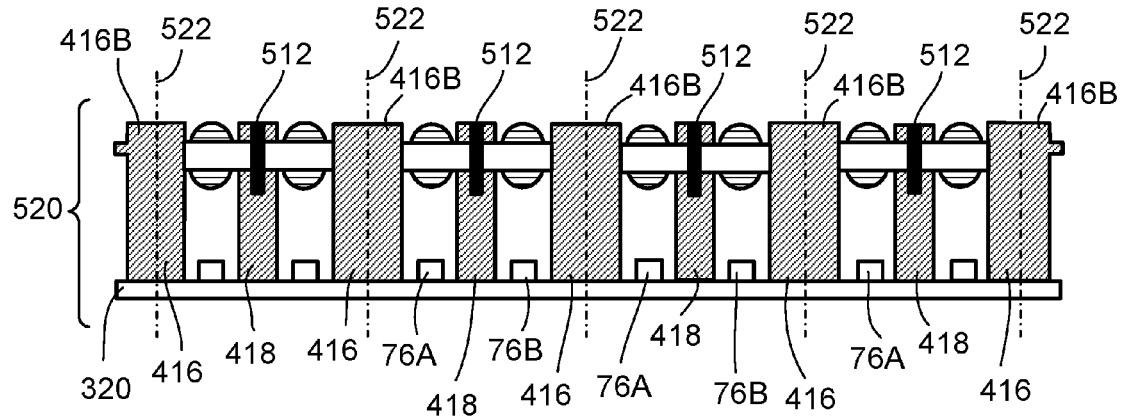
FIG. 19 illustrates a first example of separating the structure of FIG. 18B.
Figure 20:
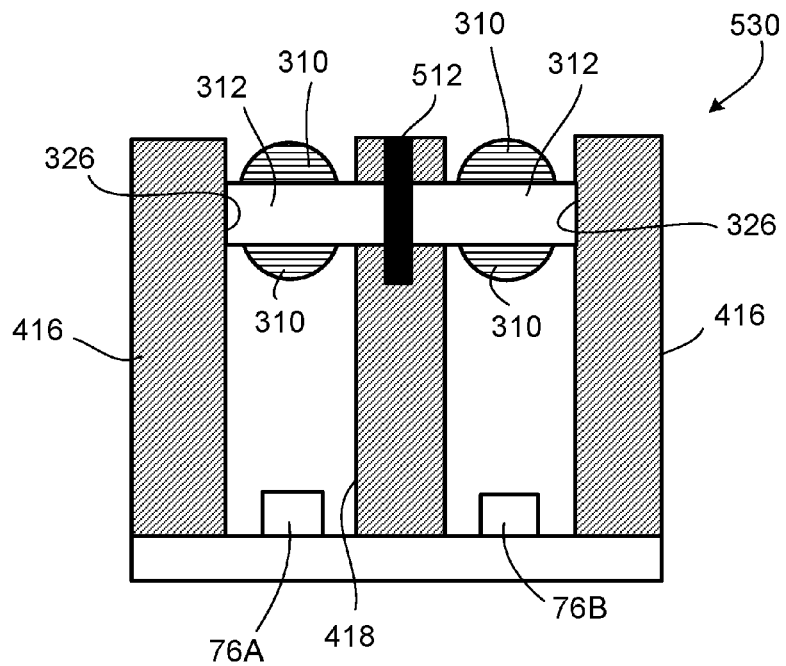
FIG. 20 is an example of a module obtained by the separating of FIG. 19.

For example, as illustrated in FIG. 19, the structure 520 can be separated by dicing along lines 522 through the wall features 416, 416B to form modules like the module 530 of FIG. 20. The module 530 includes a light emitting device 76A and a light detecting device 76B separated from one another by a spacer 418 that serves as a non-transparent interior wall. Non-transparent material 512 also separates the transmissive substrates 312 form one another to help prevent stray light from entering the optical detection channel. The exterior walls 416 of the module also are composed of non-transparent material and cover the exterior sidewalls 326 of the transmissive covers 312, which can help prevent light leakage from the sides of the transmissive covers. The structure 321 of FIG. 15F can be processed in a similar manner to obtain multiple modules similar to the module of FIG. 20.

Figure 21:
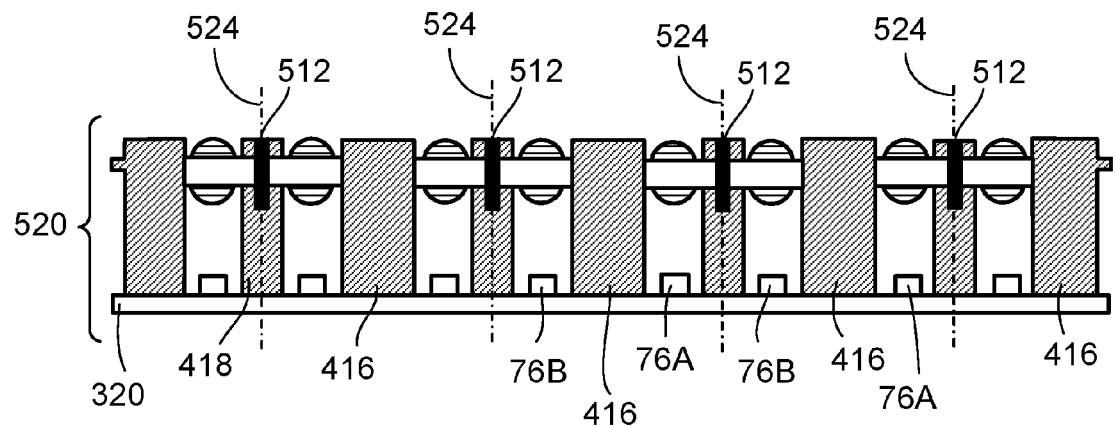
FIG. 21 illustrates a first example of separating the structure of FIG. 18B.
Figure 22:
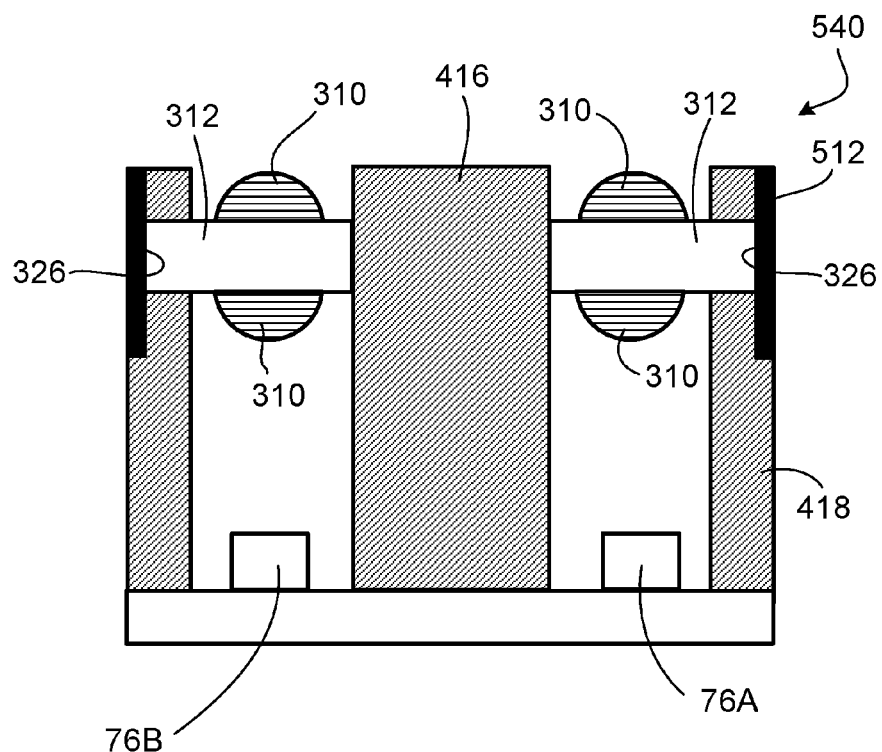
FIG. 22 is an example of a module obtained by the separating of FIG. 21.

In some implementations, instead of separating the structure 520 along dicing lines 522 as in FIG. 19, the structure 520 can be separated along dicing lines 524 passing through the non-transparent material 512 and the spacers 418 (see FIG. 21) to form modules light modules like the module 540 of FIG. 22. The module 540 also includes a light emitting device 76A and a light detecting device 76B separated from one another by an interior wall 416 that can help prevent stray light from entering the optical detection channel. The outer walls of the module are composed of non-transparent spacers 418 and non-transparent material 512 that covers the exterior sidewalls 326 of the transmissive covers 312. The non-transparent material 512 can help prevent light leakage from the sides of the transmissive covers 312. The structure 321 of FIG. 15F can be processed in a similar manner to obtain multiple modules similar to the module of FIG. 22.

Figure 6C:
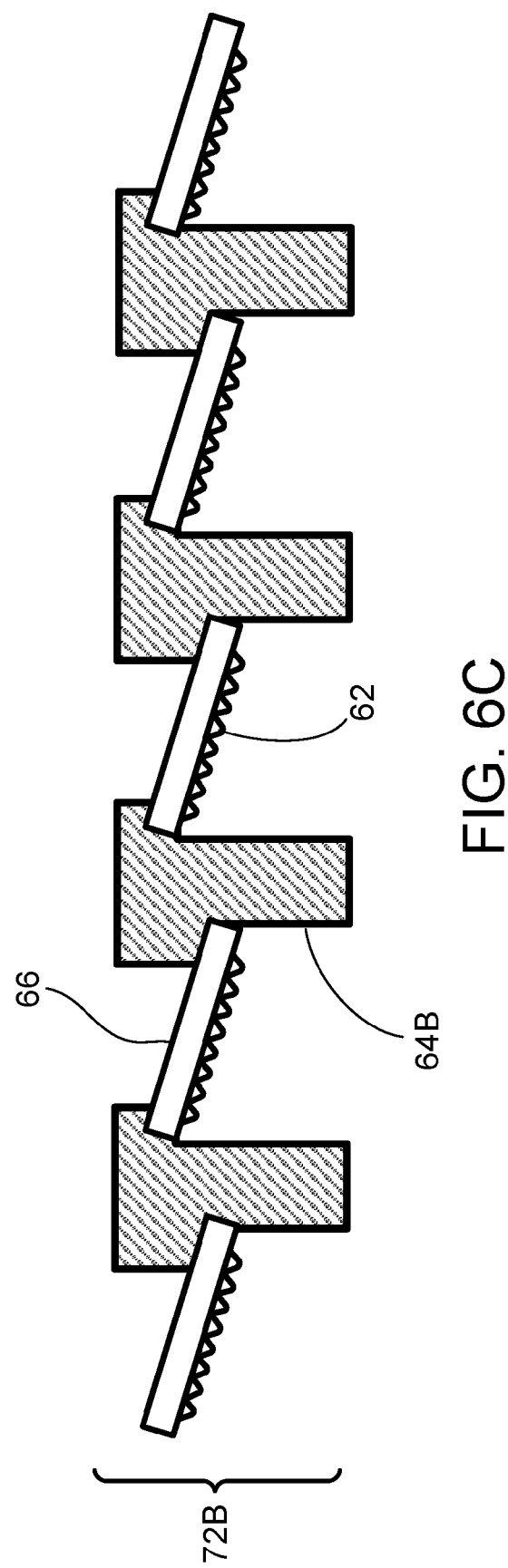
Figure 10A:
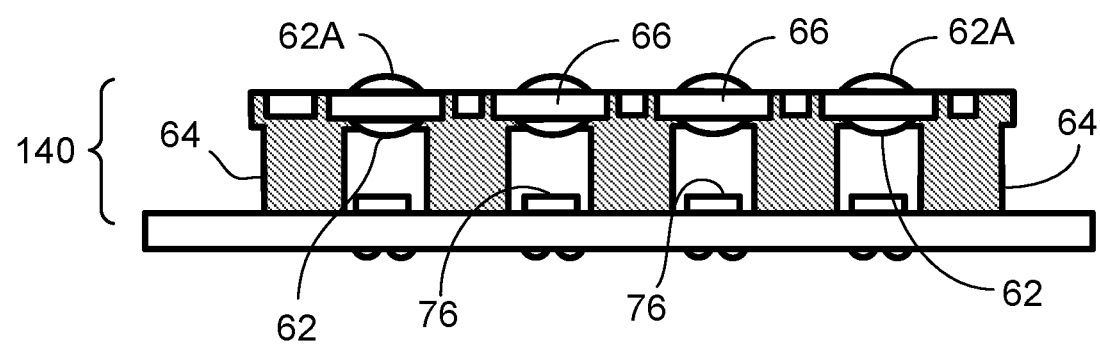
FIGS. 10A-10B illustrate steps in a further method of fabricating optoelectronic modules using singulated transparent substrates.
Figure 10B:
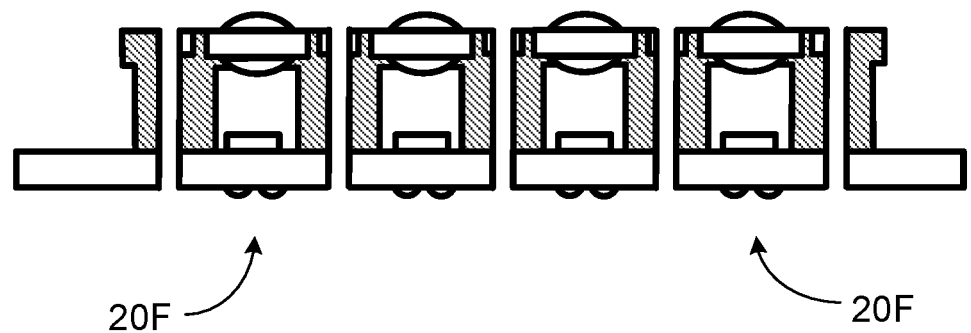

Although many of the foregoing examples include lenses as the optical elements, some implementations may include other types of optical elements (e.g., optical filters and/or FFL correction layers) in addition to, or in place of, the lenses. In some cases, such optical elements may be provided on a transparent substrate (e.g., wafer) prior to singulation. For example, in some cases, an optical filter layer or a focal length correction layer can be applied to a transparent cover substrate (e.g., wafer), which then is diced into singulated covers each of which has at least one of an optical filter or focal length correction layer on its surface. The focal length correction layer may be, for example, a focal flange length (FFL) correction layer. The FFL sometimes is referred to as a flange focal distance. The singulated covers, each of which includes an optical filter layer or a focal length correction layer on its surface, then can be integrated into any of the fabrication techniques described above (e.g., FIGS. 3A-3E; FIGS. 4A-4C; FIGS. 5A-5E; FIGS. 6A-6C; FIGS. 7A-7E; FIGS. 8A-8D; FIGS. 9A-9D; FIGS. 10A-10B; etc.).

Including a FFL correction layer can be particularly advantageous, for example, for image sensor applications. Thus, in some instances, the transparent cover may include a replicated lens on one side only or, in some cases, may not include a replicated lens on either side. An example is illustrated in FIGS. 23A and 23B, which show multi-channel modules 500A and 500B, respectively.

Figure 23A:
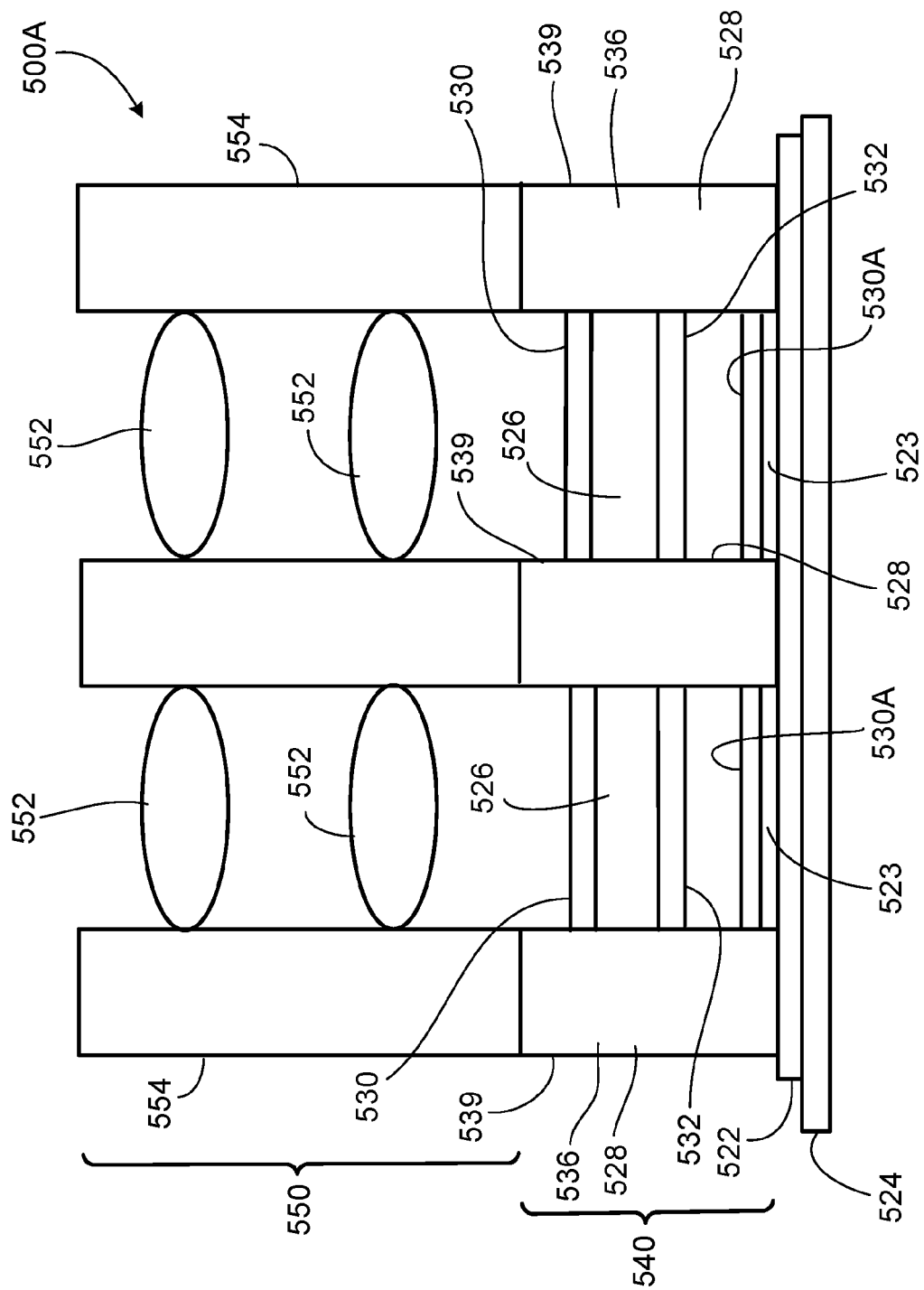

Modules 500A and 500B of FIGS. 23A and 12B include an image sensor 522 supported on a PCB or other substrate 524. Image sensor 522 has optically sensitive regions 523 that are surrounded laterally by a spacer 528, which also serves as sidewalls for the sensor-side of the module. Side edges of the transparent covers 526 are laterally surrounded and covered by the non-transparent material (e.g., an epoxy with carbon black). In some cases, the non-transparent material surrounding the transparent covers 526 is the same material as the spacers 228. Transparent covers 526 can be composed, for example, of glass, sapphire or a polymer material, and are separated from image sensor 522 by spacer 528. In the illustrated examples of FIGS. 23A and 23B, the object-side of each transparent cover 526 includes an optical filter 530, which can be implemented, for example, as a thin coating. Likewise, the sensor-side of each transparent cover may include a FFL correction layer 532 to correct for the channel focal length. The thickness of the FFL correction layer 532 in each channel may vary from the thickness of the FFL layer 532 in another channel. In some cases, only some of the channels have a FFL correction layer.

Non-transparent material 539 may extend beyond the top of transparent covers 526 near their edges. Depending on the implementation, non-transparent material 536 that covers the sidewalls of the transparent covers 526 can be the same as, or different from, the material of the spacer 528 and/or the non-transparent material 539 that extends beyond the top of the transparent covers 526. The exterior side of PCB substrate 524 can includes conductive contacts, which can be coupled electrically to image sensor 522 by way of conductive vias extending through substrate 524.

The modules 500A, 500B can include one or more optics assemblies 550. The optics assemblies can be attached to an assembly 540 that is composed of the transparent covers 526 (including a lens element, an FFL correction layer 532 or a filter layer 530, if present) and non-transparent walls/spacers 528, 536, 539. Each optics assembly 550 can include, for example, a stack of one or more injection molded optical elements (e.g., lenses) 552 placed in a lens barrel 554. In some cases, an array of injection molded lens stacks can be provided collectively for more than one optical channel (see FIG. 23A), whereas in other implementations, a separate lens stack is provided for each respective channel (see FIG. 23B).

Multiple assemblies 540 including transparent covers 526 (together with the FFL correction layer 532 and/or the filter layer 530) and non-transparent walls/spacers 528, 536, 539 can be fabricated as part of a wafer-level process. In some implementations, a channel FFL correction layer is provided on one side of a transparent wafer. The FFL correction layer may be composed, for example, of a glass or polymer material, and can be applied, for example, by spin coating, spraying or sputtering. An optical filter layer may be applied to the other side of the transparent wafer. The spacers and walls for the modules can be formed using the techniques described in detail above (e.g., replication or vacuum injection, as well as trench formation and filling of the trenches with non-transparent material in some cases). Transient substrates (e.g., UV dicing tape, a PDMS substrate, a glass substrate, a polymer wafer) can be used to support the structure during the foregoing steps. In some cases, a lens may be replicated on the surface of the optical filter layer. Further, if an optical filter layer is not provided on the transparent wafer, then in some cases, a lens may be replicated directly on the surface of the transparent wafer.

Next, optics assemblies (i.e., lens stacks) can be attached to the object-side of the spacer/optics/embedded transparent cover assemblies. This can be accomplished either on a wafer-level scale or by attaching individual lens stacks to the spacer/optics/embedded transparent cover assemblies. Next, the focal length (e.g., FFL) of each optical channel can be measured and compared to a specified value. If the measured FFL for particular channel deviates from a desired value, the FFL correction layer can be removed selectively in that channel to correct for the FFL value. Photolithographic techniques can be used, for example, to partially or entirely remove the FFL correction layer, as needed. Since the channels may have different FFL values, different amounts of the channel FFL correction layer may be needed to achieve corrected FFL values for the various channels. For some channels, no FFL correction may be needed. In other cases, a portion of the channel FFL correction layer may be removed. In yet other cases, no portion of the channel FFL correction layer may be removed. Thus, depending on the implementation, the channel FFL correction layer may be present for all of the channels or for only some of the channels. Furthermore, the thickness of the final channel FFL correction layer may vary from one channel to the next, depending on the amount of FFL correction needed in each channel.

The wafer-level structure (including the spacers, transparent covers whose side edges are surrounded and covered by non-transparent material, and optics assemblies) then can be separated into individual assemblies, each of which includes, for example, an array of optical channels. Each of the separated assemblies then can be attached to an individual image sensor assembly (i.e., a PCB substrate on which is mounted an imager sensor).

In some implementations, it may be desirable to provide an optical filter 530A directly on the active photosensitive regions 523 of the image sensor 522. Such filters can be provided, for example, instead of the filters 530 on the transparent cover 526. This arrangement may be useful, for example, where a lens is replicated on the surface of each transparent cover 526.

Figure 23C:
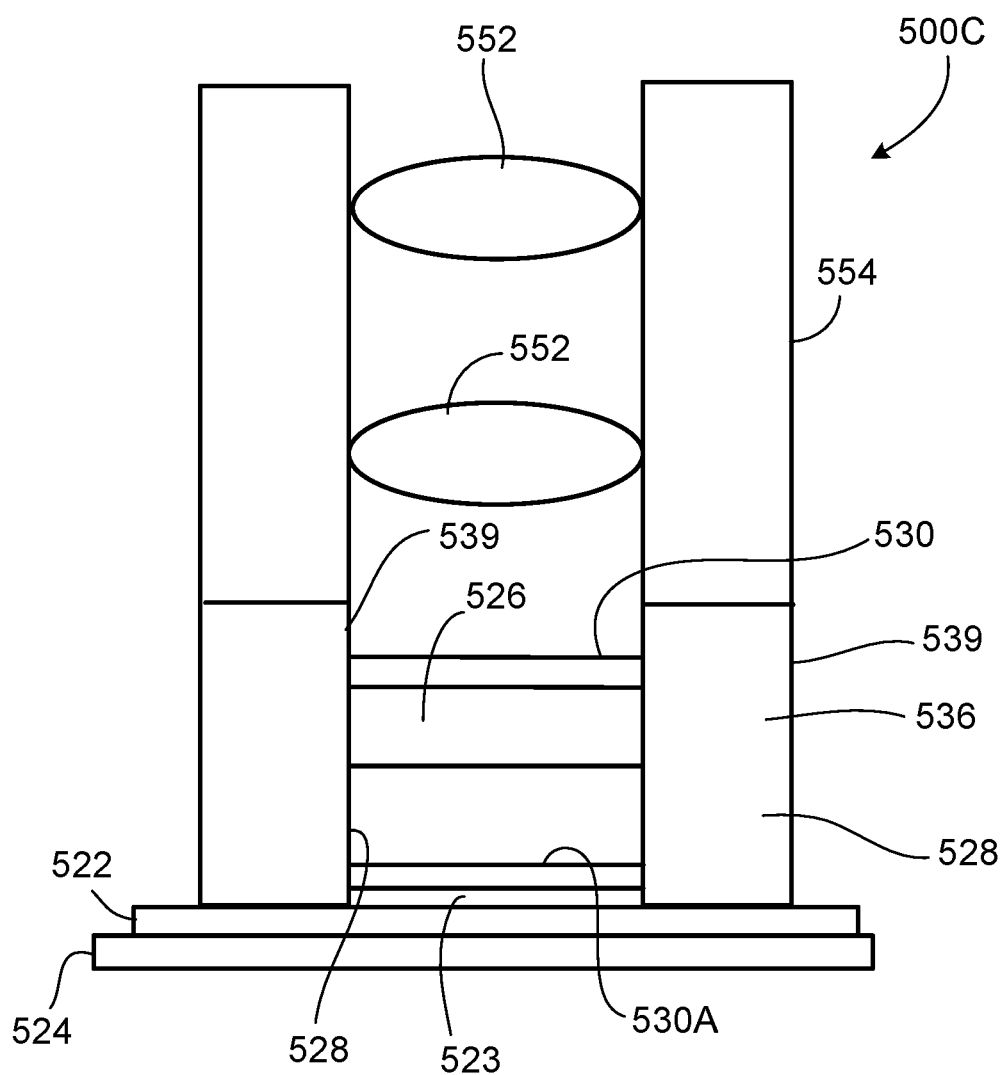

Each of the modules of FIGS. 23A and 23B includes multiple optical channels. Single modules that include similar features can be provided as well. As example of such a module 500C is illustrated in FIG. 23C. The sidewalls of the transparent cover 526 as well as the sidewalls of the optical filter 530 are covered by the non-transparent material of the spacer 228. The module 500C also includes an optics assembly implemented as a stack of one or more injection molded optical elements (e.g., lenses) 552 placed in a lens barrel 554. In the illustrated example, the module 500C does not include an FFL correction layer 532.

The optical filters discussed above can be implemented in various ways. For example, in some implementations, a dielectric band-pass filter can be applied to the photo sensitive surface of the light sensing element (e.g., an image sensor) or to a surface of the transparent cover that is disposed over the light sensing element. In some cases, such a band-pass filter is deposited onto the transparent cover (or onto a transparent wafer in the case of a wafer-level process) by vapor deposition or sputtering. Preferably the dielectric filter is deposited onto a transparent cover composed, for example, of glass, sapphire or another transparent material that has mechanical/thermal-expansion properties similar those of glass or sapphire. The band-pass filter can be advantageous because it permits a very narrow range of wavelengths to impinge on the light sensing element (e.g., a photodiode or image sensor). A dielectric band-pass filter can, in some cases, permit highly selective filtering. For example, a dielectric band-pass filter can be used to filter out ambient IR radiation while permitting the transmission of a specific desired wavelength of IR (e.g., light being generated from a projected light source).

In the foregoing fabrication examples, a spacer/optics structure (e.g., 72 in FIG. 3C) is attached directly by adhesive to a PCB or other substrate wafer on which are mounted multiple optoelectronic devices (e.g., light emitting elements or light detecting elements) (see, e.g., FIG. 3D). In particular, the free ends of the spacer elements of the spacer/optics structure is attached directly by adhesive to the PCB or other substrate wafer. In the resulting modules, the spacer 28 that separates the PCB or other substrate 24 from the transparent cover 26 is composed of a non-transparent material, such as a vacuum injected polymer material (e.g., epoxy, acrylate, polyurethane, or silicone) containing a non-transparent filler (e.g., carbon black, pigment, or dye). See, e.g., FIGS. 2A-2H. In some implementations, however, instead of attaching the spacer/optics structure directly to the PCB or other substrate wafer, the spacer/optics structure is attached to a structural element forming part of the substrate wafer. An example is illustrated in FIGS. 24A and 24B, which are discussed below.

Figure 24A:
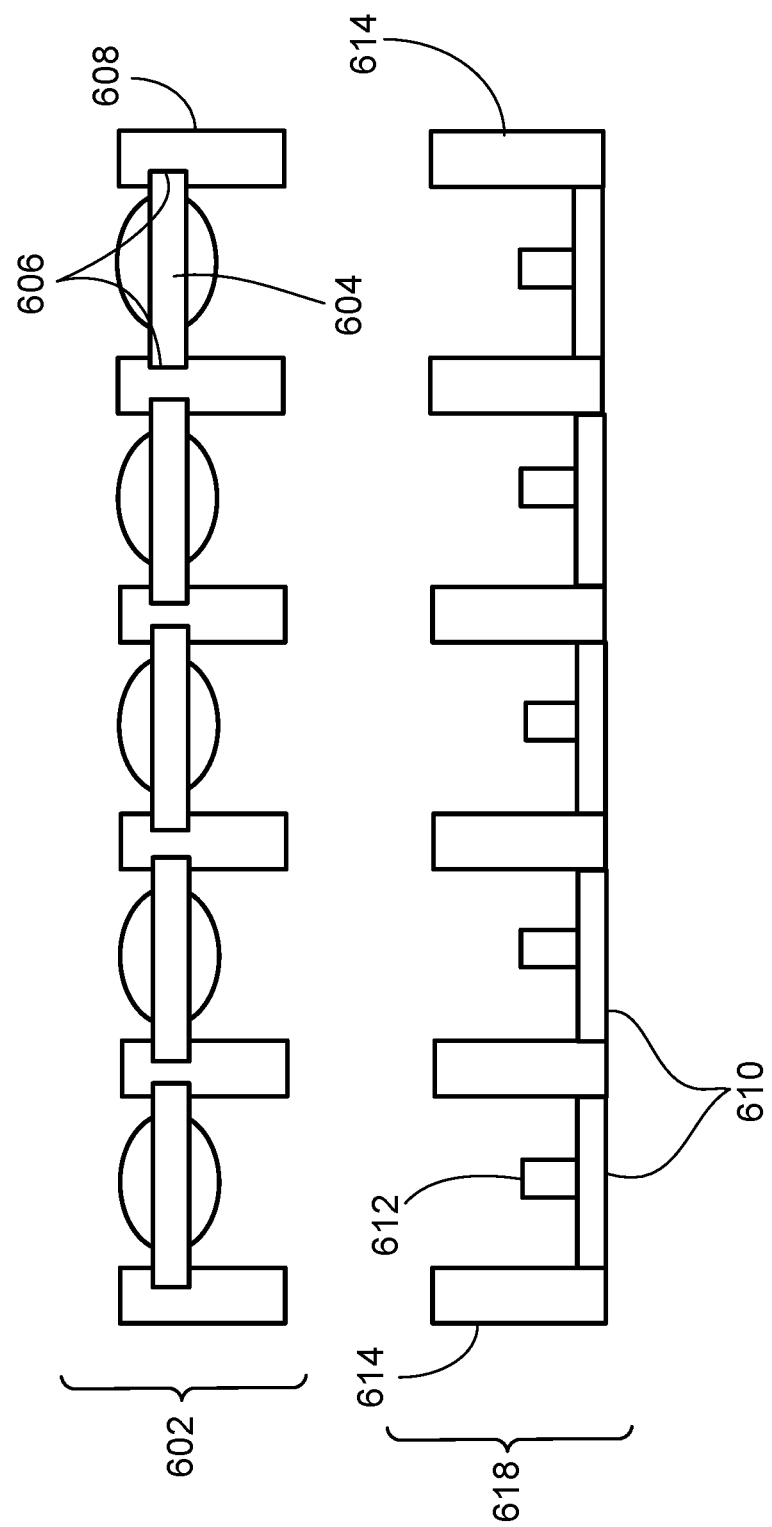
FIGS. 24A and 24B illustrate steps in a method of fabricating optoelectronic modules.
Figure 24B:
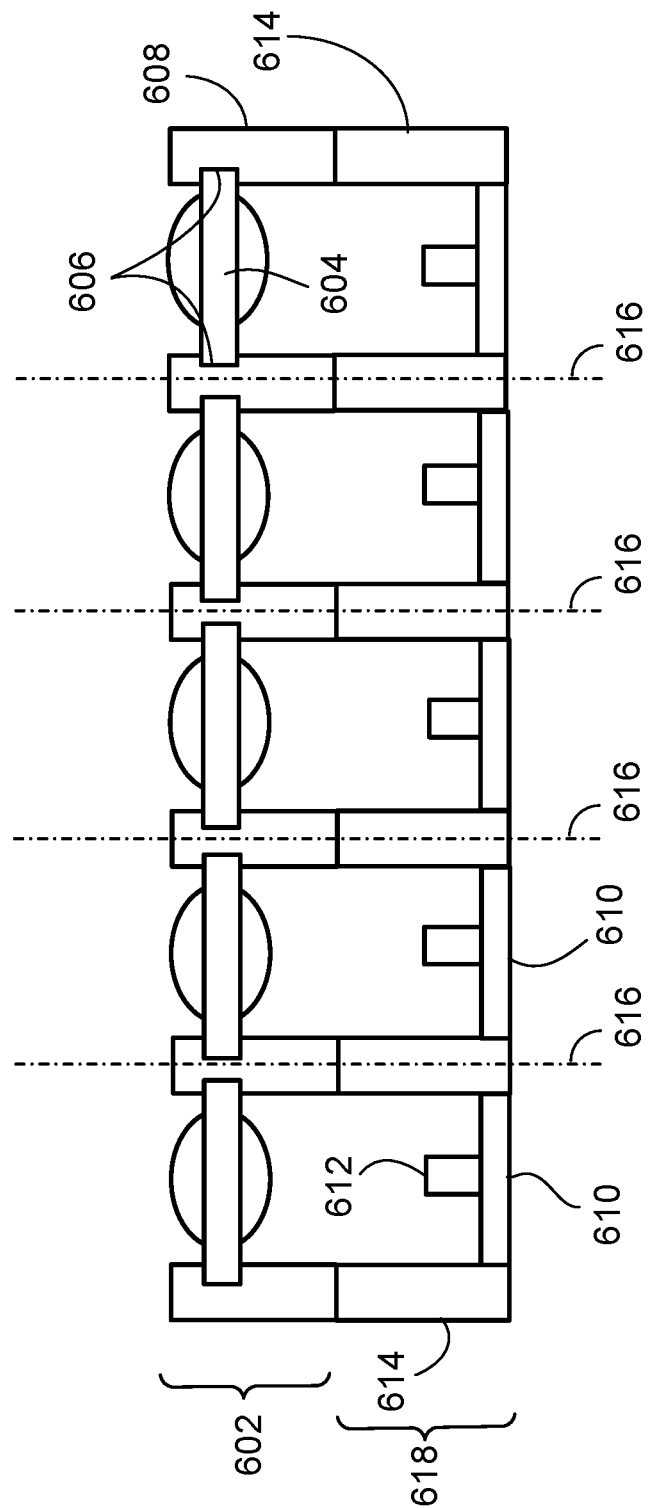
Figure 25A:
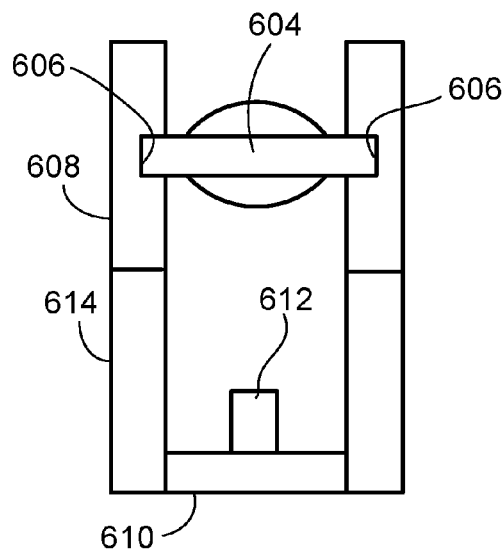
FIGS. 25A-25G are further examples of modules.
Figure 25B:
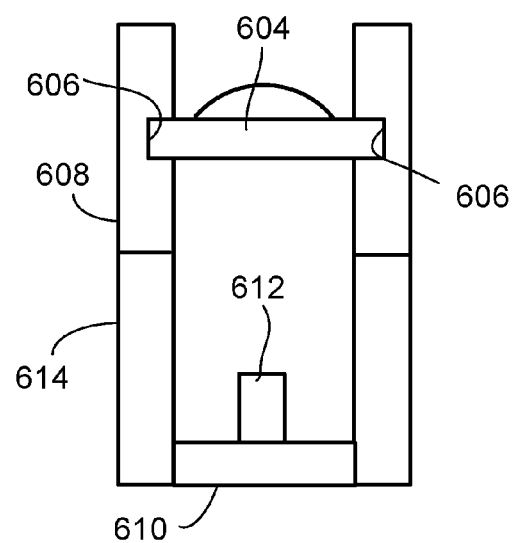
Figure 25C:
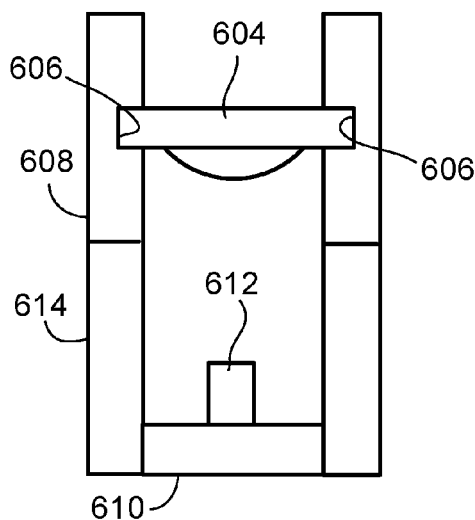
Figure 25D:
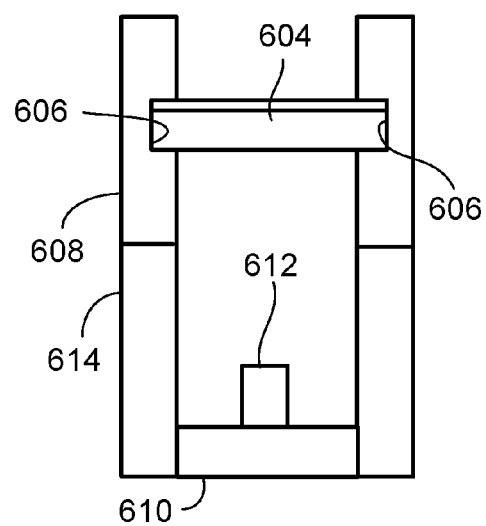
Figure 25E:
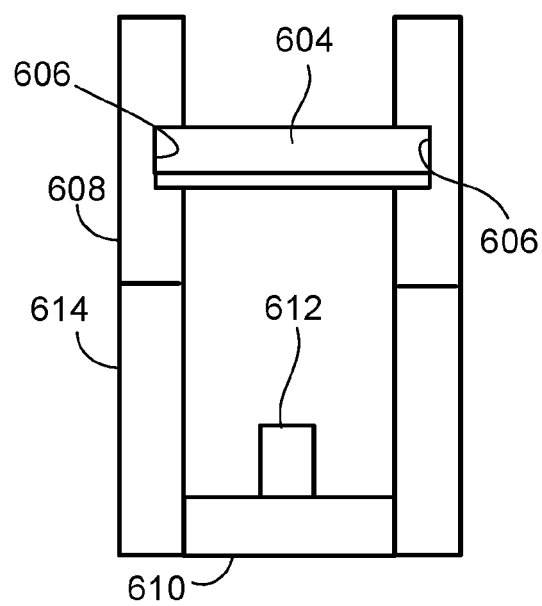
Figure 25F:
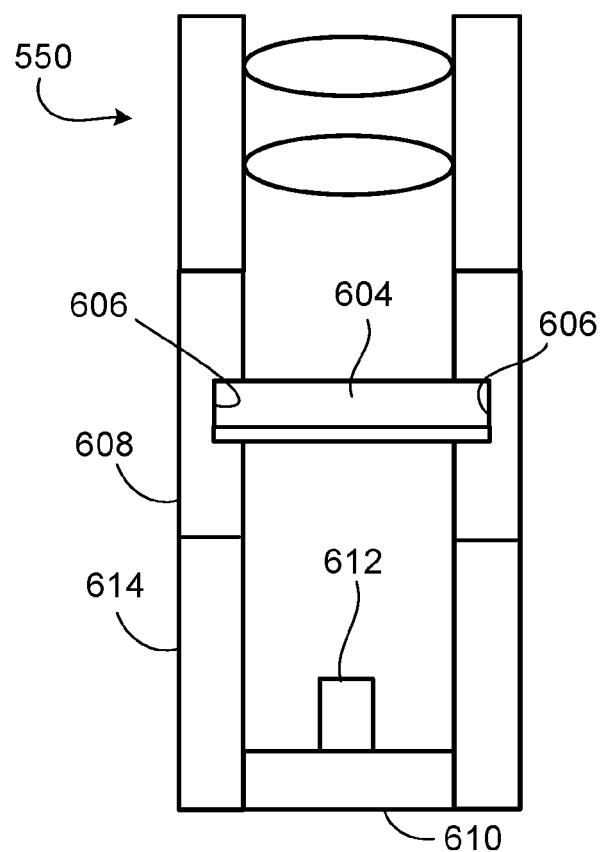

As shown in FIG. 24A, a spacer/optics structure 602 includes transparent covers 604 whose sidewalls 606 are covered by the same vacuum-injected non-transparent material that forms the spacer 608. A substrate wafer 618 comprises a metal frame 610 having openings and a molded cavity 614. The molded cavity 614 fits within the openings of the metal frame 610 so that sidewalls of the metal frame 610 are encapsulated laterally by the molded cavity 614. The substrate wafer 618 (i.e., the combination of the metal frame 610 and molded cavity 614) also may be referred to as a "lead frame." The metal frame 610, which may be composed for example of a metal such as copper, aluminum or nickel, has optoelectronic devices 612 mounted on its surface and spaced laterally form one another. Further, the molded cavity 614 should have dimensions that match those of the spacer 608 such that the free ends of the spacer elements 608 and molded cavity 614 can be attached directly to one another by adhesive, as shown in FIG. 24B. This can be particularly advantageous, for example, where the optoelectronic devices 612 are high-power light emitters (e.g., a high power LED or VCSEL) because the material of the molded cavity 614 can be made relatively inexpensively and also can be highly reflective and resistant to high temperatures. The stack formed by the spacer/optics structure 602 and the substrate wafer 618 can be separated along dicing lines 616 to form multiple modules, such as the module in FIG. 25A.

Figure 25G:
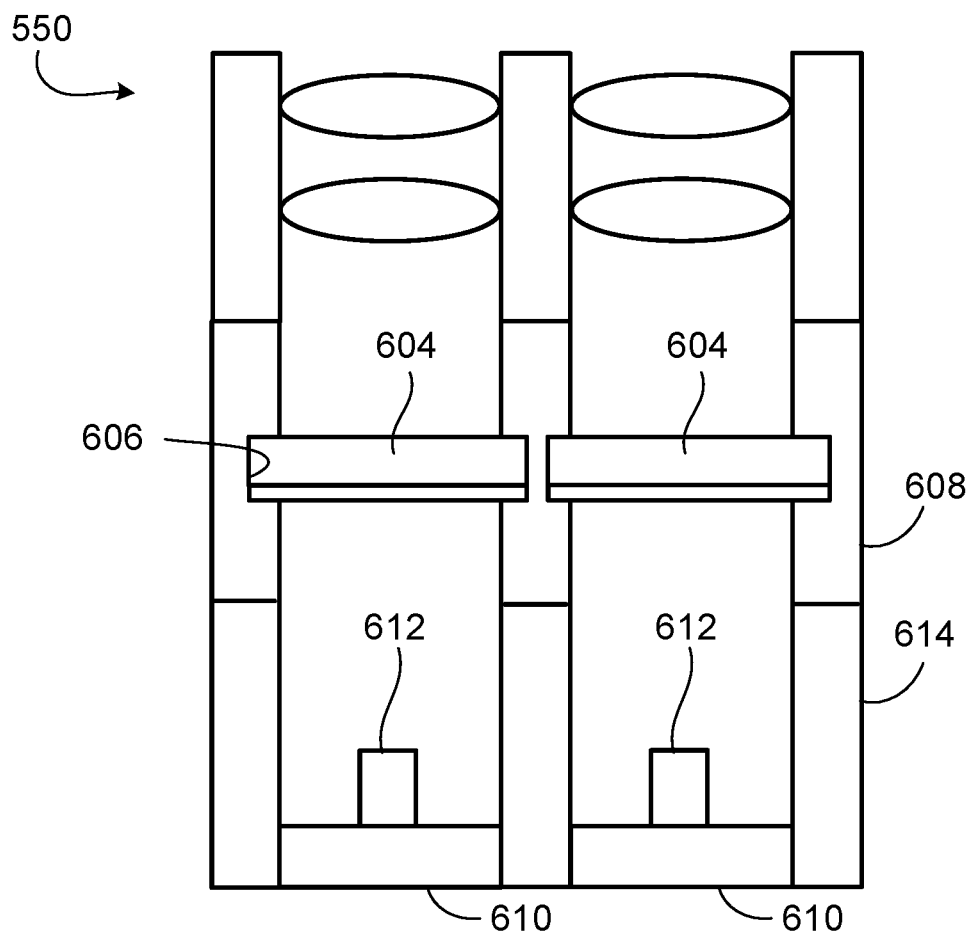

In some implementations, the substrate wafer structure 618 can be attached to any of the other types of spacer/optics structures discussed above to form other types of modules in which the non-transparent spacer material covers the sidewalls of the transparent cover. Some examples are illustrated in FIGS. 25B-25F. Thus, in some cases the transparent cover 604 may include an optical element on one or both of its surfaces. The optical element can be a lens (see FIGS. 25A, 25B and 25C), an optical filter (see FIGS. 25D and 25E) or a FFL correction layer. In some cases, an optics assembly 550 including a stack of lenses can be attached over the transparent cover 604 (see FIGS. 25F and 25G).

In the modules of FIGS. 25A-25G, one end of the spacer 608 is attached (e.g., by adhesive) to an end of the molded cavity 614. Thus, the molded cavity 614 is attached to the spacer 608, which may be composed, for example, of a vacuum injected polymer material such as epoxy, acrylate, polyurethane, or silicone containing a non-transparent filler such as carbon black, a pigment, or a dye. The sidewalls 606 of the transparent cover 604 in each module can be encapsulated laterally by the same or similar material as the spacer 608; likewise, the sidewalls of the metal substrate 610 in each module can be encapsulated laterally by the molded cavity 614.

As used in this disclosure, the terms "transparent," "non-transparent" and "transmissive" are made with reference to the particular wavelength(s) emitted by or detectable by the devices (e.g., 22A, 22B, 76A, 76B) in the module. Thus, a particular feature, for example, may be considered "non-transparent" even though it may allow light of other wavelengths to pass through.

Various modifications can be made within the spirit of the invention. Accordingly, other implementations are within the scope of the claims.

What is claimed is:

1. A method of fabricating optoelectronic modules each of which includes at least one optoelectronic device and at least one optical element, the method comprising:
   providing a respective singulated transparent substrate within each of a plurality openings of a non-transparent wafer disposed on a support surface; and
   forming a spacer-optics structure, wherein forming the spacer-optics structure includes:
      replicating a respective optical element onto each of the transparent substrates; and
      forming vacuum injected spacer elements that project away from the support surface, wherein the spacer elements are composed of a non-transparent material that also fills gaps between the transparent substrates and the wafer.

2. The method of claim 1 further including:
   attaching the spacer-optics structure to a further substrate on which are mounted a plurality of optoelectronic devices operable to emit or detect light at a wavelength, wherein the transparent substrates are substantially transparent to the wavelength, and the spacer elements are substantially non-transparent to the wavelength, the spacer-optics structure and the further substrate forming, in combination, a stack.

3. The method of claim 2 further including:
separating the stack into a plurality of modules each of which includes at least one of the optoelectronic devices and at least one of the optical elements.

4. The method of claim 3 wherein separating the stack into a plurality of modules includes dicing along lines, each of which passes through a respective one of the spacer elements and a respective part of the non-transparent wafer.

5. The method of claim 1 including using a combined replication and vacuum injection tool to replicate the optical elements onto the transparent substrates and to form the spacer elements.

6. The method of claim 5 including removing the spacer-optics structure from the combined replication and vacuum injection tool before attaching the spacer-optics structure to a substrate on which optoelectronic devices are mounted.

7. The method of claim 1 wherein the non-transparent material in the gaps covers sidewalls of the transparent substrates.

8. The method of claim 7 wherein the non-transparent material in each respective one of the gaps is contiguous with a respective one of the spacer elements.

9. The method of claim 1 including attaching the spacer-optics structure to a printed circuit board substrate on which optoelectronic devices are mounted.

10. A method of fabricating optoelectronic modules each of which includes at least one optoelectronic device and at least one optical element, the method comprising:
providing a respective singulated transparent substrate within each of a plurality openings of a non-transparent wafer disposed on a support surface;
forming vacuum injected spacer elements that project away from the support surface, wherein the spacer elements are composed of a non-transparent material that also fills gaps between the transparent substrates and the wafer, the spacer elements forming a spacer structure; and
replicating a respective optical element onto each of the transparent substrates such that the optical elements project away from the transparent substrates in a direction opposite that of the spacer elements.

11. The method of claim 10 further including:
attaching the spacer structure to a further substrate on which are mounted a plurality of optoelectronic devices operable to emit or detect light at a wavelength, wherein the transparent substrates are substantially transparent to the wavelength, and the spacer elements are substantially non-transparent to the wavelength, the spacer structure and the further substrate forming, in combination, a stack.

12. The method of claim 11 wherein attaching the spacer structure to a substrate on which are mounted a plurality of optoelectronic devices includes attaching the spacer structure to a printed circuit board substrate.

13. The method of claim 11 further including:
separating the stack into a plurality of modules each of which includes at least one of the optoelectronic devices and at least one of the optical elements.

14. The method of claim 13 wherein attaching the spacer structure to a further substrate is performed before replicating a respective optical element onto each of the transparent substrates, and wherein separating the stack into a plurality of modules is performed after replicating a respective optical element onto each of the transparent substrates.

15. The method of claim 10 further including forming at least one of (i) vacuum injected baffle features or (ii) vacuum injected alignment features, the vacuum injected features being formed at an object side of the non-transparent wafer, the object side being on an opposite side of the non-transparent wafer from a sensor side at which the spacer elements are formed.

16. The method of claim 15 including a combined replication and vacuum injection tool to replicate the optical elements onto the transparent substrates and to form the vacuum injected baffle or alignment features.

17. The method of claim 10 including forming the vacuum injected spacer elements using a first tool and replicating the optical elements onto the transparent substrates using a second different tool.

18. The method of claim 10 wherein the non-transparent material in the gaps covers sidewalls of the transparent substrates.

19. A method of fabricating optoelectronic modules each of which includes at least one optoelectronic device and at least one optical element, the method comprising:
providing a respective singulated transparent substrate within each of a plurality openings of a non-transparent wafer disposed on a support surface, the support surface having cavities defining regions for at least one of (i) vacuum injected baffle features or (ii) vacuum injected alignment features;
performing vacuum injection to form spacer elements at a first side of the non-transparent wafer opposite a second side of the non-transparent wafer at which the support surface is located, wherein the spacer elements are composed of a non-transparent material that also fills gaps between the transparent substrates and the wafer, the non-transparent material also being provided in the cavities in the support surface to form at least one of (i) the vacuum injected baffle features or (ii) the vacuum injected alignment features; and
replicating a respective optical element onto each of the transparent substrates, wherein the spacer elements and optical elements, in combination, form a spacer-optics structure.

20. The method of claim 19 further including:
attaching the spacer-optics structure to a further substrate on which are mounted a plurality of optoelectronic devices operable to emit or detect light at a wavelength, wherein the transparent substrates are substantially transparent to the wavelength, and the spacer elements are substantially non-transparent to the wavelength, the spacer-optics structure and the substrate forming, in combination, a stack.

21. The method of claim 20 wherein attaching the spacer-optics structure to a substrate on which are mounted a plurality of optoelectronic devices includes attaching the spacer structure to a printed circuit board substrate.

22. The method of claim 20 further including:
separating the stack into a plurality of modules each of which includes at least one of the optoelectronic devices and at least one of the optical elements.

23. The method of claim 19 wherein the same vacuum injection forms the spacer elements as well as the baffle or alignment features.

24. The method of claim 19 including using a combined replication and vacuum injection tool to replicate the optical elements onto the transparent substrates and to form the spacer elements as well as the baffle or alignment features.

25. The method of claim 19 wherein the support surface includes vacuum sealing chuck.

26. The method of claim 19 wherein the non-transparent material in the gaps covers sidewalls of the transparent substrates.

* * * * *